(12) United States Patent
Matsuzaki et al.

(10) Patent No.: US 8,467,231 B2
(45) Date of Patent: Jun. 18, 2013

(54) SEMICONDUCTOR DEVICE AND DRIVING METHOD THEREOF

(75) Inventors: Takanori Matsuzaki, Atsugi (JP); Shuhei Nagatsuka, Atsugi (JP); Hiroki Inoue, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 142 days.

(21) Appl. No.: 13/193,756

(22) Filed: Jul. 29, 2011

(65) Prior Publication Data

US 2012/0033484 A1    Feb. 9, 2012

(30) Foreign Application Priority Data

Aug. 6, 2010    (JP) .................................. 2010-178140
May 12, 2011    (JP) .................................. 2011-107622

(51) Int. Cl.
*G11C 11/24*    (2006.01)

(52) U.S. Cl.
USPC .......................................... 365/149; 365/174

(58) Field of Classification Search
None
See application file for complete search history.

(56) References Cited

U.S. PATENT DOCUMENTS

| | | | |
|---|---|---|---|
| 4,466,081 A | 8/1984 | Masuoka | |
| 5,366,922 A | 11/1994 | Aoki et al. | |
| 5,731,856 A | 3/1998 | Kim et al. | |
| 5,744,864 A | 4/1998 | Cillessen et al. | |
| 5,796,650 A | 8/1998 | Wik et al. | |
| 5,851,866 A | 12/1998 | Son | |
| 5,936,881 A | 8/1999 | Kawashima et al. | |
| 6,266,269 B1 | 7/2001 | Karp et al. | |
| 6,294,274 B1 | 9/2001 | Kawazoe et al. | |
| 6,563,174 B2 | 5/2003 | Kawasaki et al. | |
| 6,628,551 B2 | 9/2003 | Jain | |
| 6,727,522 B1 | 4/2004 | Kawasaki et al. | |
| 6,808,971 B2 | 10/2004 | Bhattacharyya | |

(Continued)

FOREIGN PATENT DOCUMENTS

| | | |
|---|---|---|
| EP | 0053878 A2 | 6/1982 |
| EP | 1583239 A | 10/2005 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Hoai V Ho
*Assistant Examiner* — James G Norman
(74) *Attorney, Agent, or Firm* — Eric J. Robinson; Robinson Intellectual Property Law Office, P.C.

(57) ABSTRACT

The semiconductor device is formed using a material which allows a sufficient reduction in off-state current of a transistor; for example, an oxide semiconductor material, which is a wide gap semiconductor, is used. When a semiconductor material which allows a sufficient reduction in off-state current of a transistor is used, the semiconductor device can hold data for a long period. In addition, the timing of potential change in a signal line is delayed relative to the timing of potential change in a write word line. This makes it possible to prevent a data writing error.

30 Claims, 51 Drawing Sheets

U.S. PATENT DOCUMENTS

| | | |
|---|---|---|
| 6,972,986 B2 * | 12/2005 | Peng et al. ............ 365/149 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,064,973 B2 | 6/2006 | Peng et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,687,331 B2 | 3/2010 | Kim et al. |
| 7,732,819 B2 | 6/2010 | Akimoto et al. |
| 7,741,644 B2 | 6/2010 | Lyu et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101334 A1 | 5/2011 | Yamazaki et al. |
| 2011/0156028 A1 | 6/2011 | Yamazaki et al. |
| 2011/0157961 A1 | 6/2011 | Yamazaki et al. |
| 2011/0205775 A1 | 8/2011 | Matsuzaki et al. |
| 2011/0255325 A1 | 10/2011 | Nagatsuka et al. |

FOREIGN PATENT DOCUMENTS

| | | |
|---|---|---|
| EP | 1737044 A | 12/2006 |
| EP | 2226847 A | 9/2010 |
| JP | 57-105889 | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-053164 | 2/2001 |
| JP | 2001-053167 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43. No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,",AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide.TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 amd SC2O3-A2O3-BO Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

European Search Report (Application No. 11176570.7) Dated Oct. 27, 2011.

* cited by examiner

FIG. 16A

Writing operation

|  | RWL_1 | RWL_2 | RWL_3 | RWL_4 |
|---|---|---|---|---|
| writing in the first row | L | H | H | H |
| writing in the second row | L | L | H | H |
| writing in the third row | L | L | L | H |
| writing in the fourth row | L | L | L | L |

FIG. 16B

Reading operation

|  | RWL_1 | RWL_2 | RWL_3 | RWL_4 |
|---|---|---|---|---|
| reading in the first row | L | H | H | H |
| reading in the second row | H | L | H | H |
| reading in the third row | H | H | L | H |
| reading in the fourth row | H | H | H | L |

FIG. 18A    FIG. 18B
FIG. 18C
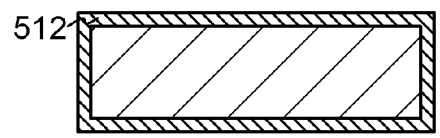
FIG. 18D
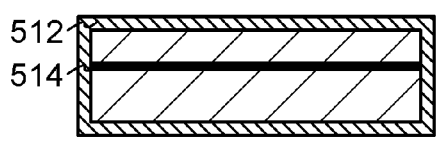
FIG. 18E
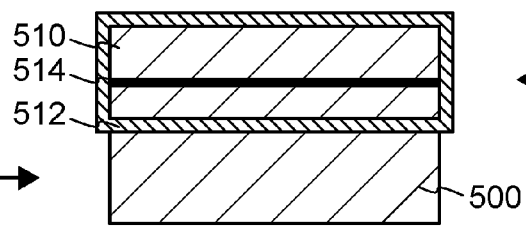
FIG. 18F
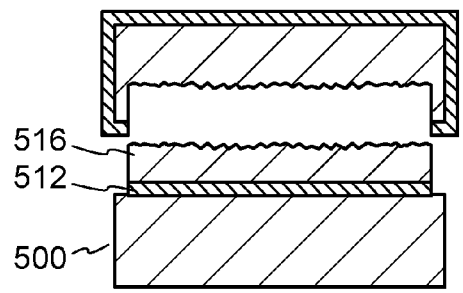
FIG. 18G
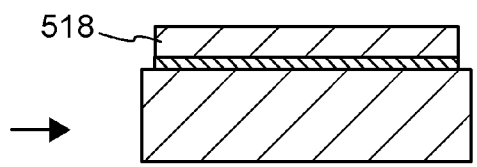

c-axis direction electrical charge = 0 electrical charge = +1 electrical charge = 0 a-b plane electrical charge = −1 electrical charge = 0

FIG. 36A  FIG. 36B
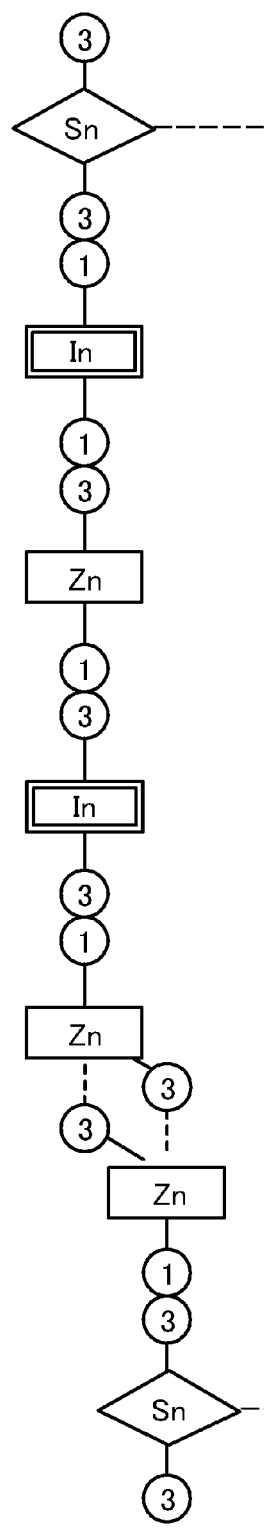
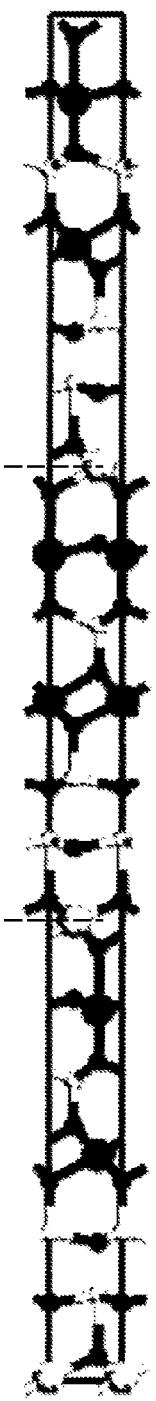
FIG. 36C
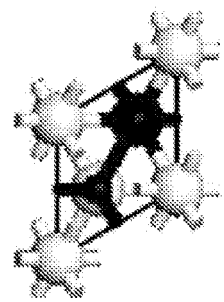
- ● In
- ◐ Sn
- ◡ Zn
- • O

SEMICONDUCTOR DEVICE AND DRIVING METHOD THEREOF

BACKGROUND OF THE INVENTION

1. Field of the Invention

An embodiment of the invention disclosed herein relates to a semiconductor device including a semiconductor element and a driving method of the semiconductor device.

2. Description of the Related Art

Memory devices including semiconductor elements are broadly classified into two categories: volatile memory devices that lose stored data when not powered, and nonvolatile memory devices that hold stored data even when not powered.

A typical example of volatile memory devices is a dynamic random access memory (DRAM). A DRAM stores data in such a manner that a transistor included in a memory element is selected and electric charge is stored in a capacitor.

When data is read from a DRAM, electric charge in a capacitor is lost according to the above-described principle; thus, another writing operation is necessary every time data is read out. Moreover, a transistor included in a memory element has leakage current between a source and a drain in an off state (off-state current) or the like and electric charge flows into or out of the transistor even if the transistor is not selected, which makes a data holding period short. For that reason, writing operation (refresh operation) is necessary at predetermined intervals, and it is difficult to sufficiently reduce power consumption. Furthermore, since stored data is lost when power supply stops, another memory device utilizing a magnetic material or an optical material is needed in order to hold the data for a long time.

Another example of volatile memory devices is a static random access memory (SRAM). An SRAM holds stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

A typical example of nonvolatile memory devices is a flash memory. A flash memory includes a floating gate between a gate and a channel formation region in a transistor and stores data by holding electric charge in the floating gate. Therefore, a flash memory has advantages in that the data holding period is extremely long (semi-permanent) and refresh operation which is necessary to volatile memory devices is not needed (e.g., see Patent Document 1).

However, in a flash memory, there is a problem in that a memory element becomes unable to function after a predetermined number of writing operations because a gate insulating layer included in the memory element deteriorates due to tunneling current generated in writing operations. In order to reduce effects of this problem, a method in which the number of writing operations is equalized among memory elements can be employed, for example, but a complex peripheral circuit is needed to realize this method. Moreover, even when such a method is employed, the fundamental problem of lifetime cannot be resolved. In other words, a flash memory is not suitable for applications in which data is frequently rewritten.

In addition, high voltage is necessary in order to inject electric charge in the floating gate or remove the electric charge, and a circuit for that purpose is required. Further, it takes a relatively long time to inject or remove electric charge, and it is not easy to increase the speed of writing or erasing data.

REFERENCE

[Patent Document 1] Japanese Published Patent Application No. S57-105889

SUMMARY OF THE INVENTION

In view of the foregoing problems, an object of one embodiment of the disclosed invention is to provide a semiconductor device having a novel structure, which can hold stored data even when not powered and which has an unlimited number of write cycles.

In one embodiment of the disclosed invention, a semiconductor device is formed using a material capable of sufficiently reducing the off-state current of a transistor, such as an oxide semiconductor material that is a widegap semiconductor. The use of a semiconductor material capable of sufficiently reducing the off-state current of a transistor allows data to be held for a long time.

In addition, the timing of potential change in a signal line is delayed relative to the timing of potential change in a write word line. This makes it possible to prevent a data writing error.

One embodiment of the present invention is a semiconductor device including m write word lines (m is a natural number greater than or equal to 2), m read word lines, n bit lines (n is a natural number greater than or equal to 2), n source lines; n signal lines, a memory cell array comprising memory cells arranged in matrix of m rows and n columns, a first driver circuit, and a second driver circuit. One of the memory cells comprises a first transistor including a first gate electrode, a first source electrode, a first drain electrode, and a first channel formation region; a second transistor including a second gate electrode, a second source electrode, a second drain electrode, and a second channel formation region; and a capacitor. The first channel formation region includes a semiconductor material different from a semiconductor material of the second channel formation region. The second source electrode of the memory cell in the k-th row (k is a natural number greater than or equal to 2 and smaller than or equal to (m−1)) and the first drain electrode of the memory cell in the (k+1)-th row are electrically connected to each other. The first gate electrode of the memory cell in the k-th row, the second drain electrode of the memory cell in the k-th row, and one electrode of the capacitor of the memory cell in the k-th row are electrically connected to one another and form a node where charge is held. The first driver circuit is electrically connected to the first drain electrode through the bit line and electrically connected to the second source electrode through the signal line. The second driver circuit is electrically connected to the other electrode of the capacitor through the read word line and electrically connected to the second gate electrode through the write word line. The second driver circuit is configured to delay a signal that is input to the signal line relative to a signal that is input to the write word line.

In the above structure, in writing operation of the memory cells in the k-th row, a first high potential is supplied to the write word lines of the memory cells in the first row to the (k−1)-th row which are not selected and the memory cells in the k-th row which are selected, a first low potential is supplied to the write word lines of the memory cells in the (k+1)-th row to the m-th row which are not selected, a second low potential is supplied to the read word lines of the memory cells in the first row to the (k−1)-th row which are not selected and the memory cells in the k-th row which are selected, a second high potential is supplied to the read word lines of the memory cells in the (k+1)-th row to the m-th row which are not selected, so that the first transistors of the memory cells in the (k+1)-th row to the m-th row which are not selected are turned on and potential of the source lines of the first transistors of the memory cells in the k-th row which are selected is fixed.

One embodiment of the present invention is a semiconductor device including a write word line, a read word line, a bit line, a signal line, a memory cell array comprising a first memory cell and a second memory cell, a first driver circuit, and a second driver circuit. The first memory cell and the second memory cell each includes a first transistor including a first channel formation region, the first channel formation region including a first semiconductor material, a second transistor including a second channel formation region, the second channel formation region including a second semiconductor material, in which the first semiconductor material is different from the second semiconductor material, and a capacitor. A gate of the first transistor, a second terminal of the second transistor, and one electrode of the capacitor are electrically connected to one another. A first terminal of the first transistor of the first memory cell and a second terminal of the first transistor of the second memory cell are electrically connected to each other. The first driver circuit is electrically connected to a second terminal of the first transistor of the first memory cell through the bit line and electrically connected to a first terminal of the second transistor of the first memory cell through the signal line. The second driver circuit is electrically connected to the other electrode of the capacitor of the first memory cell through the read word line and electrically connected to a gate of the second transistor of the first memory cell through the write word line.

In any of the above embodiments, the semiconductor device may further include a potential conversion circuit configured to output a potential higher than a power supply potential to the second driver circuit.

In any of the above embodiments, the second channel formation region of the second transistor includes an oxide semiconductor.

In any of the above embodiment, the second driver circuit includes a level shift circuit electrically connected to the write word line and the read word line.

Note that although, in the above embodiments, the transistor may be formed using an oxide semiconductor, the disclosed invention is not limited thereto. A material capable of realizing off-state current characteristics comparable to those of an oxide semiconductor, for example, a widegap material (specifically, a semiconductor material having an energy gap Eg of more than 3 eV, for example), such as silicon carbide, or the like may be employed.

Note that the term such as "over" or "below" in this specification and the like does not necessarily mean that a component is placed "directly on" or "directly under" another component. For example, the expression "a gate electrode over a gate insulating layer" does not exclude the case where a component is placed between the gate insulating layer and the gate electrode.

In addition, the term such as "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Functions of a "source" and a "drain" are sometimes interchanged with each other when a transistor of opposite polarity is used or when the direction of current flowing is changed in circuit operation, for example. Therefore, the terms "source" and a "drain" can be used to denote the drain and the source, respectively, in this specification and the like.

Note that the term "electrically connected" in this specification and the like includes the case where components are connected through an "object having any electric function". There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Since off-state current of a transistor including an oxide semiconductor is extremely small, stored data can be held for an extremely long period by using the transistor. In other words, refresh operation becomes unnecessary or the frequency of the refresh operation can be extremely low, which leads to a sufficient reduction in power consumption. Moreover, stored data can be held for a long period even when power is not supplied (note that the potential is preferably fixed).

Further, a semiconductor device according to the disclosed invention does not need high voltage for data writing and does not have the problem of element deterioration. For example, unlike a conventional nonvolatile memory, it is not necessary to inject and extract electrons into and from a floating gate, and thus a problem such as deterioration of a gate insulating layer does not arise at all. That is, the semiconductor device according to the disclosed invention has no limitation on the number of times data can be rewritten, which is a problem of a conventional nonvolatile memory, and the reliability thereof is drastically improved. Furthermore, since data is written by turning on or off the transistor, high-speed operation can be easily realized. Additionally, there is an advantage in that operation for erasing data is not needed.

Since a transistor including a material other than an oxide semiconductor can operate at sufficiently high speed, when this is combined with a transistor including an oxide semiconductor, a semiconductor device can perform operation (e.g., data reading) at sufficiently high speed. Further, a transistor including a material other than an oxide semiconductor can favorably realize a variety of circuits (e.g., a logic circuit or a driver circuit) which needs to operate at high speed.

A semiconductor device having a novel feature can be realized by being provided with both the transistor including a material other than an oxide semiconductor (in a broader sense, a transistor capable of operating at sufficiently high speed) and the transistor including an oxide semiconductor (in a broader sense, a transistor whose off-state current is sufficiently small).

BRIEF DESCRIPTION OF THE DRAWINGS

FIGS. 16A and 16B are diagrams showing operation of a semiconductor device;

FIGS. 18A to 18G are cross-sectional views showing steps for manufacturing a semiconductor device;

FIGS. 36A to 36C illustrate a structure of an oxide material according to one embodiment of the present invention;

DETAILED DESCRIPTION OF THE INVENTION

Figures 1, 1A:
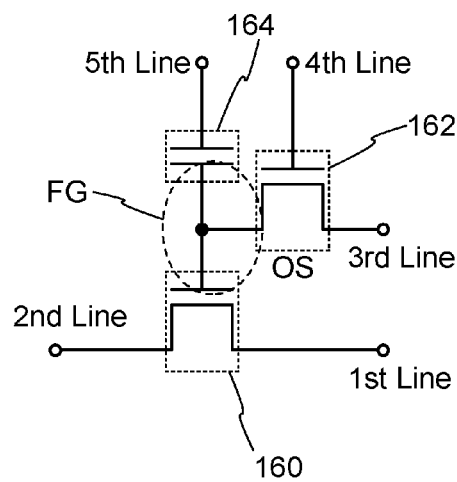
FIGS. 1A-1, 1A-2, and 1B are circuit diagrams of a semiconductor device.

Examples of embodiments of the present invention will be described below with reference to the drawings. Note that the present invention is not limited to the following description and it will be readily appreciated by those skilled in the art that the modes and details of the present invention can be modified in various ways without departing from the spirit and the scope thereof. Therefore, the present invention should not be interpreted as being limited to the description in the following embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

In this embodiment, a circuit configuration and an operation of a semiconductor device according to one embodiment of the disclosed invention will be described with reference to FIGS. 1A-1, 1A-2, and 1B, FIGS. 2A and 2B, and FIG. 3. Note that in some circuit diagrams mentioned below, "OS" is written beside a transistor in order to indicate that the transistor includes an oxide semiconductor.

<Basic Circuit>

First, a basic circuit configuration and operation thereof will be described with reference to FIGS. 1A-1, 1A-2, and 1B. In a semiconductor device illustrated in FIG. 1A-1, a first wiring (1st Line) is electrically connected to a drain electrode (or a source electrode) of a transistor 160. A second wiring (2nd Line) is electrically connected to the source electrode (or the drain electrode) of the transistor 160. A third wiring (3rd Line) is electrically connected to a source electrode (or a drain electrode) of a transistor 162. A fourth wiring (4th Line) is electrically connected to a gate electrode of the transistor 162. A gate electrode of the transistor 160 and the drain electrode (or the source electrode) of the transistor 162 are electrically connected to one electrode of a capacitor 164. A fifth wiring (5th Line) is electrically connected to the other electrode of the capacitor 164.

Here, a transistor including an oxide semiconductor is used as the transistor 162, for example. A transistor including an oxide semiconductor has a characteristic of a significantly small off-state current. For that reason, a potential of the gate electrode of the transistor 160 can be held for an extremely long period by turning off the transistor 162. Provision of the capacitor 164 facilitates holding of charge given to the gate electrode of the transistor 160 and reading of stored data.

Note that there is no particular limitation on the transistor 160. In terms of increasing the speed of reading data, it is preferable to use a transistor with high switching speed such as a transistor formed using single crystal silicon, for example.

Figure 1B:
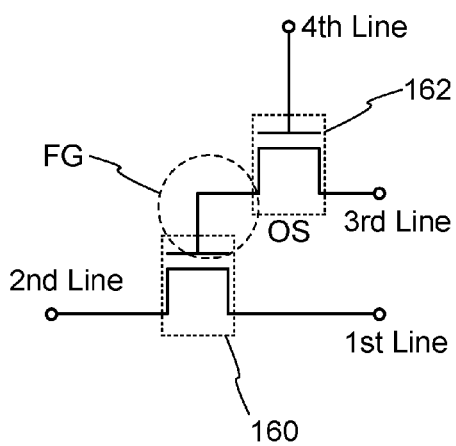

Alternatively, a configuration in which the capacitor 164 is not provided is also possible as shown in FIG. 1B.

The semiconductor device in FIG. 1A-1 utilizes a characteristic in which the potential of the gate electrode of the transistor 160 can be held, and can thus write, hold, and read data as follows.

First of all, writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, predetermined electric charge is supplied to the gate electrode of the transistor 160 (writing). Here, one of two kinds of electric charges providing different potentials (hereinafter, a charge providing a low potential is referred to as charge $Q_L$ and a charge providing a high potential is referred to as charge $Q_H$) is applied. Note that three or more kinds of charges providing different potentials may be applied to improve storage capacity. After that, the potential of the fourth wiring is set to a potential at which the transistor 162 is turned off, so that the transistor 162 is turned off. Thus, the charge supplied to the gate electrode of the transistor 160 is held (holding).

Since the off-state current of the transistor 162 is significantly small, the charge of the gate electrode of the transistor 160 is held for a long time.

Next, reading of data will be described. By supplying an appropriate potential (reading potential) to the fifth wiring while supplying a predetermined potential (a constant potential) to the first wiring, the potential of the second wiring varies depending on the amount of charge held at the gate electrode of the transistor 160. This is because in general, when the transistor 160 is an n-channel transistor, an apparent threshold voltage $V_{th\_H}$ in the case where $Q_H$ is given to the gate electrode of the transistor 160 is lower than an apparent threshold voltage $V_{th\_L}$ in the case where $Q_L$ is given to the gate electrode of the transistor 160. Here, an apparent threshold voltage refers to the potential of the fifth wiring, which is needed to turn on the transistor 160. Thus, the potential of the fifth line is set to a potential $V_0$ intermediate between $V_{th\_H}$ and $V_{th\_L}$, whereby charge given to the gate electrode of the transistor 160 can be determined. For example, in the case where $Q_H$ is supplied in writing, when the potential of the fifth wiring is set to $V_0$ ($>V_{th\_H}$), the transistor 160 is turned on. In the case where $Q_L$ is supplied in writing, even when the potential of the fifth wiring is set to $V_0$ ($<V_{th\_L}$), the transistor 160 remains off. Therefore, the stored data can be read by referring to the potential of the second line.

Note that in the case where memory cells are arrayed to be used, only data of desired memory cells is needed to be read. In the case where data of a predetermined memory cell are read and data of the other memory cells are not read, fifth wirings in memory cells that are not a target for reading are supplied with a potential at which the transistors 160 are turned off regardless of the state of the gate electrodes, that is, a potential lower than $V_{th\_H}$. Alternatively, fifth wirings are supplied with a potential at which the transistors 160 are turned on regardless of the state of the gate electrodes, that is, a potential higher than $V_{th\_L}$.

Next, rewriting of data will be described. Rewriting of data is performed in a manner similar to that of the writing and holding of data. In other words, the potential of the fourth wiring is set to a potential at which the transistor 162 is turned on, so that the transistor 162 is turned on. Accordingly, the potential of the third wiring (a potential for new data) is supplied to the gate electrode of the transistor 160 and the capacitor 164. After that, the potential of the fourth wiring is set to a potential at which the transistor 162 is turned off, so that the transistor 162 is turned off. Accordingly, charge for new data is supplied to the gate electrode of the transistor 160.

In the semiconductor device according to an embodiment of the disclosed invention, data can be directly rewritten by another data writing operation as described above. Therefore, extraction of charge from a floating gate with the use of a high voltage which is necessary for a flash memory or the like is not needed, and thus a decrease in operation speed due to erasing operation can be suppressed. In other words, high-speed operation of the semiconductor device can be realized.

Note that the drain electrode (or the source electrode) of the transistor 162 is electrically connected to the gate electrode of the transistor 160 and therefore has a function similar to that of a floating gate of a floating gate transistor used for a nonvolatile memory element. A portion where the drain electrode (or the source electrode) of the transistor 162 and the gate electrode of the transistor 160 are electrically connected to each other is called a node FG in some cases. When the transistor 162 is turned off, the node FG can be regarded as being embedded in an insulator and thus charge is held at the node FG. The off-state current of the transistor 162 including an oxide semiconductor is smaller than or equal to 1/100000 of the off-state current of a transistor including a silicon semiconductor or the like; thus, loss of the charge accumulated in the node FG due to leakage in the transistor 162 is negligible. That is, with the transistor 162 including an oxide semiconductor, a nonvolatile memory device which can hold data without being supplied with power can be realized.

For example, when the off-state current of the transistor 162 at room temperature (25° C.) is 10 zA (1 zA (zeptoampere) is $1 \times 10^{-21}$ A) or less and the capacitance of the capacitor 164 is approximately 10 fF, data can be held for $10^4$ seconds or longer. It is needless to say that the holding time depends on transistor characteristics and capacitance.

Further, the semiconductor device according to an embodiment of the disclosed invention does not have the problem of deterioration of a gate insulating film (tunnel insulating film), which is a problem of a conventional floating gate transistor. That is, the problem of deterioration of a gate insulating film due to injection of electrons into a floating gate, which is a conventional problem, can be solved. This means that there is no limit on the number of write cycles in principle. Furthermore, a high voltage needed for writing or erasing in a conventional floating gate transistor is not necessary.

Figures 1, 1A, 2:
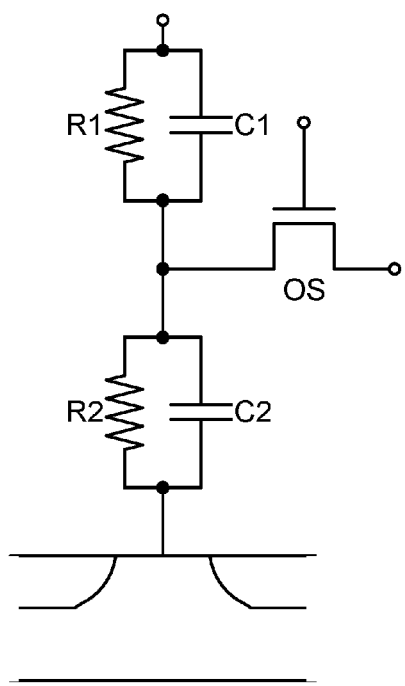

Components such as transistors in the semiconductor device in FIG. 1A-1 can be regarded as including resistors and capacitors as illustrated in FIG. 1A-2. That is, in FIG. 1A-2, the transistor 160 and the capacitor 164 are each regarded as including a resistor and a capacitor. R1 and C1 denote the resistance and the capacitance of the capacitor 164, respectively. The resistance R1 corresponds to the resistance of the insulating layer included in the capacitor 164. R2 and C2 denote the resistance and the capacitance of the transistor 160, respectively. The resistance R2 corresponds to the resistance of the gate insulating layer at the time when the transistor 160 is turned on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the transistor 162 under the conditions where the gate leakage current of the transistor 162 is sufficiently small, R1 is greater than or equal to ROS, and R2 is greater than or equal to ROS, where ROS is the resistance (also referred to as effective resistance) between the source electrode and the drain electrode in a state where the transistor 162 is turned off.

On the other hand, in the case where the above conditions are not satisfied, it is difficult to secure a sufficient holding period even if the off-state current of the transistor 162 is sufficiently small. This is because a leakage current other than the off-state current of the transistor 162 (e.g., a leakage current generated between the source electrode and the gate electrode of the transistor 160) is large. Accordingly, it can be said that it is preferable that the semiconductor device disclosed in this embodiment satisfies the relationships in that R1 is greater than or equal to ROS and R2 is greater than or equal to ROS.

Meanwhile, C1 is preferably greater than or equal to C2. This is because if C1 is large, when the potential of the node FG is controlled by the fifth wiring, the potential of the fifth wiring can be efficiently supplied to the node FG and the difference between potentials supplied to the fifth wiring (e.g., a reading potential and a non-reading potential) can be kept small.

When the above relationships are satisfied, a more favorable semiconductor device can be realized. Note that R1 and R2 depend on the gate insulating layer of the transistor 160 and the insulating layer of the capacitor 164. The same applies to C1 and C2. Therefore, the material, the thickness, and the like of the gate insulating layer are preferably set as appropriate to satisfy the above relationships.

In the semiconductor device described in this embodiment, the node FG has a function similar to a floating gate of a floating gate transistor of a flash memory or the like, but the node FG of this embodiment has a feature which is essentially different from that of the floating gate of the flash memory or the like.

In the case of a flash memory, since a high potential is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic principle of a flash memory, in which a tunneling current is generated by applying a high electric field.

On the other hand, the semiconductor device according to this embodiment is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates higher integration.

In addition, the semiconductor device according to this embodiment is advantageous over a flash memory also in that a high electric field is not necessary and a large peripheral circuit (such as a step-up circuit) is not necessary. For example, the highest voltage applied to the memory cell according to this embodiment (the difference between the highest potential and the lowest potential applied to respective terminals of the memory cell at the same time) can be 5 V or less, preferably 3 V or less, in each memory cell in the case where data of two stages (one bit) is written.

In the case where the relative permittivity $\in r1$ of the insulating layer included in the capacitor 164 is different from the relative permittivity $\in r2$ of the insulating layer included in the transistor 160, it is easy to satisfy that C1 is greater than or equal to C2 while satisfying that 2·S2 is greater than or equal to S1, preferably S2 is greater than or equal to S1, where S1 is the area of the insulating layer included in the capacitor 164 and S2 is the area of the insulating layer forming a gate capacitor of the transistor 160. In other words, C1 can easily be made greater than or equal to C2 while the area of the insulating layer included in the capacitor 164 is made small. Specifically, for example, a film including a high-k material such as hafnium oxide or a stack of a film including a high-k material such as hafnium oxide and a film including an oxide semiconductor is used for the insulating layer included in the capacitor 164 so that $\in r1$ can be set to 10 or more, preferably 15 or more, and silicon oxide is used for the insulating layer forming the gate capacitor so that $\in r2$ can be set to 3 to 4.

A combination of such structures enables the semiconductor device according to one embodiment of the disclosed invention to have further higher integration.

Note that in addition to higher integration, a multilevel technique can be employed in order to increase the storage capacity of the semiconductor device. For example, three or more levels of data are written to one memory cell, whereby the storage capacity can be increased as compared to the case where two-level (one-bit) data is written. The multilevel technique can be achieved by, for example, supplying charge Q to the gate electrode of the first transistor, in addition to charge $Q_L$ providing a low potential and charge $Q_H$ providing a high potential. In this case, enough storage capacity can be ensured even in a circuit structure with a relatively large scale (e.g., $15F^2$ to $50F^2$; F is the minimum feature size).

Application Example 1

Next, a more specific circuit structure to which the circuit illustrated in FIGS. 1A-1, 1A-2, and 1B is applied and an operation thereof will be described with reference to FIGS. 2A and 2B and FIG. 3.

Figure 2A:
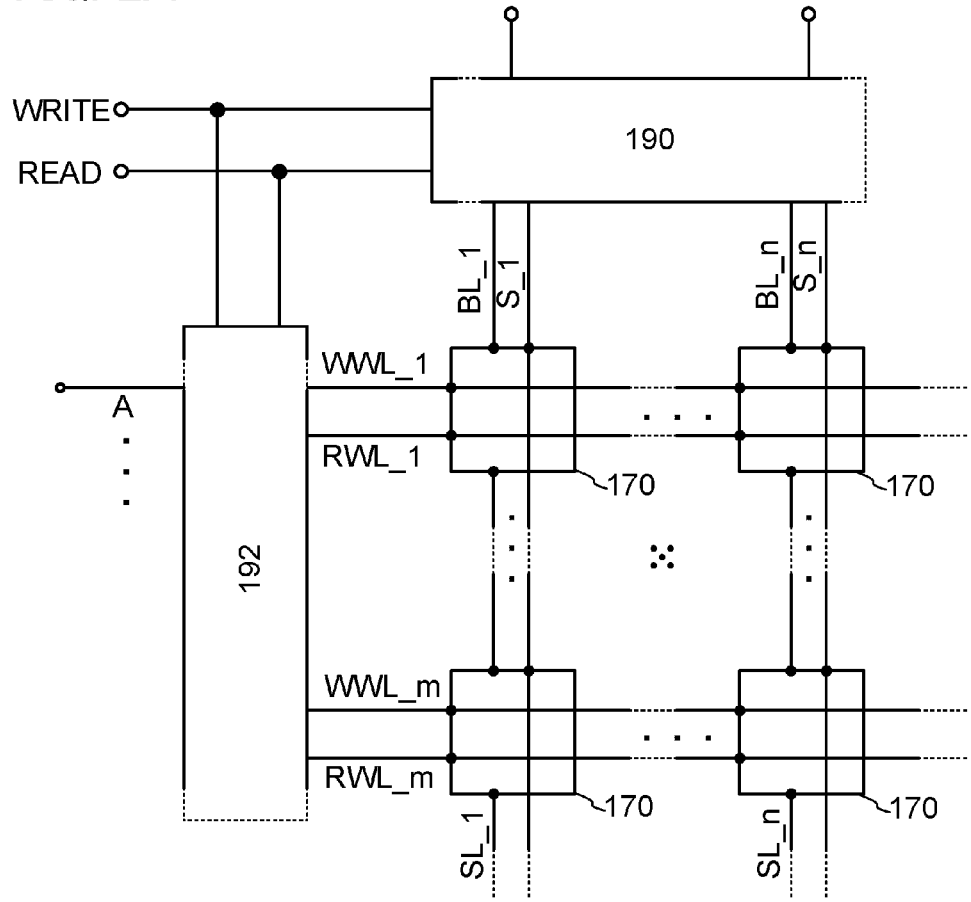
FIGS. 2A and 2B are circuit diagrams of a semiconductor device.
Figure 2B:
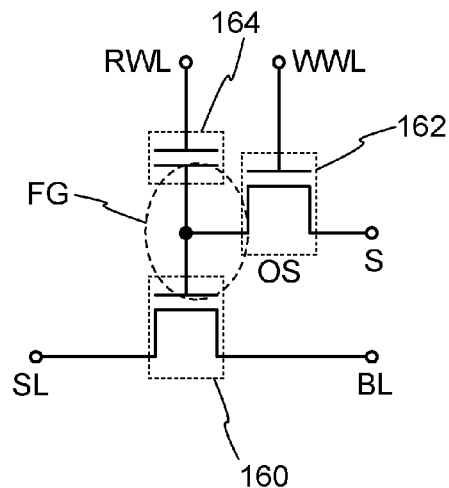

FIG. 2A is an example of a circuit diagram of a semiconductor device including (m×n) memory cells 170. The structure of the memory cells 170 in FIGS. 2A and 2B is similar to that in FIG. 1A-1. That is, as illustrated in FIG. 2B, the first wiring in FIG. 1A-1 corresponds to a bit line BL in FIG. 2B; the second wiring in FIG. 1A-1, a source line SL in FIG. 2B; the third wiring in FIG. 1A-1, a signal line S in FIG. 2B; the fourth wiring in FIG. 1A-1, a write word line WWL in FIG. 2B; and the fifth wiring in FIG. 1A-1, a read word line RWL in FIG. 2B. Note that in FIG. 2A, only the memory cells 170 of the first row are directly connected to the bit lines BL, and only the memory cells 170 of the m-th row are directly connected to the source lines SL. The memory cells 170 of the other rows are electrically connected to the bit lines BL and the source lines SL through other memory cells 170 of the same columns.

The semiconductor device in FIG. 2A includes m write word lines WWL (m is a natural number greater than or equal to 2), m read word lines RWL, n source lines SL (n is a natural number greater than or equal to 2), n bit lines BL, n signal lines S, a memory cell array having the memory cells 170 arranged in a matrix of m (rows) (in the vertical direction)×n (columns) (in the horizontal direction), a first driver circuit 190 connected to the n bit lines BL and the n signal lines S, and a second driver circuit 192 connected to the m write word lines WWL and the m read word lines RWL. The first driver circuit 190 and the second driver circuit 192 are connected to each other by a wiring WRITE and a wiring READ.

In addition, address selection signal lines A are connected to the second driver circuit 192. The address selection signal line A is a wiring that transmits a signal for selecting a row address of the memory cell.

The first driver circuit 190 and the second driver circuit 192 illustrated in FIG. 2A will be described with reference to FIG. 5.

The first driver circuit 190 includes a reading circuit 211, a control circuit 212, a delay circuit 213, and a buffer circuit 214. An input terminal IN is connected to the signal line S through the control circuit 212, the delay circuit 213, and the buffer circuit 214. The reading circuit 211 connected to the bit line BL is connected to an output terminal OUT.

The second driver circuit 192 includes a decoder circuit 221, a control circuit 222, a control circuit 223, and a buffer circuit 224, and a buffer circuit 225. The address selection signal lines A are connected to the decoder circuit 221. Decoder circuit output signal lines B are connected to the control circuit 222 and the control circuit 223. The control circuit 222 is connected to the write word line WWL through the buffer circuit 224. The control circuit 223 is connected to the read word line RWL through the buffer circuit 225.

Data writing, holding, and reading are basically similar to the case of FIGS. 1A-1, 1A-2, and 1B. A specific writing operation is described below. Note that although the case where either a potential V1 (a potential lower than a power supply potential VDD) or a reference potential GND is supplied to the node FG is described here as an example, the relationship among potentials supplied to the node FG is not limited to this example. Data that is held when the potential V1 is supplied to the node FG is referred to as data "1", and data that is held when the reference potential GND is supplied to the node FG is referred to as data "0".

First, the memory cell 170 is selected by setting the potentials of the read word line RWL and the write word line WWL, which are connected to the memory cell 170, to GND and V2 (a potential higher than V1, such as VDD), respectively.

In the case of writing data "0" to the memory cell 170, GND is supplied to the signal line S, and in the case of writing data "1" to the memory cell 170, V1 is supplied to the signal line S. Because the potential of the write word line WWL is V2 here, V1 can be supplied to the node FG.

Data is held by setting the potential of the read word line RWL and the potential of the write word line WWL to GND.

When the potential of the read word line RWL is fixed to GND, the potential of the node FG is fixed to the potential at the time of writing. In other words, when V1 for data "1" is supplied to the node FG, the potential of the node FG is V1, and when GND for data "0" is supplied to the node FG, the potential of the node FG is GND.

Because GND is supplied to the write word line WWL, the transistor 162 is turned off regardless of whether data "1" or data "0" is written. Because the off-state current of the transistor 162 is significantly small, the charge of the gate electrode of the transistor 160 is held for a long time.

Data is read by setting the potentials of the read word line RWL and the write word line WWL, which are connected to the memory cell 170 that is a target for reading, to GND and by setting the potentials of the read word lines RWL and the write word lines WWL, which are connected to the memory cells 170 that are not the target for reading, to V2 and GND, respectively.

When the potential of the read word line RWL connected to the memory cell 170 that is the target for reading is set to GND, the transistor 160 is turned on if V1 for data "1" is supplied to the node FG of the memory cell 170 that is the target for reading. On the other hand, the transistor 160 is turned off if GND for data "0" is supplied to the node FG.

When the potentials of the read word lines RWL and the write word lines WWL, which are connected to the memory cells 170 that are not the target for reading, are set to V2 and GND, respectively, the transistors 160 are turned on regardless of whether data "1" or data "0" is written to the memory cells 170 that are not the target for reading.

In other words, by the above reading operation, if data "1" is written to the memory cell 170 that is a target for reading, the transistor 160 is turned on and the potential of the bit line BL is decreased. If data "0" is written, the transistor 160 is turned off and the potential of the bit line BL is maintained at the level at the beginning of reading or is raised.

Note that in the case where the above structure is employed, the potential of the read word line RWL and the potential of the write word line WWL in the data holding operation and the data reading operation are GND. In other words, if data "1" is written to all the memory cells 170 of a target column, the transistors 160 are turned on and the source line SL and the bit line BL are electrically connected to each other regardless of whether data is held or read. Therefore, an increase in power consumption becomes a problem in some cases. In order to sufficiently suppress an increase in power consumption resulting from such a situation, a selection transistor may be provided between the memory cells 170 and the source line SL or the bit line BL. Alternatively, except in the reading operation, the potentials of the source line SL and the bit line BL may be set equal to each other.

Figure 3:
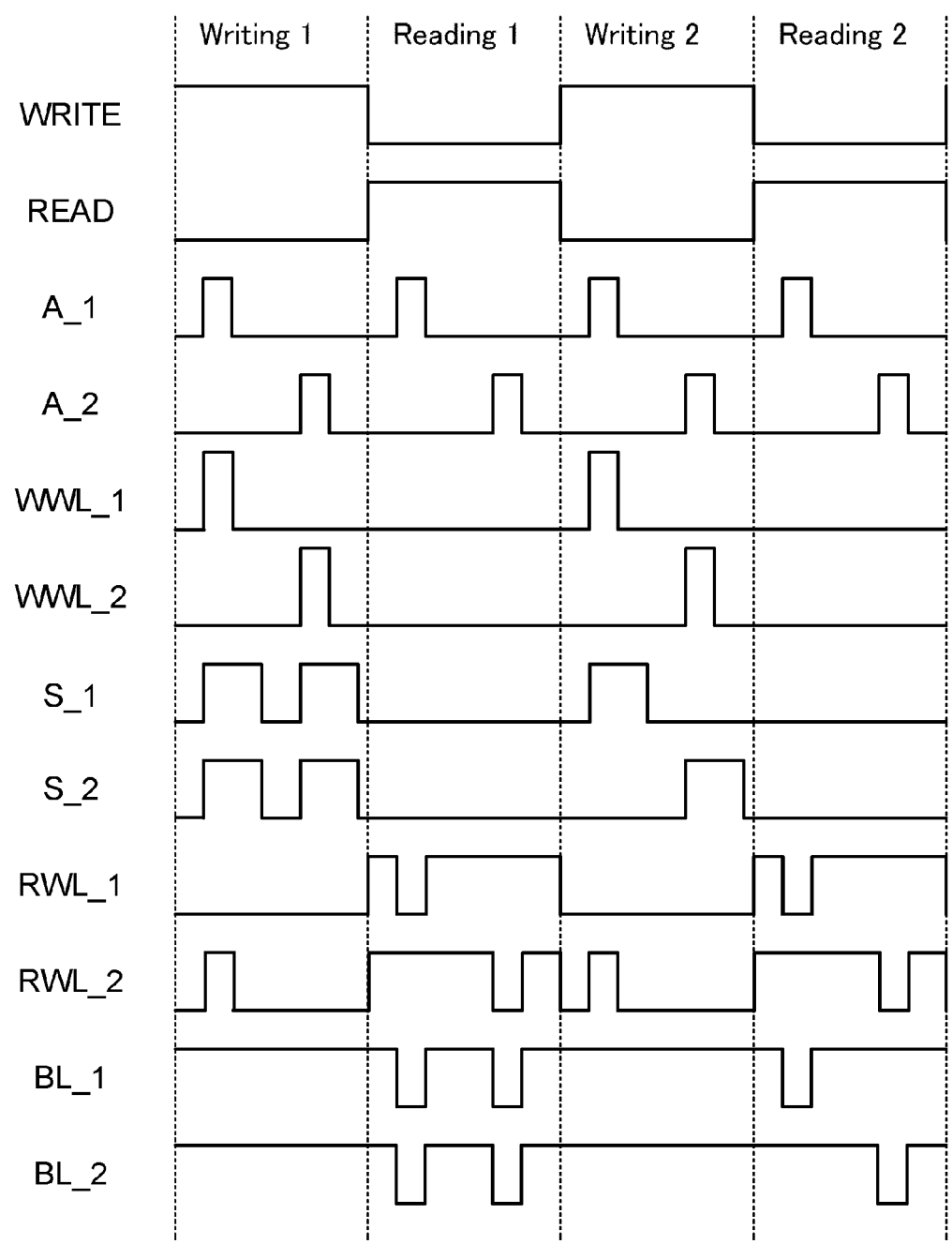
FIG. 3 is a timing chart.

FIG. 3 is an example of a timing chart for more detailed operations of the semiconductor device in FIG. 2A. READ, A, and the like in the timing chart denote the lines to which the potentials in the timing chart are applied. Lines having a similar function are distinguished by "_1", "_2", and the like added to the end of their names. Note that for the sake of simplicity, the semiconductor device described here is an example where the memory cells 170 are arranged in 2 (rows)×2 (columns), but the disclosed invention is not limited to this example.

The timing chart in FIG. 3 shows the relationship among the potentials of the lines in the case where data "1" is written to all the memory cells (Writing 1), then the written data in all the memory cells is read out (Reading 1), then data "1" is written to the memory cells in the first row and the first column and in the second row and the second column while data "0" is written to the memory cells in the first row and the second column and in the second row and the first column (Writing 2), and then the written data in all the memory cells is read out (Reading 2).

In Writing 1, WRITE is set at a high potential and READ is set at a low potential so that data can be written to the memory cell. The second driver circuit 192 outputs a row selection signal to RWL and WWL in accordance with potentials of A_1 and A_2. Here, in the case where A_1 is at a high potential, the first row is selected, and in the case where A_2 is at a high potential, the second row is selected. In addition, WWL in a selected row is set to a high potential. In the case where the first row is selected, RWL_1 is at a low potential and RWL_2 is at a high potential. In the case where the second row is selected, both RWL_1 and RWL_2 are at a low potential.

In the case where the first row is selected, RWL_2 is at a high potential, whereby the transistors 160 of the memory cells in the second row are turned on. Accordingly, potential of the source line SL of the transistor 160 of the memory cell in the first row is fixed. As a result, potential of a floating gate FG_1 in the first row is lowered in accordance with the falling of the WWL. However, since the potential of the source line SL of the transistor 160 of the memory cell in the first row is fixed, a reduction in the potential of the floating gate FG_1 in the first row can be suppressed.

In Writing 1, data "1" is written to all the memory cells; therefore, S_1 and S_2 are set to a high potential in accordance with the timing of row selection. Note that the period for signal input to S_1 and S_2 is set longer than the period for signal input to WWL. Alternatively, the signal input to S_1 and S_2 is delayed relative to the signal input to WWL. This is because there is a possibility that writing to memory cells may be insufficient if the period for signal input to S_1 and S_2 is short or the signal input to S_1 and S_2 is earlier than the signal input to WWL. In order to realize the operation, the delay circuit 213 may be connected to S_1 and S_2 so that the signal input to S_1 and S_2 is delayed relative to the signal input to WWL, for example. Note that the potentials of BL_1 and BL_2 are not a big problem at the time of writing (the potentials may be either a high potential or a low potential).

In Reading 1, WRITE is set at a low potential and READ is set at high potential so that data can be read from the memory cell. The second driver circuit 192 outputs a row selection signal to RWL and WWL in accordance with the potentials of A_1 and A_2. Here, in the case where A_1 is at a high potential, the first row is selected, and in the case where A_2 is at a high potential, the second row is selected. In addition, RWL in a selected row is at a low potential, RWL in an unselected row is at a high potential, and WWL is at a low potential regardless of whether it is in a selected row or not.

By the above operation, potentials in accordance with data held by memory cells in a selected row are supplied to BL_1 and BL_2. Note that the potentials of S_1 and S_2 are not a problem at the time of reading.

The relationship among the potentials of the lines in Writing 2 is similar to that in Writing 1. Note that S_1 and S_2 are set to high potential or low potential in accordance with the timing of row selection in order to write data "1" to the memory cells in the first row and the first column and in the second row and the second column and in order to write data "0" to the memory cells in the first row and the second column and in the second row and the first column.

The relationship among the potentials of the lines in Reading 2 is similar to that in Reading 1. It is confirmed that the potential corresponding to the data held in the memory cells in a selected row is applied to BL_1 and BL_2.

With the above structure, the potential of the source line SL of the transistor 160 of the memory cell to which data is written can be fixed at the time of writing. Therefore, a reduction in the potential of the floating gate can be prevented, so that stable potential can be written.

Note that in order to delay the signal that is input to the signal line S relative to the signal that is input to the write word line WWL in the above writing operations, one of delay circuits illustrated in FIGS. 4A to 4D is preferably provided in the first driver circuit 190 and connected to the signal line S, for example. By connecting the delay circuit and the signal line S, a change in potential of the signal line S can be delayed relative to a change in potential of the write word line WWL, and errors in writing data to the memory cell 170 can be reduced.

Next, the delay circuit 213 provided in the first driver circuit 190 illustrated in FIG. 5 will be described with reference to FIGS. 4A to 4D.

Figure 4A:
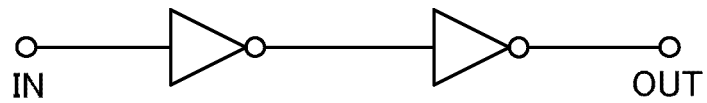
FIGS. 4A to 4D are circuit diagrams of a semiconductor device.
Figure 4B:
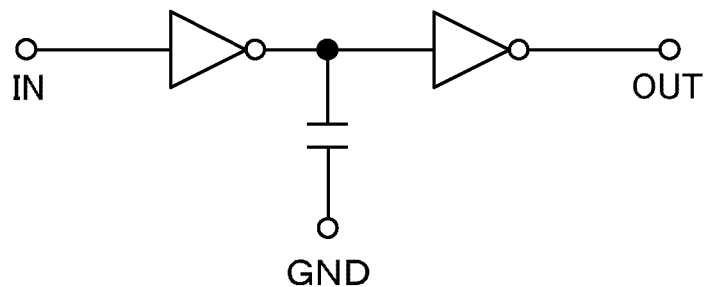
Figure 4C:
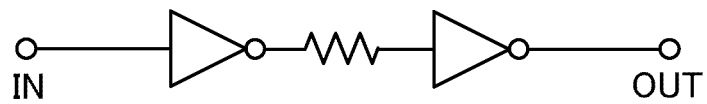
Figure 4D:
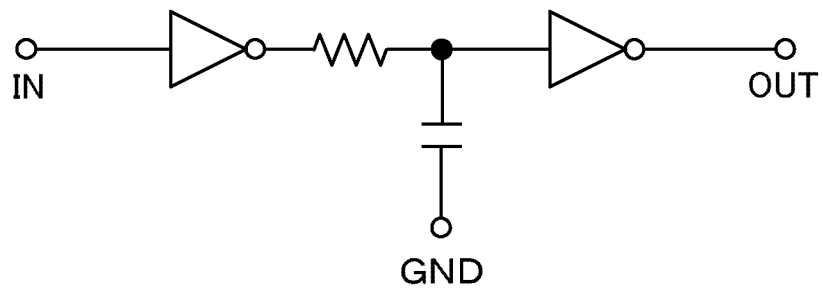

As the delay circuit 213, a circuit in which an even number of inverters are connected in series as illustrated in FIG. 4A can be used. Alternatively, the delay circuit 213 may have a structure in which a capacitor is added to an even number of inverters connected in series as illustrated in FIG. 4B or a structure in which a resistor is added to an even number of inverters connected in series as illustrated in FIG. 4C. Still alternatively, the delay circuit 213 may have a structure in which a resistor and a capacitor are added to an even number of inverter circuits connected in series as illustrated in FIG. 4D.

Alternatively, in order to delay the signal that is input to the signal line S relative to the signal that is input to the write word line WWL in the above writing operations, the size (e.g., the channel length) of a transistor of the buffer circuit 214 included in the first driver circuit 190 may be set larger than the size of a transistor of the buffer circuit 224 and the buffer circuit 225 included in the second driver circuit 192. Alternatively, the size (e.g., the channel width) of a transistor of the buffer circuit 214 included in the first driver circuit 190 may be set smaller than the size (e.g., the channel width) of a transistor of the buffer circuit 224 and the buffer circuit 225 included in the second driver circuit 192. Also in that case, a change in potential of the signal line S can be delayed relative to a change in potential of the write word line WWL, and errors in writing data to the memory cell 170 can be reduced.

Figure 15:
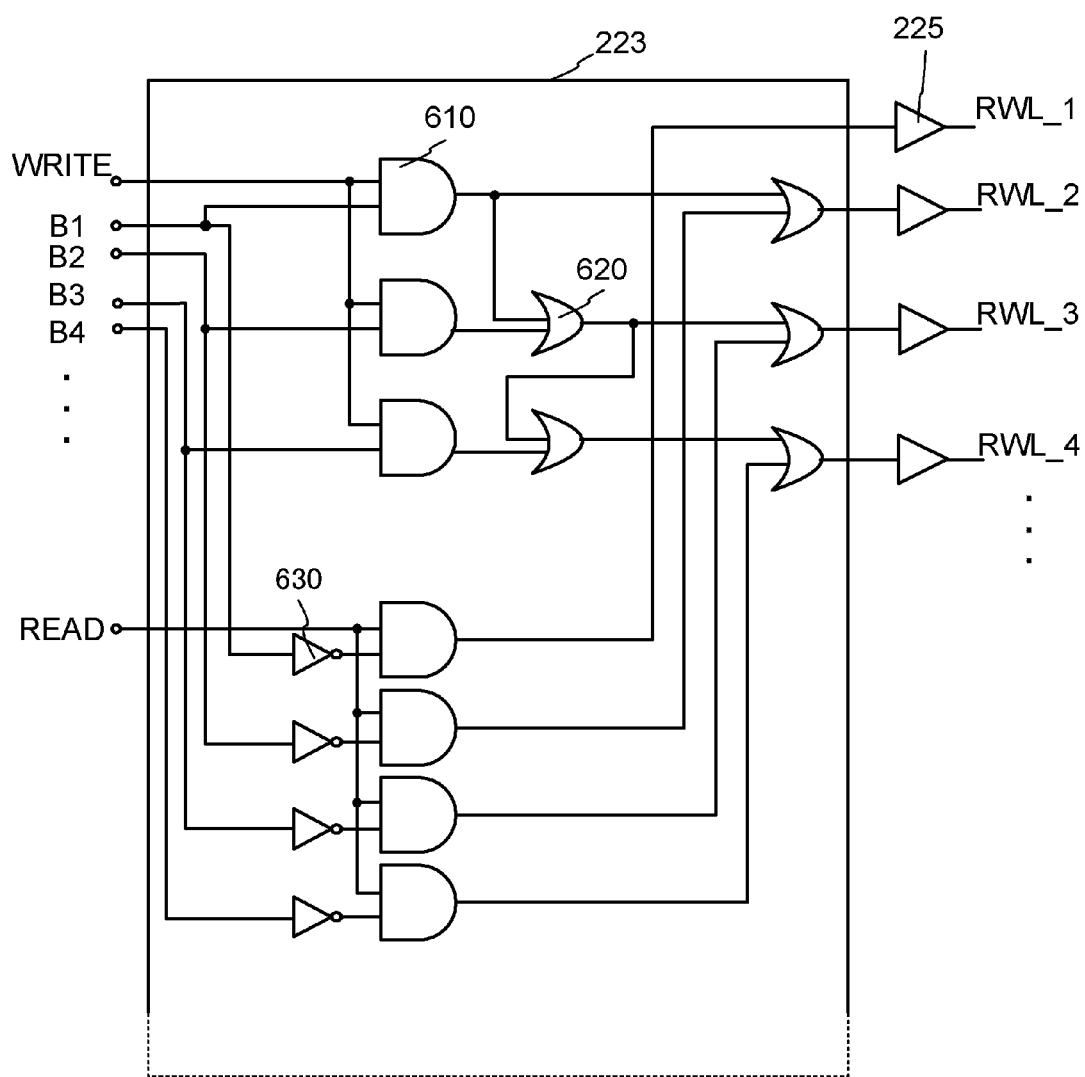
FIG. 15 is a circuit diagram of a semiconductor device.

Next, the control circuit 223 included in the second driver circuit 192 illustrated in FIG. 5 will be described with reference to FIG. 15.

The control circuit 223 includes a plurality of AND circuits 610, a plurality of OR circuits 620, and a plurality of NOT circuits 630. A wiring WRITE, a wiring READ, and the decoder circuit output signal lines B are connected to the control circuit 223. Each read word line RWL is controlled by the control circuit 223. In this embodiment, the control circuit 223 has the structure shown in FIG. 15; however, the disclosed invention is not limited thereto.

Next, the reading circuit 211 provided in the second driver circuit 192 illustrated in FIG. 5 will be described with reference to FIGS. 6A to 6C.

Figure 6A:
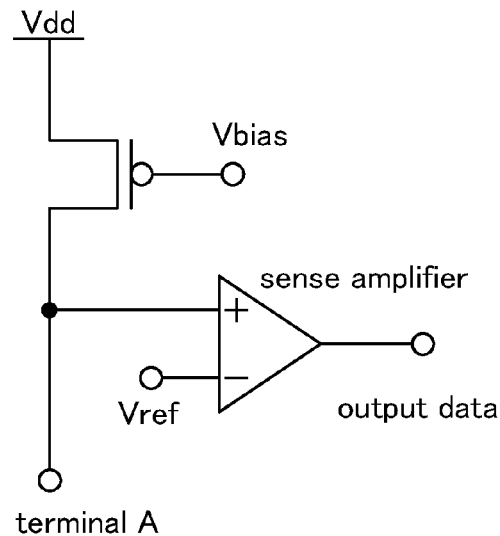
FIGS. 6A to 6C are circuit diagrams of a semiconductor device.

FIG. 6A illustrates the reading circuit. The reading circuit includes a transistor and a sense amplifier circuit.

At the time of reading data, a terminal A is connected to a bit line BL to which a memory cell from which data is to be read is connected. Further, a bias potential Vbias is applied to a gate electrode of the transistor so that a potential of the terminal A is controlled.

The resistance of the memory cell 170 varies depending on stored data. Specifically, when the transistor 160 of the memory cell 170 selected is turned on, the memory cell 170 has a low resistance, whereas when the transistor 160 of the memory cell 170 selected is turned off, the memory cell 170 has a high resistance.

When the memory cell has a high resistance, the potential of the terminal A is higher than a reference potential Vref and the sense amplifier circuit outputs a potential (data "0") corresponding to the potential of the terminal A. On the other hand, when the memory cell has a low resistance, the potential of the terminal A is lower than the reference potential Vref and the sense amplifier circuit outputs a potential (data "1") corresponding to the potential of the terminal A.

In this manner, by using the reading circuit, data can be read from the memory cell. Note that the reading circuit of this embodiment is one example. Another known circuit may be used. The reading circuit may further include a precharge circuit. Instead of the reference potential Vref, a reference bit line may be connected to the sense amplifier circuit.

Figure 6B:
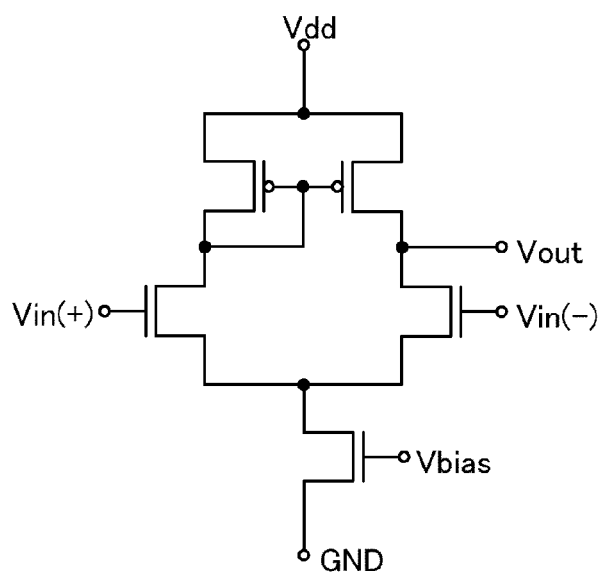

FIG. 6B illustrates a differential sense amplifier which is an example of the sense amplifier circuit. The differential sense amplifier has input terminals Vin(+) and Vin(−) and an output terminal Vout, and amplifies a difference between the input terminals Vin(+) and Vin(−). If the input terminal Vin(+)>the input terminal Vin(−), the output from an output terminal Vout is relatively high, whereas if the input terminal Vin(+)<the input terminal Vin(−), the output from the output terminal Vout is relatively low.

FIG. 6B illustrates a latch sense amplifier circuit which is an example of the sense amplifier circuit. The latch sense amplifier circuit has input/output terminals V1 and V2 and input terminals for control signals Sp and Sn. First, the control signal Sp is set high and the control signal Sn is set low, and a power supply potential (Vdd) is interrupted. Then, potentials to be compared are supplied to the input/output terminals V1 and V2. After that, the control signal Sp is set low and the control signal Sn is set high, and the power supply potential (Vdd) is supplied. If the potentials V1in and V2in to be compared satisfy V1in>V2in, the output from the input/output terminal V1 is high and the output from the input/output terminal V2 is low, whereas if the potentials satisfy V1in<V2in, the output from the input/output terminal V1 is low and the output from the input/output terminal V2 is high. By utilizing such a relationship, the difference between V1in and V2in can be amplified.

Application Example 2

Next, a circuit structure which is different from the circuit structure illustrated in FIGS. 2A and 2B will be described with reference to FIGS. 7A and 7B.

Figure 7A:
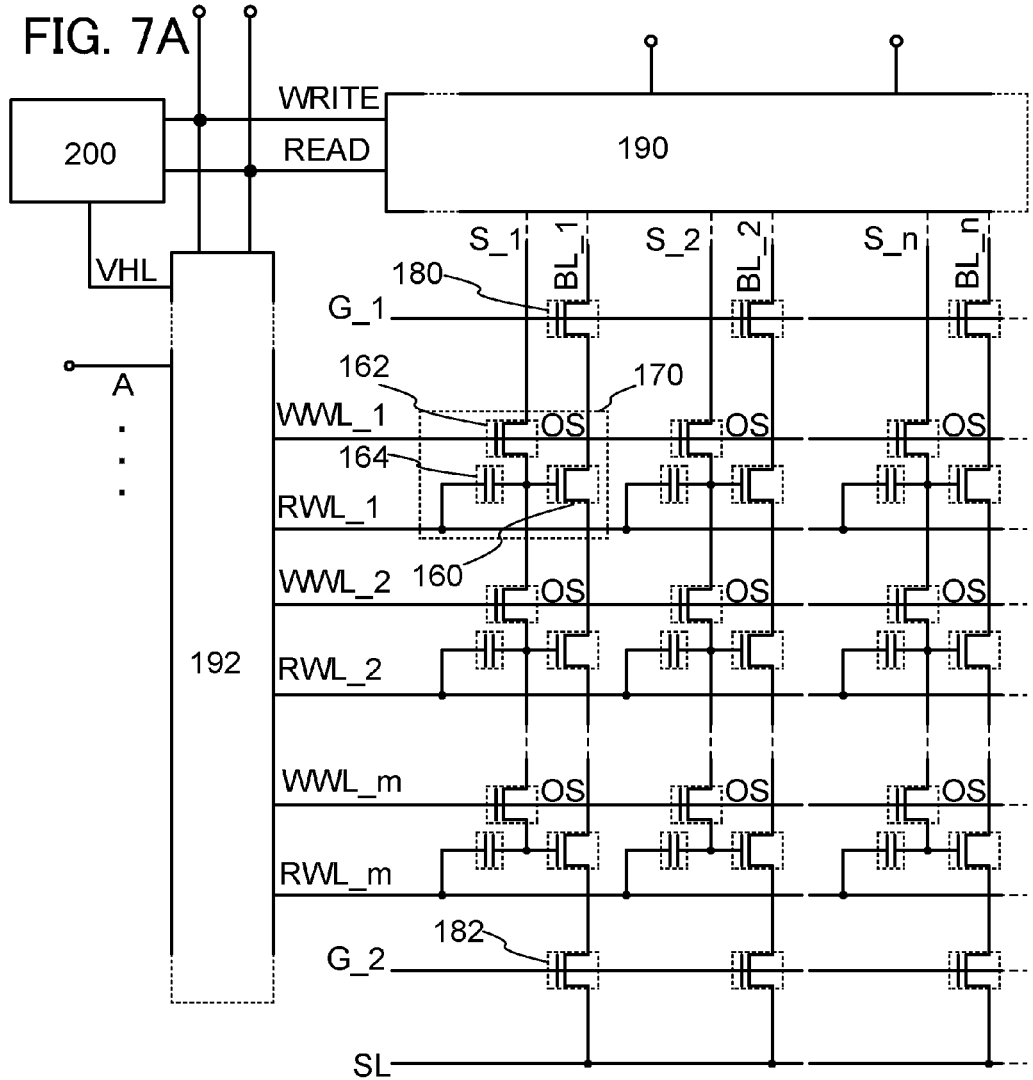
FIGS. 7A and 7B are circuit diagrams of a semiconductor device.

FIG. 7A is an example of a circuit diagram of a semiconductor device including (m×n) memory cells 170. The structure of the memory cells 170 in FIG. 7A is similar to that in FIG. 1A-1; therefore, the detailed description thereof is omitted. As illustrated in FIG. 7B, the first wiring in FIG. 1A-1 corresponds to a bit line BL in FIG. 7B; the second wiring in FIG. 1A-1, a source line SL in FIG. 7B; the third wiring in FIG. 1A-1, a signal line S in FIG. 7B; the fourth wiring in FIG. 1A-1, a write word line WWL in FIG. 7B; and the fifth wiring in FIG. 1A-1, a read word line RWL in FIG. 7B. Note that FIG. 7A shows a configuration in which a plurality of transistor 162 is connected in series in a column direction, a plurality of transistors 160 is connected in series in the column direction, and thus a plurality of memory cells 170 is connected in series. Only the memory cell 170 in the first row is connected to the bit line BL not through other memory cells 170, and only the memory cell 170 in the m-th row is connected to the source line SL not through other memory cells 170. The memory cells 170 of the other rows are electrically connected to the bit lines BL and the source lines SL through other memory cells 170 of the same columns.

Figure 7B:
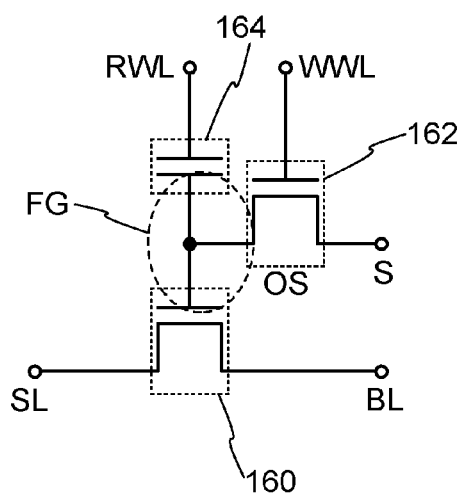

The semiconductor device in FIGS. 7A and 7B includes m write word lines WWL (m is a natural number greater than or equal to 2), m read word lines RWL, a source line SL, n bit lines BL (n is a natural number greater than or equal to 2), n signal lines S, a selection line G_1 and a selection line G_2, n selection transistors 180 each provided between the bit line BL and the memory cell 170 in the first row along the selection line G_1 and electrically connected to the selection line G_1 through a gate terminal thereof, n selection transistors 182 each provided between the source line SL and the memory cell 170 in the m-th row along the selection line G_2 and electrically connected to the selection line G_2 through a gate terminal thereof, a memory cell array having the memory cells 170 arranged in a matrix of m (rows) (in the vertical direction)×n (columns) (in the horizontal direction), a potential conversion circuit 200, a first driver circuit 190 connected to n bit lines BL and n signal lines S, and a second driver circuit 192 connected to m write word lines WWL and m read word lines RWL.

Figure 10:
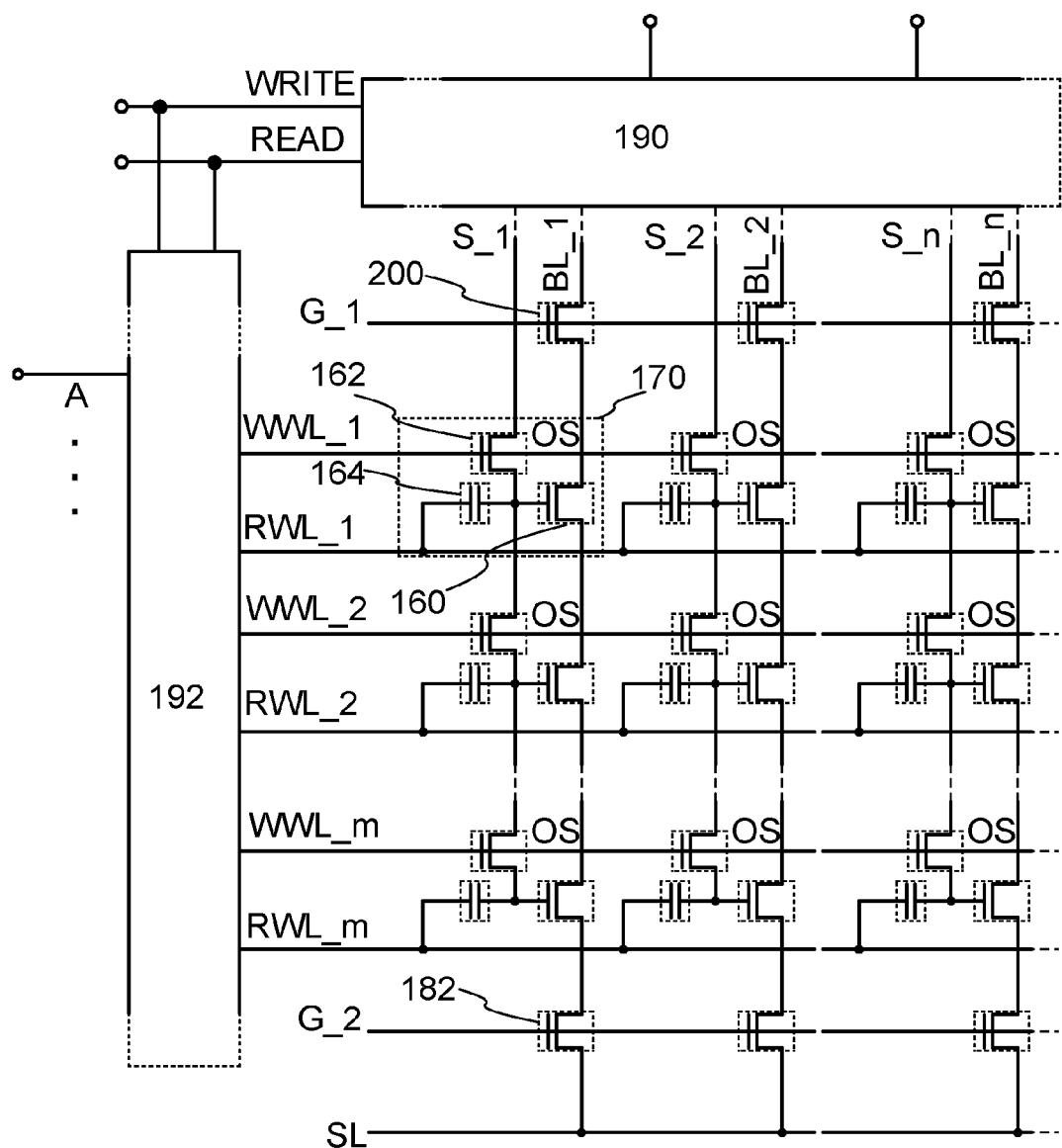
FIG. 10 is a circuit diagram of a semiconductor device.

Here, the potential conversion circuit 200 is connected to the second driver circuit 192 through a wiring VHL and outputs a potential (high potential: VH) higher than a power supply potential VDD to the second driver circuit 192. Note that although the structure in which a wiring WRITE and a wiring READ are connected to the potential conversion circuit 200 is employed in this embodiment so as to convert a potential in accordance with the output of the first driver circuit 190, the disclosed invention is not limited to this structure. For example, as illustrated in FIG. 10, a structure may be employed in which the wiring WRITE is connected to the first driver circuit 190 and the second driver circuit 192, and similarly, the wiring READ is connected to the first driver circuit 190 and the second driver circuit 192.

The first driver circuit 190 and the second driver circuit 192 are connected to each other by the wiring WRITE and the wiring READ. Address selection signal lines A are connected to the second driver circuit 192. The address selection signal lines A are wirings that transmit a signal for selecting a row address of the memory cell 170.

The signal lines S in FIG. 7A are electrically connected to the source electrodes (or the drain electrodes) of the transistors 162 of the memory cells 170 in the first row, and the bit lines BL are electrically connected to the drain electrodes (or the source electrodes) of the transistors 160 of the memory cells 170 in the first row through the selection transistors 180. The source line SL is electrically connected to the source electrode (or the drain electrode) of the transistor 160 of the memory cell 170 in the m-th row through the selection transistor 182. Note that only the memory cells 170 in the first row are directly connected to the bit lines BL, and only the memory cells 170 in the m-th row are directly connected to the source line SL.

As for the memory cells 170 in other rows, for example, drain electrodes (or source electrodes) of the transistors 160 of the memory cells 170 in the k-th row (k is a natural number greater than or equal to 2 and smaller than or equal to (m−1)) are electrically connected to source electrodes (or drain electrodes) of the transistors 160 of the memory cells 170 in the (k−1)-th row, source electrodes (or drain electrodes) of the transistors 162 of the memory cells 170 in the k-th row (k is a natural number greater than or equal to 2 and smaller than or equal to (m−1)) are electrically connected to gate electrodes of the transistors 160 of the memory cells 170 in the (k−1)-th row, drain electrodes (or source electrodes) of the transistors 162 of the memory cells 170 in the (k−1)-th row, and one electrode of the capacitors 164 of the memory cells 170 in (k−1)-th row.

The write word lines in the k-th row WWL_k are electrically connected to the gate electrodes of the transistors 162 of the memory cells 170 in the k-th row. The read lines in the k-th row RWL_k are electrically connected to the other electrodes of the capacitors 164 of the memory cells 170 in the k-th row.

In other words, the drain electrodes of the transistors 160 of the memory cells 170 in the k-th row are connected to the source electrodes of the transistors 160 of the adjacent memory cells 170, and the source electrodes thereof are connected to the drain electrodes of the transistors 160 of the adjacent memory cells 170. The source electrodes of the transistors 162 of the memory cells 170 in the k-th row are connected to the drain electrodes of the transistors 162 of the adjacent memory cells 170, and the drain electrodes thereof are connected to the source electrodes of the transistors 162 of the adjacent memory cells 170. That is, the plurality of the memory cells 170 are connected in series in the column direction.

In addition, in the memory cells 170 in the k-th row, the gate electrodes of the transistors 160, the drain electrodes (or the source electrodes) of the transistors 162, and the one electrodes of the capacitors 164 are electrically connected and form nodes FG_k of the memory cells in the k-th row. That is, in the semiconductor device illustrated in FIGS. 7A and 7B, the nodes FG_(k−1) in the memory cells 170 in the (k−1)-th row have the structure in FIG. 1A-1, and in addition, are electrically connected to the source electrodes of the transistors 162 in the memory cells 170 in the k-th row.

Here, the transistor 162 including an oxide semiconductor in each of the memory cells in the k-th row and each of the memory cells in the (k−1)-th row has significantly small off-state current; thus, in the semiconductor device illustrated in FIGS. 7A and 7B, the potential of the node FG can be held for a long time by turning off the transistor 162 as in the semiconductor device illustrated in FIG. 1A-1.

In the case where the transistors 162 of the memory cells 170 are connected in series as described above, the transistors 162 of the adjacent memory cells can share a source electrode or a drain electrode; thus, it is easier to decrease the area occupied by the memory cells 170 as compared to the case where the transistors 162 of the memory cells 170 are connected in parallel. For example, given that the minimum feature size is F, the area occupied by the memory cells 170 can be approximately $4F^2$ to $12F^2$. Accordingly, the degree of integration of the semiconductor device can be increased with performance of each element maintained, and the storage capacity per unit area can be increased.

Since the memory cells 170 are connected in series, the node FG of one of the memory cells 170 is connected to the node FG of the adjacent memory cell 170 through the transistor 162. Therefore, by writing data "0" to the memory cells 170 in the row which is farthest from the bit lines BL, data "0" can be also written to memory cells between the bit lines BL and the memory cells 170 in the row which is farthest from the bit lines BL. Thus, efficiency of writing data can be increased and power consumption can be further reduced. With high-efficiency, high-speed operation of the semiconductor device can be realized.

Figure 8:
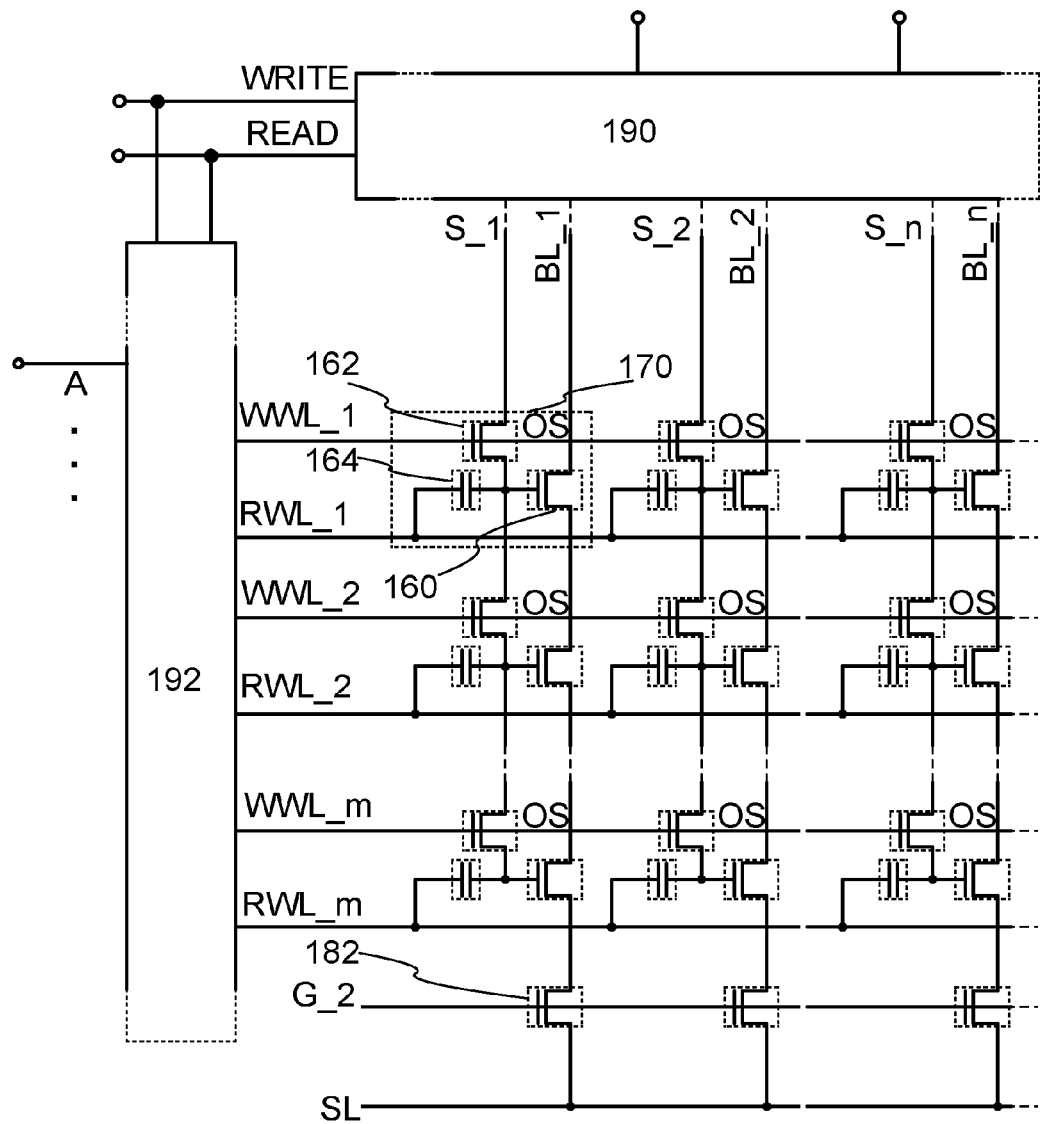
FIG. 8 is a circuit diagram of a semiconductor device.

Note that the selection line G_1, the selection line G_2, the selection transistors 180, and the selection transistors 182 are not necessarily provided. The selection line G_1 and the selection transistors 180 may be omitted. Alternatively, the selection line G_2 and the transistors 182 may be omitted. For example, as illustrated in FIG. 8, a structure which includes only a selection line G_2 corresponding to the selection line G_2 and the selection transistors 182 may be employed.

Figure 9:
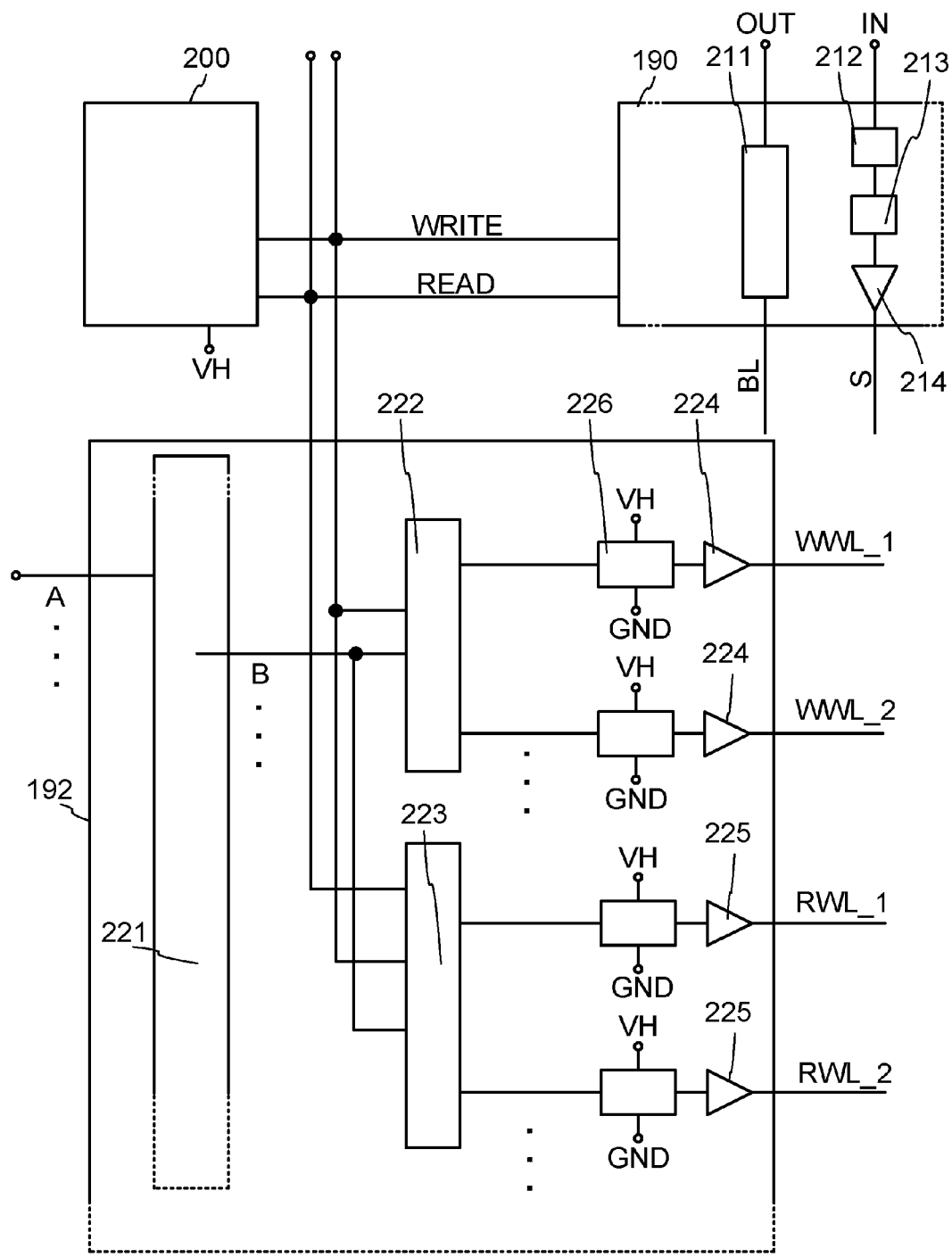
FIG. 9 is a circuit diagram of a semiconductor device.

The first driver circuit 190 and the second driver circuit 192 illustrated in FIG. 7A will be described with reference to FIG. 9. The first driver circuit 190 and the second driver circuit 192 are connected to each other by the wiring WRITE and the wiring READ. In addition, the wiring WRITE and the wiring READ are connected to the potential conversion circuit 200.

The first driver circuit 190 includes a reading circuit 211, a control circuit 212, a delay circuit 213, and a buffer circuit 214. An input terminal IN is connected to the signal line S through the control circuit 212, the delay circuit 213, and the buffer circuit 214. The reading circuit 211 connected to the bit line BL is connected to an output terminal OUT.

The second driver circuit 192 includes a decoder circuit 221, a control circuit 222, a control circuit 223, and a buffer circuit 224, a buffer circuit 225, and a level shift circuit 226. The address selection signal lines A are connected to the decoder circuit 221. Decoder circuit output signal lines B are connected to the control circuit 222 and the control circuit 223. The control circuit 222 is connected to the write word line WWL through the level shift circuit 226 and the buffer circuit 224. The control circuit 223 is connected to the read word line RWL through the level shift circuit 226 and the buffer circuit 225. Note that FIGS. 6A to 6C may be referred to for the reading circuit 211, FIGS. 4A to 4D may be referred to for the delay circuit 213, and FIG. 15 may be referred to for the control circuit 223. Here, GND or VH is output to the write word line WWL. GND or VH is output to the read word line RWL. GND may be output to both the write word line WWL and the read word line RWL. VH may be output to both the write word line WWL and the read word line RWL. A different GND (or VH) may be output to the write word line WWL and the read word line RWL.

Figure 11:
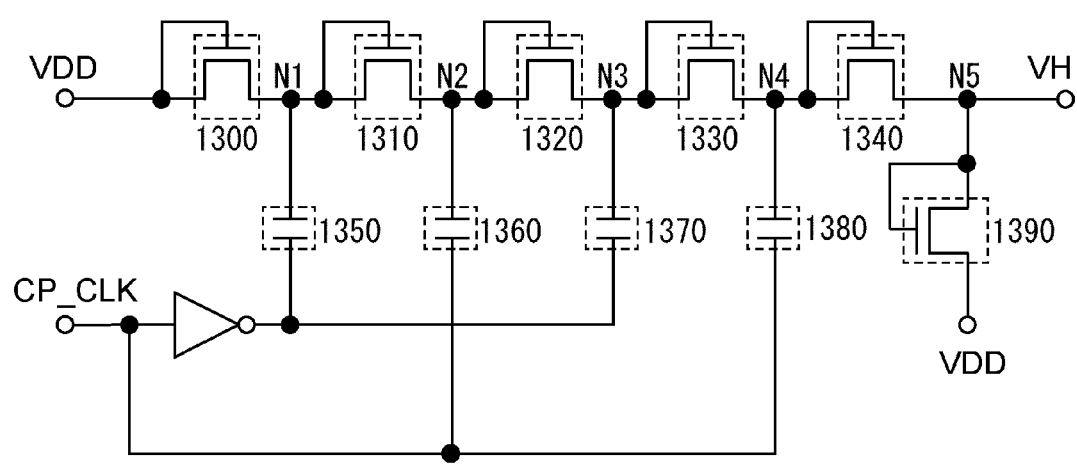
FIG. 11 is a circuit diagram of a semiconductor device.

As an example of the potential conversion circuit 200, an example of a four-stage step-up circuit is illustrated in FIG. 11. In FIG. 11, a power supply potential VDD is supplied to an input terminal (here, referring to a source terminal or a drain terminal which is connected to a gate terminal) of a first transistor 1300. An output terminal (here, referring to the source terminal or the drain terminal which is not connected to the gate terminal) of the first transistor 1300 is connected to an input terminal of a second transistor 1310 and one terminal of a first capacitor 1350. Similarly, an output terminal of the second transistor 1310 is connected to an input terminal of a third transistor 1320 and one terminal of a second capacitor 1360. Connections in the following stages are similar to the above, and therefore, detailed explanation is omitted. However, the connection can be represented as follows: an output terminal of an n-th transistor is connected to one terminal of an n-th capacitor (n: a natural number). In FIG. 11, an output terminal of a transistor of the last stage is connected to a transistor 1390 that is connected to a power source VDD; however, the disclosed invention is not limited to this structure. For example, a structure in which a capacitor connected to a ground potential GND is additionally provided may be employed. Note that in FIG. 11, an output of a fifth transistor 1340 is an output VH of the step-up circuit.

In addition, a clock signal CP_CLK is input to the other terminal of the second capacitor 1360 and the other terminal of a fourth capacitor 1380. A clock signal obtained by inverting the clock signal CP_CLK is input to the other terminal of the first capacitor 1350 and the other terminal of a third capacitor 1370. That is, the clock signal CP_CLK is input to the other terminal of a 2k-th capacitor and the inverted clock signal is input to the other terminal of a (2k−1)-th capacitor (k: a natural number). It is needless to say that the clock signal CP_CLK and the inverted clock signal can be interchanged.

When the clock signal CP_CLK is low, that is, when the inverted clock signal is high, the second capacitor 1360 and the fourth capacitor 1380 are charged, and potentials of a node N1 and a node N3 which are capacitively coupled with the inverted clock signal are raised by a predetermined voltage (a voltage corresponding to a difference between high and low potentials of the clock signal CP_CLK). On the other hand, potentials of a node N2 and a node N4 which are capacitively coupled with the clock signal CP_CLK are dropped by a predetermined voltage.

Accordingly, charge is transferred through the second transistor 1310, and the fourth transistor 1330 and the potentials of the node N2 and the node N4 are raised to a predetermined value.

Next, when the clock signal CP_CLK becomes high and the inverted clock signal becomes low, the potentials of the node N2 and the node N4 are further raised. On the other hand, the potentials of the node N1, and the node N3 are dropped by a predetermined voltage.

Accordingly, charge is transferred through the first transistor 1300, the third transistor 1320, and the fifth transistor 1340, and as a result, the potentials of the node N1, the node N3 and the node N5 are raised to a predetermined potential. Thus, the potentials of the nodes satisfy $V_{N5}=V_{N4(CP\_CLK=High)}>V_{N3(CP\_CLK=Low)}>V_{N2(CP\_CLK=High)}>V_{N1(CP\_CLK=Low)}>V_{dd}$, whereby step-up is performed. Note that the step-up circuit is not limited to a four-stage step-up circuit. The number of stages of the step-up circuit can be changed as appropriate.

Note that with the use of a transistor including an oxide semiconductor with favorable off-state current characteristics as a transistor included in the step-up circuit, the voltage of each node can be held for a longer time.

Next, the level shift circuit 226 (level shifter) provided in the second driver circuit 192 will be described.

Figure 12:
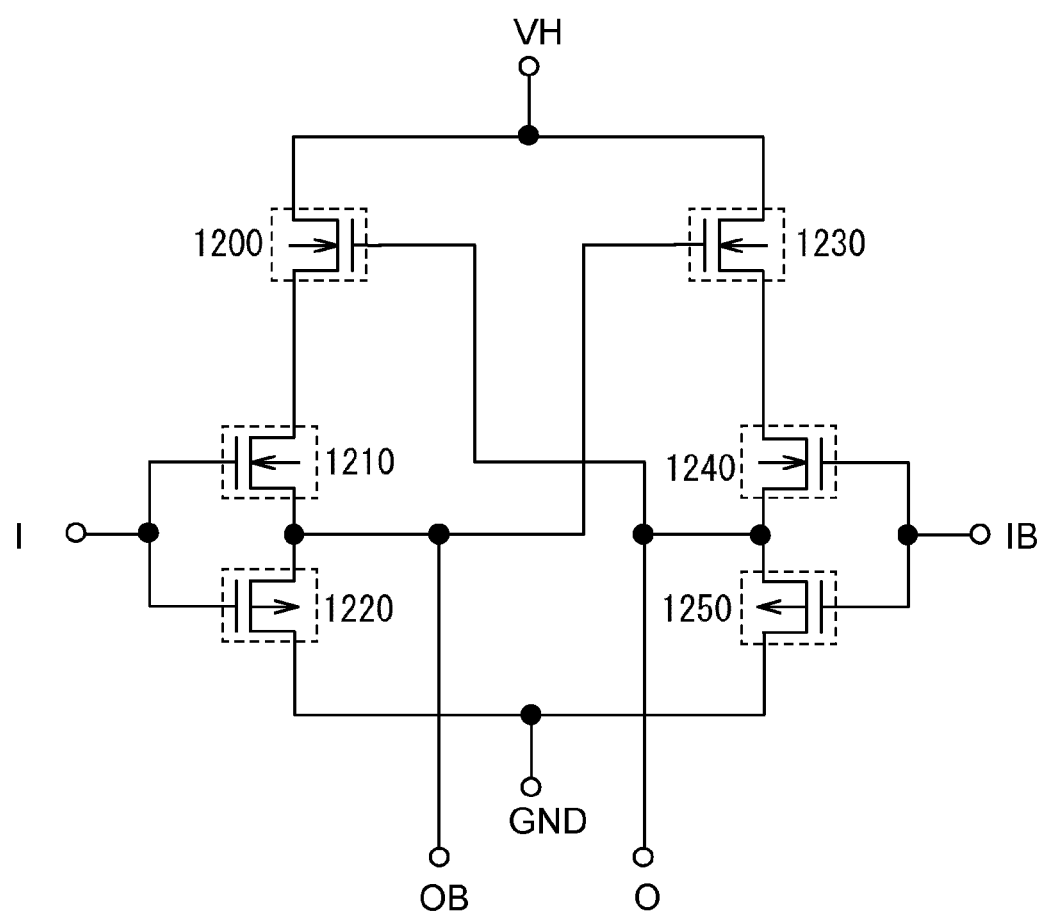
FIG. 12 is a circuit diagram of a semiconductor device.
Figure 13:
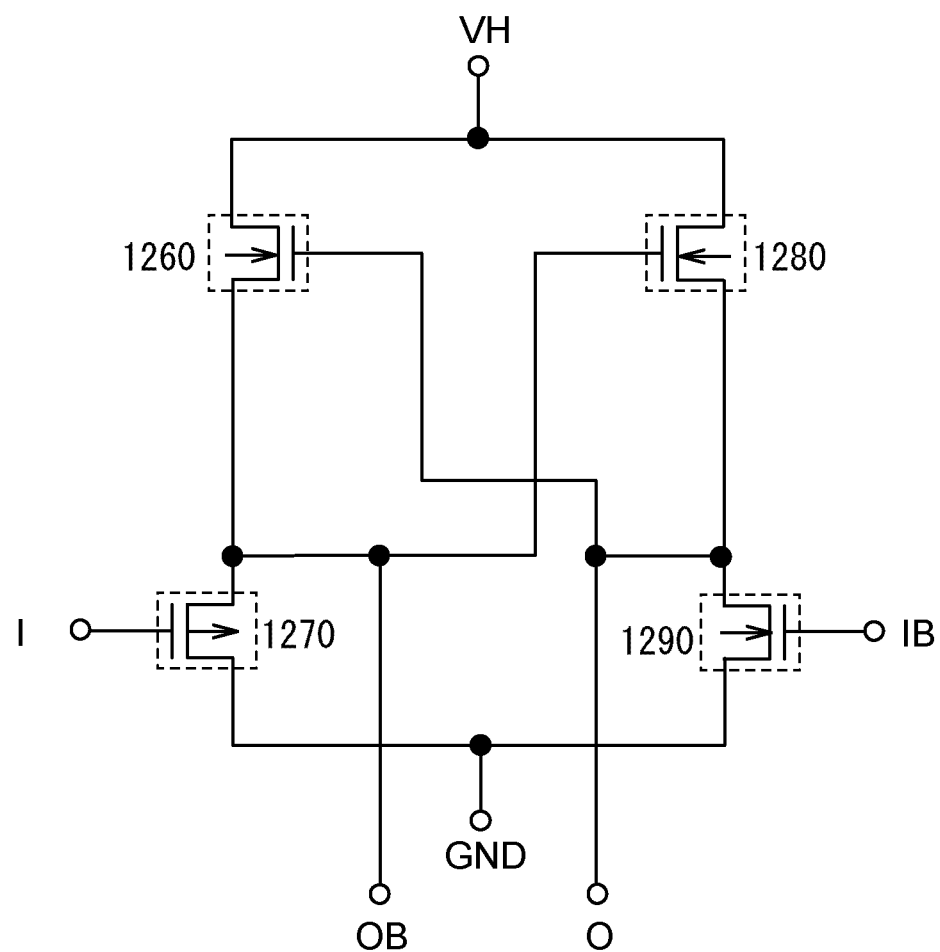
FIG. 13 is a circuit diagram of a semiconductor device.

FIG. 12 and FIG. 13 each illustrate an example of a diagram of a step-up level shift circuit. The level shifter illustrated in FIG. 12 has the following structure. A source terminal of a first p-type transistor 1200 and a source terminal of a third p-type transistor 1230 are both electrically connected to a power source which supplies a potential VH. A drain terminal of the first p-type transistor 1200 is electrically connected to a source terminal of a second p-type transistor 1210, and a drain terminal of the third p-type transistor 1230 is electrically connected to a source terminal of a fourth p-type transistor 1240. A drain terminal of the second p-type transistor 1210 is electrically connected to a drain terminal of a first n-type transistor 1220 and a gate terminal of the third p-type transistor 1230, and a drain terminal of the fourth p-type transistor 1240 is electrically connected to a drain terminal of a second n-type transistor 1250 and a gate terminal of the first p-type transistor 1200. GND (=0 [V]) is supplied to both a source terminal of the first n-type transistor 1220 and a source terminal of the second n-type transistor 1250.

In FIG. 12, an input signal (I) is input to a gate terminal of the second p-type transistor 1210 and a gate terminal of the first n-type transistor 1220, and an inverted signal (IB) of the input signal is input to a gate terminal of the fourth p-type transistor 1240 and a gate terminal of the second n-type transistor 1250. An output signal (O) is taken out from the drain terminal of the fourth p-type transistor 1240. In addition, an inverted signal (OB) of the output signal can be taken out from the drain terminal of the second p-type transistor 1210.

A basic operation of the level shifter illustrated in FIG. 12 will be described. When the input signal (I) is high, the first n-type transistor 1220 is turned on. Thus, the potential GND is input to the gate terminal of the third p-type transistor 1230 and the third p-type transistor 1230 is turned on. In addition, the inverted signal (OB) of the output signal is low, and the potential at this time is GND. On the other hand, at that time, the inverted signal (IB) of the input signal is low. Thus, the fourth p-type transistor 1240 is turned on and the second n-type transistor 1250 is turned off. At that time, both the third p-type transistor 1230 and the fourth p-type transistor 1240 are turned on. Thus, the output signal (O) is high, and at that time, the potential is VH.

When the potential of the input signal (I) is low, the operation can be understood in a manner similar to the above because the level shifter illustrated in FIG. 12 has a symmetric structure; the output signal (O) is low, and at that time, the potential is GND.

In this manner, the output signal (O) whose amplitude is converted with respect to the input signal can be obtained.

FIG. 13 illustrates an example of a circuit diagram of a step-up level shift circuit which is different from that in FIG. 12. A structure of the level shifter illustrated in FIG. 13 is as follows. A source terminal of a first p-type transistor 1260 and a source terminal of a second p-type transistor 1280 are both electrically connected to a power source which supplies a potential VH. A drain terminal of a first n-type transistor 1270 is electrically connected to a drain terminal of the first p-type transistor 1260 and a gate terminal of the second p-type transistor 1280, and a drain terminal of a second n-type transistor 1290 is electrically connected to a drain terminal of the second p-type transistor 1280 and a gate terminal of the first p-type transistor 1260. GND (=0 V) is supplied to both a source terminal of the first n-type transistor 1270 and a source terminal of the second n-type transistor 1290.

In FIG. 13, an input signal (I) is input to a gate terminal of the first n-type transistor 1270, and an inverted signal (IB) of the input signal is input to a gate terminal of the second n-type transistor 1290. An output signal (O) is taken out from the drain terminal of the second n-type transistor 1290. In addition, an inverted signal (OB) of the output signal can be taken out from the drain terminal of the first n-type transistor 1270.

A basic operation of the level shifter illustrated in FIG. 8 will be described. When the input signal (I) is high, the first n-type transistor 1270 is turned on. Thus, the potential GND is input to the gate terminal of the second p-type transistor 1280 and the second p-type transistor is turned on. In addition, the inverted signal (OB) of the output signal is low, and the potential at this time is GND. On the other hand, at that time, the inverted signal (IB) of the input signal is low. Thus, the second n-type transistor 1290 is turned off. At that time, the second p-type transistor 1280 is turned on. Thus, the output signal (O) is high, and at that time, the potential is VH.

When the potential of the input signal (I) is low, the operation can be understood in a manner similar to the above because the level shifter illustrated in FIG. 13 has a symmetric structure; the output signal (O) is low, and at that time, the potential is GND.

In this manner, the output signal (O) whose amplitude is converted with respect to the input signal can be obtained.

A high potential converted in the potential conversion circuit 200 illustrated in FIG. 11 is output to the memory cells 170 through the write word lines WWL and to the memory cells 170 through the read word line RWL with the use of the step-up level shifter illustrated in FIG. 12 or FIG. 13 and included in the second driver circuit 192. Furthermore, a structure in which a high potential converted in the potential conversion circuit 200 is output to the memory cells 170 through the signal lines S with the use of a step-up level shifter included in the first driver circuit 190 may be employed.

Since data writing, holding, and reading are basically similar to the case of FIGS. 1A-1, 1A-2 and 1B, detailed description is not repeated. Note that data writing is performed at least for each row, and is performed sequentially for rows in the structure.

Figure 14:
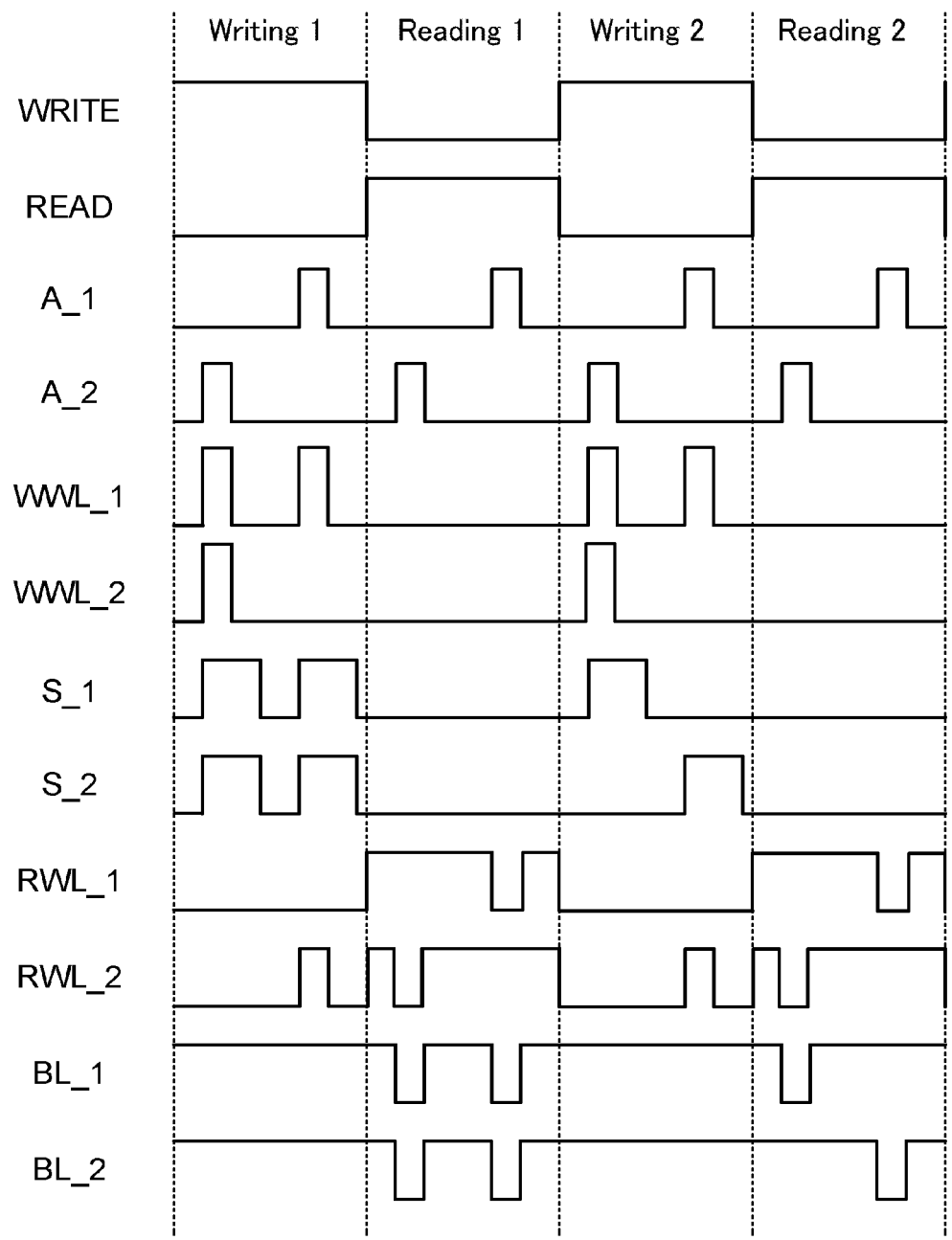
FIG. 14 is a timing chart.

FIG. 14 is an example of a timing chart for more detailed operations of the semiconductor device in FIG. 7A. READ, A, and the like in the timing chart denote the lines to which the potentials in the timing chart are applied. Lines having a similar function are distinguished by "_1", "_2", and the like added to the end of their names. Note that for the sake of simplicity, the semiconductor device described here is an example where the memory cells 170 are arranged in 2 (rows)×2 (columns), but the disclosed invention is not limited to this example.

The timing chart in FIG. 14 shows the relationship among the potentials of the lines in the case where data "1" is written to all the memory cells (Writing 1), then the written data in all the memory cells is read out (Reading 1), then data "1" is written to the memory cells in the first row and the first column and in the second row and the second column while data "0" is written to the memory cells in the first row and the second column and in the second row and the first column (Writing 2), and then the written data in all the memory cells is read out (Reading 2).

In Writing 1, WRITE is set at a high potential and READ is set at a low potential so that data can be written to the memory cells. The second driver circuit 192 outputs a row selection signal to RWL and WWL in accordance with the potentials of A_1 and A_2. Here, in the case where A_1 is at a high potential, the first row is selected, and in the case where A_2 is at a high potential, the second row is selected. The WWL of a selected row is at a high potential. The WWL of from the memory cells in the selected row to the memory cells in unselected rows which are connected to the driver circuit 190 are at a high potential. The WWL of the memory cells in the unselected rows, among from the memory cells in the selected row to the memory cells connected to the driver circuit 190, are at a high potential. The WWL of the memory cells in the unselected rows, among from the memory cells in the selected row to the memory cells in the side opposite to the driver circuit 190, are at a low potential. In addition, RWL of the selected row is at a low potential. The RWL of the memory cells in the unselected rows, among from the memory cells in the selected row to the memory cells connected to the driver circuit 190, are at a low potential. The RWL of the memory cells in the unselected rows, among from the memory cells in the selected row to the memory cells in the side opposite to the driver circuit 190, are at a high potential.

Since the transistors 162 in the memory cells are connected in series, when the RWL of the memory cells in the unselected rows, among from the memory cells in the selected row to the memory cells connected to the driver circuit 190, are at a high potential, the transistors 160 in the memory cells in the unselected rows, among from the memory cells in the selected row to the memory cells in the side opposite to the driver circuit 190, are turned on.

In other words, in the case where the first row is selected, RWL_1 is at a low potential and RWL_2 is at a high potential. In the case where the second row is selected, both RWL_1 and RWL_2 are at a low potential. In the case where the first row is selected, RWL_2 is at a high potential, whereby the transistors 160 of the memory cells in the unselected row (in this case, the second row) are turned on. Accordingly, the potential of the source line SL of the transistor 160 in the memory cell in the selected row (in this case, the first row) is fixed. As a result, the potential of the floating gate FG_1 in the selected row (in this case, the first row) is lowered in accordance with the falling of the WWL. However, since the potential of the source line SL of the transistor 160 of the memory cell in the selected row (in this case, the first row) is fixed, a reduction in the potential of the floating gate FG_1 can be suppressed.

In Writing 1, data "1" is written to all the memory cells; therefore, S_1 and S_2 are set to a high potential in accordance with the timing of row selection. Note that the period for signal input to S_1 and S_2 is set longer than the period for signal input to WWL. Alternatively, the signal input to S_1 and S_2 is delayed relative to the signal input to WWL. This is because there is a possibility that writing to memory cells may be insufficient if the period for signal input to S_1 and S_2 is short or the signal input to S_1 and S_2 is earlier than the signal input to WWL. Note that the potentials of BL_1 and BL_2 are not a big problem at the time of writing (the potentials may be either a high potential or a low potential).

In Reading 1, WRITE is set at a low potential and READ is set at high potential so that data can be read from the memory cell. The second driver circuit 192 outputs a row selection signal to RWL and WWL in accordance with the potentials of A_1 and A_2. Here, in the case where A_1 is at a high potential, the first row is selected, and in the case where A_2 is at a high potential, the second row is selected. In addition, RWL of a selected row is at a low potential, RWL of an unselected row is at a high potential, and WWL is at a low potential regardless of whether it is in a selected row or not.

By the above operation, potentials in accordance with data held by memory cells in a selected row are supplied to BL_1 and BL_2. Note that the potentials of S_1 and S_2 are not a problem at the time of reading.

The relationship among the potentials of the lines in Writing 2 is similar to that in Writing 1. Note that S_1 and S_2 are set to high potential or low potential in accordance with the timing of row selection in order to write data "1" to the memory cells in the first row and the first column and in the second row and the second column and in order to write data "0" to the memory cells in the first row and the second column and in the second row and the first column.

The relationship among the potentials of the lines in Reading 2 is similar to that in Reading 1. It is confirmed that the potential corresponding to the data held in the memory cells in the selected row is applied to BL_1 and BL_2.

With the above structure, the transistors 160 in the memory cells in the unselected rows, among from the memory cells in the row which is selected in writing to the memory cells in the side opposite to the driver circuit 190, are turned on, whereby the potential of the source line SL of the transistor 160 in the memory cell to which data is written can be fixed. Therefore, a reduction in the potential of the floating gate can be prevented, so that stable potential can be written. In addition, since the transistor 160 in the memory cell which is far from the bit line BL can be turned on in writing, data of a block including all these memory cells can be written and erased easily at a time. Thus, high-speed operation of the semiconductor device can be realized more stably.

Examples of each of writing operation and reading operation of the semiconductor device in FIG. 7A will be described with reference to FIGS. 16A and 16B. L, H, and the like in FIGS. 16A and 16B denote a condition of a potential of the read word line RWL, for example, the case where a high potential is applied is denoted by H (high) and the case where a low potential is applied is denoted by L (low). Note that for the sake of simplicity, the semiconductor device described here is an example where the memory cells 170 are arranged in 4 (rows)×4 (columns), but the disclosed invention is not limited to this example.

As shown in FIG. 16A, in the writing operation, in the case where data is written in the fourth row, RWL_1, RWL_2, RWL_3, and RWL_4 are set to L (low potential). Further, in the case where data is written in the third row, RWL_1, RWL_2, and RWL_3 are set to L (low potential) and RWL_4 is set to H (high potential). In the case where data is written in the second row, RWL_1 and RWL_2 are set to L (low potential) and RWL_3 and RWL_4 are set to H (high potential). In the case where data is written in the first row, RWL_1 is set to L (low potential) and RWL_2, RWL_3, and RWL_4 are set to H (high potential).

As shown in FIG. 16B, in the reading operation, in the case where data is read in the fourth row, RWL_1, RWL_2, RWL_3 are set to H (high potential) and RWL_4 is set to L (low potential). Further, in the case where data is read in the third row, RWL_1 and RWL_2 are set to H (high potential), RWL_3 is set to L (low potential), and RWL_4 is set to H (high potential). In the case where data is written in the second row, RWL_1 is set to H (high potential), RWL_2 is set to L (low potential), and RWL_3 and RWL_4 are set to H (high potential). In the case where data is read in the first row, RWL_1 is set to L (low potential) and RWL_2, RWL_3, and RWL_4 are set to H (high potential).

In the semiconductor device having the above structure, an effect in writing becomes more pronounced in accordance with the increase of the number of the memory cells. In writing, RML of the memory cells in the selected row and the memory cells in the unselected row, among from the memory cells in the selected row to the memory cells connected to the driver circuit 190, are at a low potential, and RML of the memory cells in the unselected row, among from the memory cells in the selected row to the memory cells in the side opposite to the driver circuit 190, are at a high potential. Since the transistors 160 in the memory cells are connected in series, the RWL of the memory cells in the unselected row, among from the memory cells in the selected row to the memory cells in the side opposite to the driver circuit 190, are at a high potential, whereby the transistors 160 of the memory cells in unselected rows, among from the memory cells in the selected row to the memory cells in the side opposite to the driver circuit 190, are turned on. Accordingly, the potential of the source line SL of the transistor 160 in the memory cell in the selected row is fixed. As a result, the potential of the floating gate FG_(the selected row) in the selected row is lowered in accordance with the falling of the WWL. However, since the potential of the source line SL of the transistor 160 of the memory cell in the selected row is fixed, a reduction in the potential of the floating gate FG_(the selected row) can be suppressed.

Since the memory cells are connected in series in the semiconductor device, potential of the floating gate can be further stabilized without depending on the number of the floating gates. Therefore, problems such as unstable operation of the semiconductor device and extremely difficult output control which are caused in accordance with the increase of the floating gate having unstable potential do not occur at all. Accordingly, reliability of the semiconductor device as a whole can be greatly improved.

The methods and structures described in this embodiment can be combined as appropriate with any of the methods and structures described in the other embodiments.

Embodiment 2

In this embodiment, a structure and a manufacturing method of a semiconductor device according to one embodiment of the disclosed invention will be described with reference to FIGS. 18A to 18G, FIGS. 19A to 19E, FIGS. 20A to 20D, FIGS. 21A to 21D, and FIGS. 22A to 22C.

<Cross-Sectional Structure and Planar Structure of Semiconductor Device>

Figure 17A:
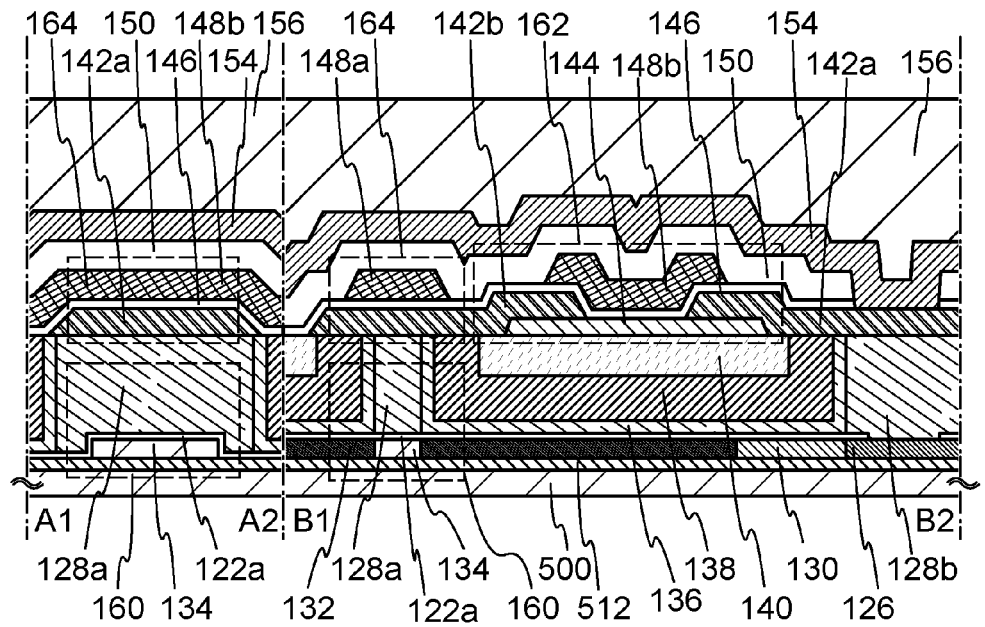
FIG. 17A is a cross-sectional view and FIG. 17B is a plan view of a semiconductor device.
Figure 17B:
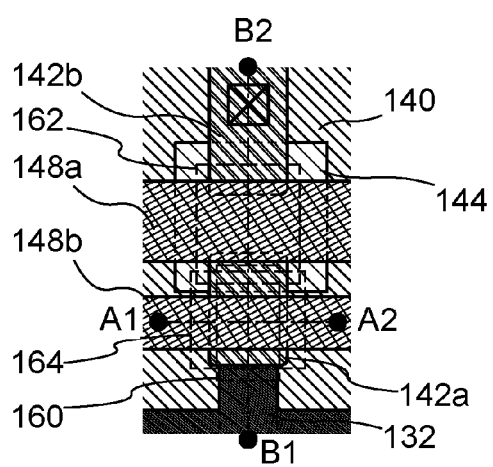

FIGS. 17A and 17B illustrate an example of a structure of a semiconductor device. FIG. 17A illustrates a cross section of the semiconductor device, and FIG. 17B illustrates a plan view of the semiconductor device. Here, FIG. 17A corresponds to a cross section along line A1-A2 and line B1-B2 in FIG. 17B. The semiconductor device illustrated in FIGS. 17A and 17B includes, in a lower portion, a transistor 160 including a first semiconductor material, and in an upper portion, a transistor 162 including a second semiconductor material. It is preferable that the first semiconductor material and the second semiconductor material be different from each other, here. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, gallium arsenide, or the like and is preferably single crystalline semiconductor. A transistor including such a semiconductor material other than an oxide semiconductor can operate at high speed easily. On the other hand, a transistor including an oxide semiconductor can hold charge for a long time owing to its characteristics. The semiconductor device illustrated in FIGS. 17A and 17B can be used as a memory cell.

Although all the transistors are n-channel transistors here, it is needless to say that p-channel transistors can be used. Further, the technical feature of the invention disclosed herein lies in the use of a semiconductor material with which off-state current can be sufficiently reduced, such as an oxide semiconductor, in the transistor 162 in order to hold data. Therefore, it is not necessary to limit specific conditions, such as a material, a structure, or the like of the semiconductor device, to those given here.

The transistor 160 in FIGS. 17A and 17B includes a channel formation region 134 provided in a semiconductor layer over a semiconductor substrate 500, impurity regions 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". That is, in this specification, the term "source electrode" may include a source region.

Further, a conductive layer 128b is connected to an impurity region 126 provided in the semiconductor layer over the semiconductor substrate 500. Here, the conductive layer 128b functions as a source electrode or a drain electrode of the transistor 160. In addition, an impurity region 130 is provided between the impurity region 132 and the impurity region 126. Further, an insulating layer 136, an insulating layer 138, and an insulating layer 140 are provided so as to cover the transistor 160. Note that in order to realize higher integration, the transistor 160 preferably have a structure without a sidewall insulating layer as illustrated in FIGS. 17A and 17B. On the other hand, when importance is put on the characteristics of the transistor 160, a sidewall insulating layer may be provided on a side surface of the gate electrode 128a, and the impurity region 132 including regions with a different impurity concentrations may be provided.

The transistor 162 in FIGS. 17A and 17B includes an oxide semiconductor layer 144 provided over an insulating layer 140 and the like, a source electrode (or a drain electrode) 142a and a drain electrode (or a source electrode) 142b electrically connected to the oxide semiconductor layer 144, a gate insulating layer 146 covering the oxide semiconductor layer 144, the source electrode 142a, and the drain electrode 142b, and a gate electrode 148a provided over the gate insulating layer 146 so as to overlap with the oxide semiconductor layer 144.

Here, the oxide semiconductor layer 144 is preferably highly purified by sufficiently removing impurities such as hydrogen or sufficiently supplying oxygen. Specifically, the hydrogen concentration of the oxide semiconductor layer 144 is lower than or equal to $5 \times 10^{19}$ atoms/cm$^3$, preferably lower than or equal to $5\times10^{18}$ atoms/cm$^3$, further preferably lower than or equal to $5\times10^{17}$ atoms/cm$^3$. Note that the hydrogen concentration of the oxide semiconductor layer 144 is measured by secondary ion mass spectroscopy (SIMS). Thus, in the oxide semiconductor layer 144 which is highly purified by sufficiently reducing the hydrogen concentration and in which defect levels in an energy gap due to oxygen deficiency are reduced by sufficiently supplying oxygen, the carrier concentration is lower than $1\times10^{12}$/cm$^3$, preferably lower than $1\times10^{11}$/cm$^3$, further preferably lower than $1.45\times10^{10}$/cm$^3$. For example, the off-state current (per unit channel width (1 µm) here) at room temperature (25° C.) is lower than or equal to 100 zA (1 zA (zeptoampere) is $1\times10^{-21}$ A), preferably lower than or equal to 10 zA. In this manner, by using an oxide semiconductor which is made to be an i-type (intrinsic) oxide semiconductor or a substantially i-type oxide semiconductor, the transistor 162 which has extremely favorable off-state current characteristics can be obtained.

Note that although the transistor 162 in FIGS. 17A and 17B includes the oxide semiconductor layer 144 which is processed into an island shape in order to suppress leakage current between elements which is caused due to miniaturization, a structure which is not processed into an island shape may be employed. In the case where the oxide semiconductor layer is not processed into an island shape, contamination of the oxide semiconductor layer 144 due to etching in the processing can be prevented.

A capacitor 164 in FIGS. 17A and 17B includes the drain electrode 142b, the gate insulating layer 146, and a conductive layer 148b. That is to say, the drain electrode 142b functions as one of electrodes of the capacitor 164, and the conductive layer 148b functions as the other electrode of the capacitor 164. With such a structure, capacitance can be adequately secured. Further, in the capacitor 164, insulating properties between the drain electrode 142b and the conductive layer 148b can be adequately secured when the oxide semiconductor layer 144 and the gate insulating layer 146 are stacked. Further alternatively, the capacitor 164 may be omitted in the case where a capacitor is not needed.

In this embodiment, the transistor 162 and the capacitor 164 are provided so as to overlap with the transistor 160. By employing such a planar layout, high integration is possible. For example, given that the minimum feature size is F, the area occupied by a memory cell can be 15F$^2$ to 25F$^2$.

An insulating layer 150 is provided over the transistor 162 and the capacitor 164. A wiring 154 is provided in an opening formed in the gate insulating layer 146 and the insulating layer 150. The wiring 154 connects one memory cell and another memory cell and corresponds to the bit line BL of the circuit diagram in FIGS. 2A and 2B. The wiring 154 is electrically connected to the impurity region 126 through the source electrode 142a and the conductive layer 128b. The above structure allows a reduction in the number of wirings in comparison with a structure in which the source region or the drain region in the transistor 160 and the source electrode 142a in the transistor 162 are connected to different wirings. Thus, the integration degree of a semiconductor device can be increased.

By providing the conductive layer 128b, a position where the impurity region 126 and the source electrode 142a are connected and a position where the source electrode 142a and the wiring 154 are connected can overlap with each other. With such a planar layout, the element area can be prevented from increasing due to contact regions of the electrodes. In other words, the degree of integration of the semiconductor device can be increased.

<Manufacturing Method of SOI Substrate>

Next, an example of a manufacturing method of an SOI substrate used for manufacturing the above-described semiconductor devices will be described with reference to FIGS. 18A to 18G.

First, a semiconductor substrate 500 is prepared for a base substrate (see FIG. 18A). As the semiconductor substrate 500, a single crystal silicon substrate, a single crystal germanium substrate, or the like can be used. Alternatively, as the semiconductor substrate, a solar grade silicon (SOG-Si) substrate or the like may be used. Further alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

Note that instead of the semiconductor substrate 500, a variety of glass substrates that are used in the electronics industry, such as aluminosilicate glass, aluminoborosilicate glass, and barium borosilicate glass; quartz substrates, ceramic substrates, and sapphire substrates can be used. Further, a ceramic substrate in which silicon nitride and aluminum nitride are its main components and whose coefficient of thermal expansion is close to that of silicon may be used.

A surface of the semiconductor substrate 500 is preferably cleaned in advance. Specifically, the semiconductor substrate 500 is preferably cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), or the like.

Next, a bond substrate is prepared. Here, a single crystal semiconductor substrate 510 is used as the bond substrate (see FIG. 18B). Note that although a substrate whose crystallinity is single crystal is used as the bond substrate here, the crystallinity of the bond substrate is not necessarily limited to single crystal.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to circular, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

An oxide film 512 is formed over a surface of the single crystal semiconductor substrate 510 (see FIG. 18C). Note that in view of removal of contamination, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 512. Dilute hydrofluoric acid and ozone water may be discharged alternately for cleaning.

The oxide film 512 can be formed with, for example, a single layer or a stacked layer of a silicon oxide film, a silicon oxynitride film, and the like. As a method for forming the oxide film 512, a thermal oxidation method, a CVD method, a sputtering method, or the like can be used. When the oxide film 512 is formed by a CVD method, a silicon oxide film is preferably formed using organosilane such as tetraethoxysilane (abbreviation; TEOS: chemical formula $Si(OC_2H_5)_4$) so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which a halogen is added.

For example, thermal oxidation treatment of the single crystal semiconductor substrate 510 is performed in an oxidizing atmosphere to which chlorine (Cl) is added, whereby the oxide film 512 which is chlorine oxidized can be formed. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 510 can be reduced.

Note that the halogen atoms contained in the oxide film 512 are not limited to chlorine atoms. A fluorine atom may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Next, ions are accelerated by an electric field, irradiated to the single crystal semiconductor substrate 510, and added, whereby an embrittled region 514 where the crystal structure is damaged is formed in the single crystal semiconductor substrate 510 at a predetermined depth (see FIG. 18D).

The depth at which the embrittled region 514 is formed can be adjusted by the kinetic energy of the ions, mass and charge of the ions, or incidence angle of the ions, or the like. The embrittled region 514 is formed at approximately the same depth as the average penetration depth of the ions. Therefore, the thickness of the single crystal semiconductor layer to be separated from the single crystal semiconductor substrate 510 can be adjusted with the depth at which the ions are added. For example, the average penetration depth may be controlled such that the thickness of a single crystal semiconductor layer is approximately greater than or equal to 10 nm and less than or equal to 500 nm, preferably, greater than or equal to 50 nm and less than or equal to 200 nm.

The ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation apparatus. In the ion-implantation apparatus, mass separation of ion species of plasma is performed and the object to be processed is irradiated with ion species having predetermined masses.

In this embodiment, an example is described in which an ion doping apparatus is used to add hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3^+$ be set 50% or higher (more preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared to the case of performing irradiation with hydrogen and helium in different steps, and surface roughness of a single crystal semiconductor layer to be formed later can be suppressed.

Note that heavy metal may also be added when the embrittled region 514 is formed with the ion doping apparatus; however, the ion irradiation is performed through the oxide film 512 containing halogen atoms, whereby contamination of the single crystal semiconductor substrate 510 due to the heavy metal can be prevented.

Then, the semiconductor substrate 500 and the single crystal semiconductor substrate 510 are disposed to face each other and are made to be closely attached to each other with the oxide film 512 therebetween. As a result, the semiconductor substrate 500 and the single crystal semiconductor substrate 510 are bonded to each other (see FIG. 18E). Note that an oxide film or a nitride film may be formed on the surface of the semiconductor substrate 500 to which the single crystal semiconductor substrate 510 is attached.

When bonding is performed, it is preferable that pressure greater than or equal to $0.001$ $N/cm^2$ and less than or equal to $100$ $N/cm^2$, e.g., a pressure greater than or equal to $1$ $N/cm^2$ and less than or equal to $20$ $N/cm^2$, be applied to one part of the semiconductor substrate 500 or one part of the single crystal semiconductor substrate 510. When the bonding surfaces are made close to each other and disposed in close contact with each other by applying a pressure, a bonding between the semiconductor substrate 500 and the oxide film 512 is generated at the part where the close contact is made, and from that part, the bonding spontaneously spreads to almost the entire area. This bonding is performed under the action of the Van der Waals force or hydrogen bonding and can be performed at room temperature.

Note that before the single crystal semiconductor substrate 510 and the semiconductor substrate 500 are bonded to each other, surfaces to be bonded to each other are preferably subjected to surface treatment. Surface treatment can improve the bonding strength at the interface between the single crystal semiconductor substrate 510 and the semiconductor substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (for example, a temperature higher than or equal to room temperature and lower than $400°$ C.). Bonding of the semiconductor substrate 500 and the oxide film 512 may be performed while heating them at a temperature in this range. The heat treatment can be performed using a diffusion furnace, a heating furnace such as a resistance heating furnace, a rapid thermal annealing (RTA)

apparatus, a microwave heating apparatus, or the like. The above temperature condition is merely an example, and an embodiment of the disclosed invention should not be construed as being limited to this example.

Next, heat treatment is performed for separation of the single crystal semiconductor substrate 510 at the embrittled region, whereby a single crystal semiconductor layer 516 is formed over the semiconductor substrate 500 with the oxide film 512 interposed therebetween (FIG. 18F).

Note that it is desirable that the temperature for heat treatment in the separation be as low as possible. This is because as the temperature in the separation is low, generation of roughness on the surface of the single crystal semiconductor layer 516 can be suppressed. Specifically, the temperature for the heat treatment in the separation may be higher than or equal to 300° C. and lower than or equal to 600° C. and the heat treatment is more effective when the temperature is higher than or equal to 400° C. and lower than or equal to 500° C.

Note that after the single crystal semiconductor substrate 510 is separated, the single crystal semiconductor layer 516 may be subjected to heat treatment at 500° C. or higher so that concentration of hydrogen remaining in the single crystal semiconductor layer 516 is reduced.

Next, the surface of the single crystal semiconductor layer 516 is irradiated with laser light, whereby a single crystal semiconductor layer 518 whose surface planarity is improved and in which defects is reduced are formed (see FIG. 18G). Note that instead of the laser light irradiation treatment, heat treatment may be performed.

Although the irradiation treatment with the laser light is performed immediately after the heat treatment for separation of the single crystal semiconductor layer 516 in this embodiment, one embodiment of the present invention is not construed as being limited to this. The laser light irradiation treatment may be performed after the heat treatment for splitting the single crystal semiconductor layer 516 and etching treatment for removing a region including many defects at the surface of the single crystal semiconductor layer 516 are performed in this order. Alternatively, the laser light irradiation treatment may be performed after the surface planarity of the single crystal semiconductor layer 516 is improved. Note that the etching treatment may be either wet etching or dry etching. Further, after the irradiation with laser light is performed as described above, a step of reducing the thickness of the single crystal semiconductor layer 516 may be performed. In order to reduce the thickness of the single crystal semiconductor layer 516, either or both of dry etching and wet etching may be employed.

Through the above steps, an SOI substrate including the single crystal semiconductor layer 518 with favorable characteristics can be obtained (see FIG. 18G).

<Method for Manufacturing Semiconductor Device>

Next, a method for manufacturing a semiconductor device including the SOI substrate described above will be described with reference to FIGS. 19A to 19E, FIGS. 20A to 20D, FIGS. 21A to 21D, and FIGS. 22A to 22C.

<Method for Manufacturing Lower Transistor>

First, a method for manufacturing the transistor 160 in the lower portion will be described with reference to FIGS. 19A to 19E and FIGS. 20A to 20D. Note that FIGS. 19A to 19E and FIGS. 20A to 20D show part of the SOI substrate formed by the method shown in FIGS. 18A to 18G, and are cross-sectional views showing manufacturing process of the transistor in the lower portion shown in FIG. 17A.

Figure 19A:
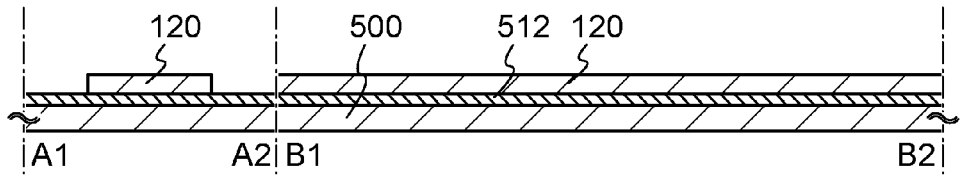
FIGS. 19A to 19E are cross-sectional views of a semiconductor device.

First, the single crystal semiconductor layer 518 is patterned to have an island shape, so that a semiconductor layer 120 is formed (see FIG. 19A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Figure 19B:
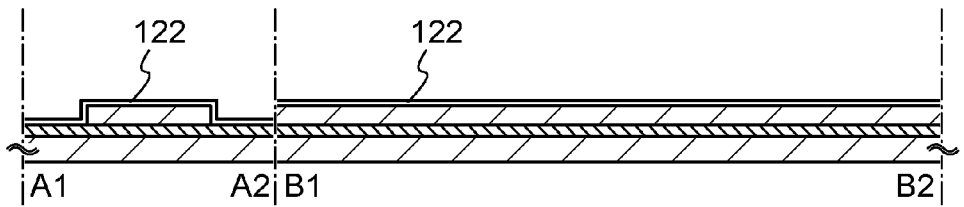

Next, an insulating layer 122 is formed so as to cover the semiconductor layer 120 (see FIG. 19B). The insulating layer 122 is to be a gate insulating layer later. For example, the insulating layer 122 can be formed by performing heat treatment (e.g., thermal oxidation treatment, thermal nitridation treatment, or the like) on a surface of the semiconductor layer 120. High-density plasma treatment may be employed instead of heat treatment. The high-density plasma treatment can be performed using, for example, a mixed gas of a rare gas such as He, Ar, Kr, or Xe and any of oxygen, nitrogen oxide, ammonia, nitrogen, or hydrogen. Needless to say, the insulating layer may be formed by a CVD method, a sputtering method, or the like. The insulating layer 122 preferably has a single-layer structure or a stacked structure including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), and the like. The thickness of the insulating layer can be, for example, greater than or equal to 1 nm and less than or equal to 100 nm, preferably greater than or equal to 10 nm and less than or equal to 50 nm. Here, a single layer of an insulating layer containing silicon oxide is formed by a plasma CVD method.

Figure 19C:
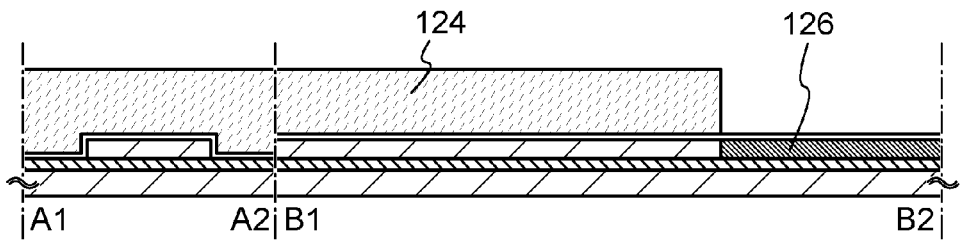

Next, a mask 124 is formed over the insulating layer 122 and an impurity element imparting one conductivity type is added to the semiconductor layer 120, so that the impurity region 126 is formed (see FIG. 19C). Note that here, the mask 124 is removed after the impurity element is added.

Figure 19D:
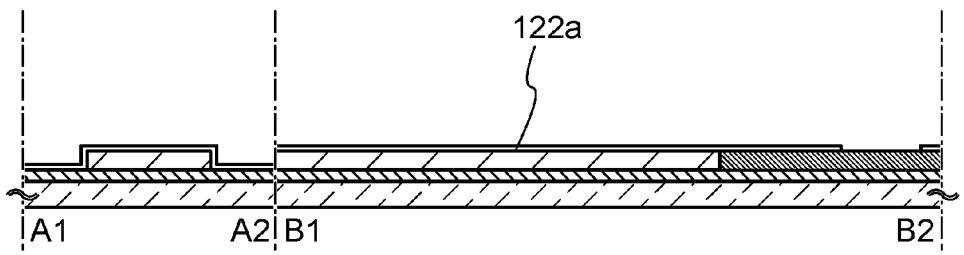

Next, a mask is formed over the insulating layer 122 and a region of the insulating layer 122 that overlaps with the impurity region 126 is partly removed, so that the gate insulating layer 122a is formed (see FIG. 19D). Part of the insulating layer 122 can be removed by etching such as wet etching or dry etching.

Figure 19E:
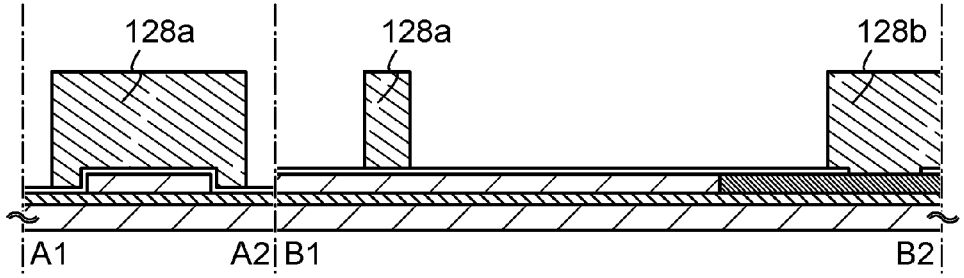

Next, a conductive layer for forming a gate electrode (including a wiring formed using the same layer as the gate electrode) is formed over the gate insulating layer 122a and is processed, so that the gate electrode 128a and the conductive layer 128b are formed (see FIG. 19E).

The conductive layer used for the gate electrode 128a and the conductive layer 128b can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be employed. The conductive layer may be processed by etching using a resist mask.

Figure 20A:
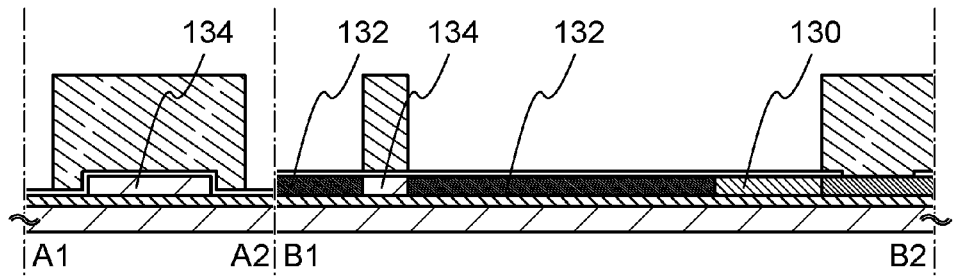
FIGS. 20A to 20D are cross-sectional views of a semiconductor device.

Next, an impurity element imparting one conductivity type is added to the semiconductor layer with the use of the gate electrode 128a and the conductive layer 128b as masks, so that the channel formation region 134, the impurity region 132, and the impurity region 130 are formed (see FIG. 20A).

In the case of forming an n-channel transistor, an impurity element such as phosphorus (P) or arsenic (As) is be added, for example. In the case of forming a p-channel transistor, an impurity element such as boron (B), aluminum (Al), or gallium (Ga) is added. Note that the concentration of the impurity element to be added can be set as appropriate. In addition, after the impurity element is added, heat treatment for activation is performed. Here, the concentration of the impurity element in the impurity region is increased in the following order: the impurity region 126, the impurity region 132, and the impurity region 130.

Figure 20B:
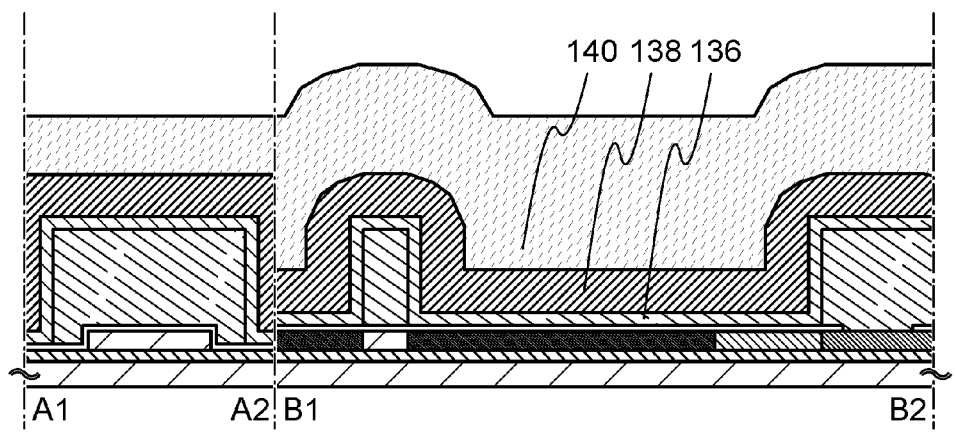

Next, the insulating layer 136, the insulating layer 138, and the insulating layer 140 are formed so as to cover the gate insulating layer 122a, the gate electrode 128a, and the conductive layer 128b (see FIG. 20B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. The insulating layer 136, the insulating layer 138, and the insulating layer 140 are particularly preferably formed using a low dielectric constant (low-k) material, because capacitance due to overlapping electrodes or wirings can be sufficiently reduced. Note that the insulating layer 136, the insulating layer 138, and the insulating layer 140 may be porous insulating layers formed using any of these materials. Since the porous insulating layer has low dielectric constant as compared to a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 will be described. A stacked structure of the insulating layer 136, the insulating layer 138, and the insulating layer 140 is employed here; however, one embodiment of the disclosed invention is not limited to this. A single-layer structure, a stacked structure of two layers, or a stacked structure of four or more layers may also be used.

Figure 20C:
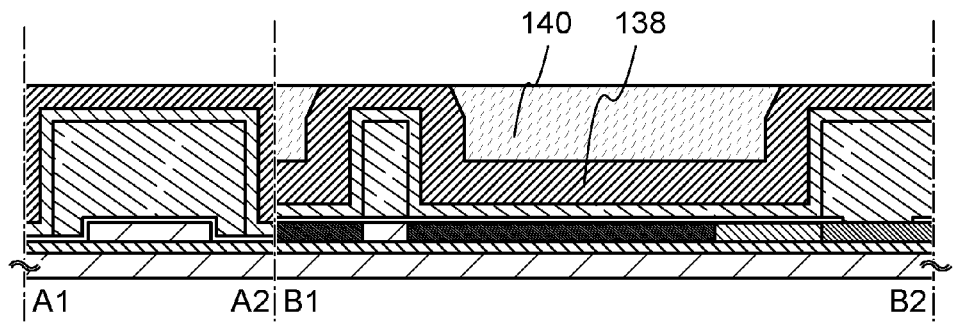

Next, the insulating layer 138 and the insulating layer 140 are subjected to chemical mechanical polishing (CMP) treatment, or etching treatment, so that the insulating layer 138 and the insulating layer 140 are flattened (see FIG. 20C). Here, CMP treatment is performed until the insulating layer 138 is partly exposed. In the case where silicon nitride oxide is used for the insulating layer 138 and silicon oxide is used for the insulating layer 140, the insulating layer 138 functions as an etching stopper.

Figure 20D:
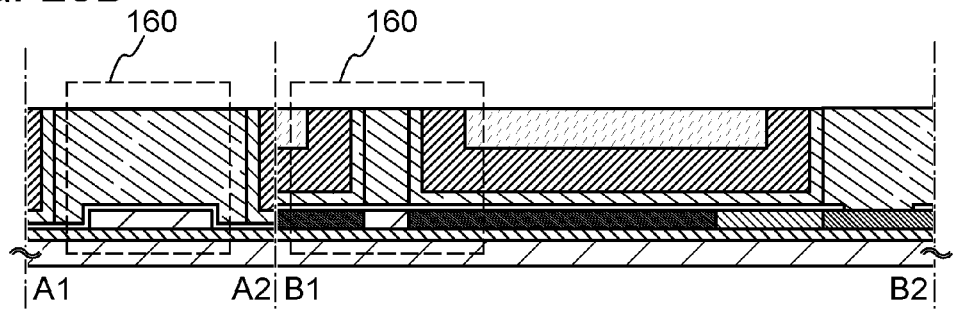

Next, the insulating layer 138 and the insulating layer 140 are subjected to CMP treatment, or etching treatment, so that upper surfaces of the gate electrode 128a and the conductive layer 128b are exposed (see FIG. 20D). Here, etching is performed until the gate electrode 128a and the conductive layer 128b are partly exposed. For the etching treatment, dry etching is preferably performed, but wet etching may be performed. In the step of partly exposing the gate electrode 128a and the conductive layer 128b, in order to improve the characteristics of the transistor 162 which is formed later, the surfaces of the insulating layer 136, the insulating layer 138, and the insulating layer 140 are preferably flattened as much as possible.

Through the above steps, the transistor 160 in the lower portion can be formed (see FIG. 20D).

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, so that a highly-integrated semiconductor device can be provided.

<Manufacturing Method of Transistor in Upper Portion>

Next, a method for manufacturing the transistor 162 in the upper portion will be described with reference to FIGS. 21A to 21D and FIGS. 22A and 22C.

Figure 21A:
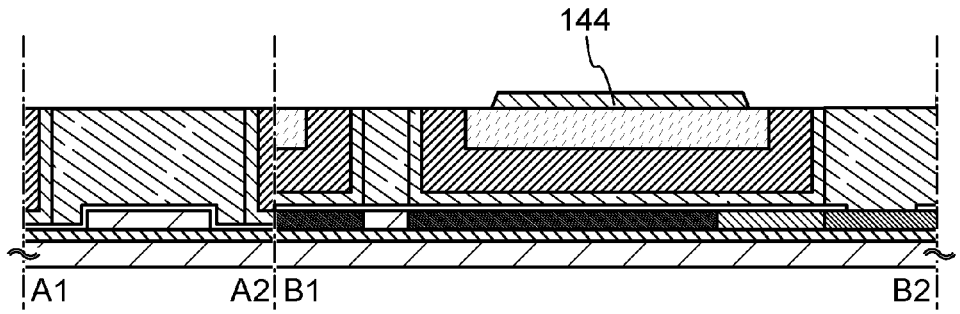
FIGS. 21A to 21D are cross-sectional views of a semiconductor device.

First, an oxide semiconductor layer is formed over the gate electrode 128a, the conductive layer 128b, the insulating layer 136, the insulating layer 138, the insulating layer 140, and the like and is processed, so that the oxide semiconductor layer 144 is formed (see FIG. 21A). Note that an insulating layer functioning as a base may be formed over the insulating layer 136, the insulating layer 138, and the insulating layer 140 before the oxide semiconductor layer is formed. The insulating layer can be formed by a PVD method such as a sputtering method, or a CVD method such as a plasma CVD method.

An oxide semiconductor to be used preferably contains at least indium (In) or zinc (Zn). In particular, In and Zn are preferably contained. As a stabilizer for reducing change in electrical characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

An In—Ga—Zn-based oxide semiconductor material has sufficiently high resistance when there is no electric field and thus off-state current can be sufficiently reduced. In addition, the In—Ga—Zn-based oxide semiconductor material has a high field-effect mobility. In a transistor including an In—Sn—Zn-based oxide semiconductor material, the field-effect mobility can be three times or more as high as that of a transistor including the In—Ga—Zn-based oxide semiconductor material, and the threshold voltage can be easily set to be positive. These semiconductor materials are one of the materials that can be favorably used in a transistor of a semiconductor device according to an embodiment of the present invention.

Note that here, for example, an "In—Ga—Zn—O-based oxide" means an oxide containing In, Ga, and Zn as its main component and there is no particular limitation on the ratio of In:Ga:Zn. Further, a metal element in addition to In, Ga, and Zn may be contained.

As the oxide semiconductor, a material expressed as the chemical formula $InMO_3(ZnO)_m$ (m>0, m is not an integer) may be used. Note that M denotes one metal element or a plurality of metal elements selected from Ga, Fe, Mn, and Co. Alternatively, as the oxide semiconductor, a material expressed by a chemical formula, $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "an oxide including In, Ga, and Zn at the atomic ratio, In:Ga:Zn=a:b:c (a+b+c=1), is in the neighborhood of an oxide including In, Ga, and Zn at the atomic ratio, In:Ga:Zn=A:B:C (A+B+C=1) by r" means that a, b, and c satisfy the following relation: $(a-A)^2+(b-B)^2+(c-C)^2 \leq r^2$. For example, r may be 0.05. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0} \int_{x_2}^{x_1} \int_{y_2}^{y_1} |f(x, y) - Z_0| dx dy \qquad \text{[FORMULA 4]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured with an atomic force microscope (AFM).

The target for forming the oxide semiconductor layer 144 by a sputtering method is, for example, an oxide target containing $In_2O_3$, $Ga_2O_3$, and ZnO in a composition ratio (molar ratio) of 1:1:1. Alternatively, an oxide target having a composition ratio of $In_2O_3$:$Ga_2O_3$:ZnO=1:1:2 [molar ratio] may be used.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

An In—Sn—Zn-based oxide can be referred to as ITZO. For ITZO, an oxide target having a composition ratio of In:Sn:Zn=1:2:2, 2:1:3, 1:1:1, or 20:45:35 in an atomic ratio is used, for example.

In addition, the thickness of the oxide semiconductor layer is preferably greater than or equal to 3 nm and less than or equal to 30 nm. This is because the transistor might possibly be normally on when the oxide semiconductor layer is too thick (e.g., the thickness is greater than or equal to 50 nm).

The oxide semiconductor layer is preferably formed by a method in which impurities such as hydrogen, water, a hydroxyl group, or hydride do not easily enter the oxide semiconductor layer. For example, a sputtering method or the like can be used.

In this embodiment, the oxide semiconductor layer is formed by a sputtering method with the use of an In—Ga—Zn—O-based oxide target.

As the In—Ga—Zn—O-based oxide target, for example, an oxide target having a composition ratio of $In_2O_3$:$Ga_2O_3$:ZnO=1:1:1 [molar ratio] can be used. Note that it is not necessary to limit the material and the composition ratio of the target to the above. For example, an oxide target having a composition ratio of $In_2O_3$:$Ga_2O_3$:ZnO=1:1:2 [molar ratio] can be used.

The filling rate of the oxide target is greater than or equal to 90% and less than or equal to 100%, preferably greater than or equal to 95% and greater than or equal to 99.9%. With the use of the metal oxide target with a high filling rate, a dense oxide semiconductor layer can be formed.

The deposition atmosphere may be a rare gas (typically argon) atmosphere, an oxygen atmosphere, or a mixed atmosphere containing a rare gas and oxygen. An atmosphere of a high-purity gas from which an impurity such as hydrogen, water, a hydroxyl group, or hydride is removed is preferable, in order to prevent hydrogen, water, a hydroxyl group, hydride, or the like from entering the oxide semiconductor layer.

For example, the oxide semiconductor layer can be formed described below.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas in which impurities such as hydrogen, water, a hydroxyl group, or hydride are sufficiently removed is introduced into the deposition chamber from which remaining moisture is being removed, and the oxide semiconductor layer is formed over the substrate with the use of the target. In order to remove moisture remaining in the deposition chamber, an entrapment vacuum pump such as a cryopump, an ion pump, or a titanium sublimation pump is desirably used. Further, an evacuation unit may be a turbo pump provided with a cold trap. In the deposition chamber which is evacuated with the cryopump, for example, impurities such as hydrogen, water, a hydroxyl group, or hydride (preferably, also a compound containing a carbon atom) or the like are removed, whereby the concentration of impurities such as hydrogen, water, a hydroxyl group, or hydride in the oxide semiconductor layer formed in the deposition chamber can be reduced.

In the case where the substrate temperature is low (for example, 100° C. or lower) during deposition, a substance including a hydrogen atom may enter the oxide semiconductor; thus, it is preferable that the substrate be heated at a temperature in the above range. When the oxide semiconductor layer is formed with the substrate heated at the temperature, the substrate temperature is increased, so that hydrogen bonds are cut by heat and are less likely to be taken into the oxide semiconductor layer. Therefore, the oxide semiconductor layer is formed with the substrate heated at the above temperature, whereby the concentration of impurities such as hydrogen, water, a hydroxyl group, or hydride in the oxide semiconductor layer can be sufficiently reduced. Moreover, damage due to sputtering can be reduced.

As an example of the film formation conditions, the following conditions can be employed: the distance between the substrate and the target is 60 mm, the pressure is 0.4 Pa, the direct-current (DC) power source is 0.5 kW, the substrate temperature is 400° C., and the film formation atmosphere is an oxygen atmosphere (the proportion of the oxygen flow rate is 100%). Note that a pulse direct current power source is preferable because powder substances (also referred to as particles or dust) generated in deposition can be reduced and the film thickness can be uniform.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering refers to a method in which a voltage is applied to a substrate side to generate plasma in the vicinity of the substrate to modify a surface. Note that a gas of nitrogen, helium, oxygen or the like may be used instead of argon.

The oxide semiconductor layer can be processed by being etched after a mask having a desired shape is formed over the oxide semiconductor layer. The mask may be formed by a method such as photolithography or an ink jet method. Note that the etching of the oxide semiconductor layer may be dry etching or wet etching. Needless to say, both of them may be employed in combination.

After that, heat treatment (first heat treatment) may be performed on the oxide semiconductor layer 144. The heat treatment further removes substances including hydrogen atoms in the oxide semiconductor layer 144. The heat treatment is performed under an inert gas atmosphere at greater than or equal to 250° C. and less than or equal to 700° C., preferably greater than or equal to 450° C. and less than or equal to 600° C. or less than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The heat treatment can be performed in such a manner that, for example, an object to be heated is introduced into an electric furnace in which a resistance heating element or the like is used and heated, under a nitrogen atmosphere at 450° C. for an hour. The oxide semiconductor layer 144 is not exposed to the air during the heat treatment so that entry of water and hydrogen can be prevented.

The above heat treatment has an effect of removing hydrogen, water, and the like and can be referred to as dehydration treatment, dehydrogenation treatment, or the like. The heat treatment can be performed at the timing, for example, before the oxide semiconductor layer is processed into an island shape or after the gate insulating layer is formed. Such dehydration treatment or dehydrogenation treatment may be performed once or plural times.

Figure 21B:
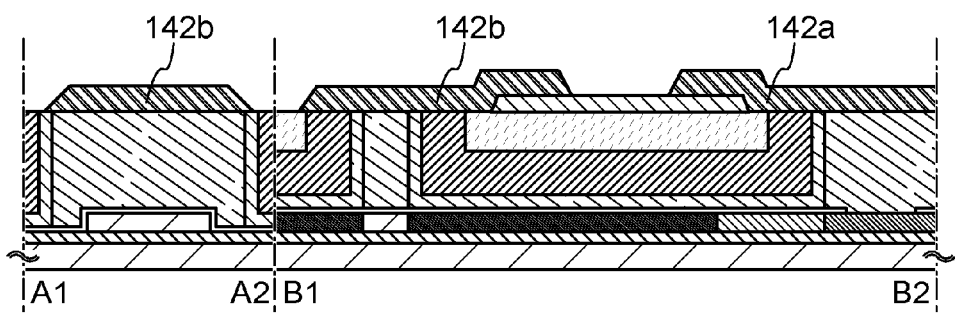

Next, a conductive layer for forming a source electrode and a drain electrode (including a wiring formed in the same layer as the source electrode and the drain electrode) is formed over the oxide semiconductor layer 144 and the like and is processed, so that the source and drain electrodes 142a and 142b are formed (see FIG. 21B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer may have a single-layer structure or a stacked structure including two or more layers. For example, the conductive layer may have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the source electrode 142a and the drain electrode 142b having tapered shapes.

The conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is contained can be used.

The conductive layer is preferably etched so that end portions of the source electrode 142a and the drain electrode 142b that are to be formed are tapered. Here, a taper angle is, for example, preferably greater than or equal to 30° and less than or equal to 60°. The etching is performed so that the end portions of the source electrode 142a and the drain electrode 142b are tapered, whereby coverage with the gate insulating layer 146 formed later can be improved and disconnection can be prevented.

The channel length (L) of the transistor in the upper portion is determined by a distance between lower edge portions of the source electrode 142a and the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization allows low power consumption of a semiconductor device.

As an example different from that in FIG. 21B, an oxide conductive layer may be provided as a source region and a drain region between the oxide semiconductor layer 144 and the source and drain regions.

For example, the oxide conductive layer which serves as a source region and a drain region, the source electrode 142a, and the drain electrode 142b can be formed by forming an oxide conductive film over the oxide semiconductor layer 144, forming a conductive layer over the oxide conductive film, and processing the oxide conductive film and the conductive layer in one photolithography step.

Alternatively, a stacked layer of an oxide semiconductor film and an oxide conductive film is formed and the stacked layer is processed in one photolithography step, so that the island-shaped oxide semiconductor layer 144 and oxide conductive film may be formed. After the source electrode 142a and the drain electrode 142b are formed, the island-shaped oxide conductive film is etched using the source electrode 142a and the drain electrode 142b as masks, so that the oxide conducive layer which serves as a source region and a drain region can be formed.

Note that when etching treatment for processing the oxide conductive layer is performed, etching conditions (e.g., type of etching agent, the concentration of an etching agent, and etching time) are adjusted as appropriate in order to prevent excessive etching of the oxide semiconductor layer.

A material of the oxide conductive layer preferably contains zinc oxide as a component and preferably does not contain indium oxide. For such an oxide conductive layer, zinc oxide, zinc aluminum oxide, zinc aluminum oxynitride, gallium zinc oxide, or the like can be used.

When the oxide conductive layer is provided between the oxide semiconductor layer and the source and drain electrode layers, the source region and the drain region can have lower resistance and the transistor can operate at high speed.

With the structure including the oxide semiconductor layer 144, the oxide conductive layer, and the drain electrode formed using a metal material, withstand voltage of the transistor can be further increased.

In the case where the oxide conductive layer is used for a source region and a drain region, the contact resistance can be reduced when a metal electrode (e.g., molybdenum or tungsten) and the oxide conductive layer are in contact, as compared to the case where a metal electrode (e.g., molybdenum or tungsten) and the oxide semiconductor layer are in contact. The contact resistance can be reduced by interposing an oxide conductive layer between the oxide semiconductor layer and source and drain electrodes; thus, frequency characteristics of a peripheral circuit (driver circuit) can be improved.

Figure 21C:
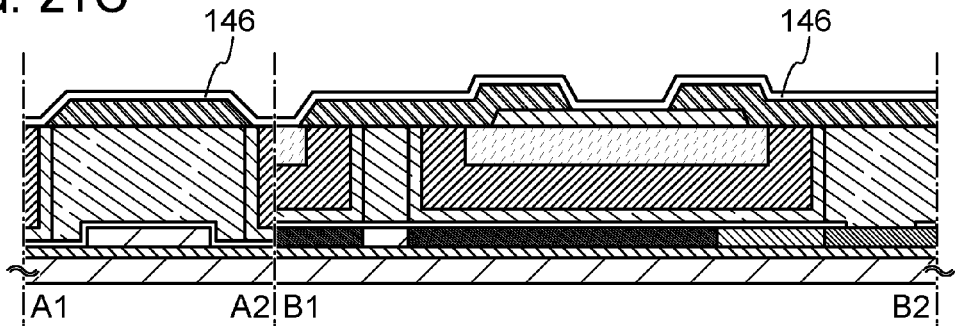

Next, the gate insulating layer 146 is formed so as to cover the source electrode 142a and the drain electrode 142b and to be in contact with part of the oxide semiconductor layer 144 (see FIG. 21C).

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, gallium oxide, hafnium silicate ($HfSi_xO_y$ (x>0, y>0)), hafnium silicate to which nitrogen is added ($HfSi_xO_y$ (x>0, y>0)), hafnium aluminate to which nitrogen is added ($HfAl_xO_y$ (x>0, y>0)), or the like. The gate insulating layer 146 may have a single-layer structure or a stacked structure in which these elements are combined. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as described above, a problem of gate leakage due to a tunnel effect or the like is caused. In order to solve the problem of gate leakage, a high dielectric constant (high-k) material such as hafnium oxide, tantalum oxide, yttrium oxide, hafnium silicate ($HfSi_xO_y$ (x>0, y>0)), hafnium silicate to which nitrogen is added ($HfSi_xO_y$ (x>0, y>0)), or hafnium aluminate to which nitrogen is added ($HfAl_xO_y$ (x>0, y>0)) is preferably used for the gate insulating layer 146. The use of a high-k material for the gate insulating layer 146 makes it possible to ensure electrical characteristics and to increase the thickness in order to suppress gate leakage. Note that a stacked structure of a film containing a high-k material and a film containing any one of silicon oxide, silicon nitride, silicon oxynitride, silicon nitride oxide, aluminum oxide, and the like may be employed.

An insulating material containing an element belonging to Group 13 refers to an insulating material containing one or more elements belonging to Group 13. As examples of the insulating material containing an element belonging to Group 13, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming a gate insulating layer in contact with an oxide semiconductor layer containing gallium, the use of a material containing gallium oxide for the gate insulating layer allows the characteristics of the interface between the oxide semiconductor layer and the gate insulating layer to be kept favorable. Moreover, when the oxide semiconductor layer and the insulating layer containing gallium oxide are provided in contact with each other, pileup of hydrogen at the interface between the oxide semiconductor layer and the insulating layer can be reduced. Note that a similar effect can be obtained in the case where an element belonging to the same group as a constituent element of the oxide semiconductor is used for the insulating layer. For example, it is effective to form an insulating layer with the use of a material containing an aluminum oxide. Aluminum oxide is impermeable to water. Therefore, it is preferable to use a material containing aluminum oxide in terms of preventing entry of water to the oxide semiconductor layer.

The insulating layer in contact with the oxide semiconductor layer 144 preferably contains oxygen in a proportion higher than that in the stoichiometric composition, by heat treatment under an oxygen atmosphere or oxygen doping. "Oxygen doping" refers to addition of oxygen into a bulk. Note that the term "bulk" is used in order to clarify that oxygen is added not only to a surface of a thin layer but also to the inside of the thin layer. In addition, "oxygen doping" includes "oxygen plasma doping" in which oxygen which is made to be plasma is added to a bulk. The oxygen doping may be performed using an ion implantation method or an ion doping method.

For example, in the case where the insulating layer in contact with the oxide semiconductor layer 144 is formed using gallium oxide, the composition of gallium oxide can be set to be $Ga_2O_x$ ($x=3+\alpha$, $0<\alpha<1$) by heat treatment under an oxygen atmosphere or oxygen doping. Further, in the case where the insulating layer in contact with the oxide semiconductor layer 144 is formed of aluminum oxide, the composition of aluminum oxide can be set to be $Al_2O_x$ ($x=3+\alpha$, $0<\alpha<1$) by heat treatment under an oxygen atmosphere or oxygen doping. Further, in the case where the insulating layer in contact with the oxide semiconductor layer 144 is formed of gallium aluminum oxide (or aluminum gallium oxide), the composition of gallium aluminum oxide (or aluminum gallium oxide) can be set to be $Ga_xAl_{2-x}O_{3+\alpha}$ ($0<x<2$, $0<\alpha<1$) by heat treatment under an oxygen atmosphere or oxygen doping.

By oxygen doping or the like, an insulating layer which includes a region where the proportion of oxygen is higher than that in the stoichiometric composition can be formed. When the insulating layer including such a region is in contact with the oxide semiconductor layer, oxygen that exists excessively in the insulating layer is supplied to the oxide semiconductor layer, and oxygen deficiency in the oxide semiconductor layer or at an interface between the oxide semiconductor layer and the insulating layer is reduced. Thus, the oxide semiconductor layer can be formed to an i-type or substantially i-type oxide semiconductor.

The insulating layer which includes a region where the proportion of oxygen is higher than that in the stoichiometric composition may be applied to the insulating layer which serves as a base film of the oxide semiconductor layer 144, instead of the gate insulating layer 146, or may be applied to both the gate insulating layer 146 and the base insulating layer.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for an hour in a nitrogen atmosphere. The second heat treatment allows a reduction in variation in the electrical characteristics of the transistor. Further, in the case where the gate insulating layer 146 contains oxygen, oxygen is supplied to the oxide semiconductor layer 144 to compensate for oxygen deficiency in the oxide semiconductor layer 144, so that an i-type (intrinsic) or substantially i-type oxide semiconductor layer can be formed.

Note that although the second heat treatment is performed after the gate insulating layer 146 is formed in this embodiment, the timing of the second heat treatment is not limited thereto. The second heat treatment may be performed, for example, after the gate electrode is formed. Alternatively, the second heat treatment may be performed following the first heat treatment, the first heat treatment may double as the second heat treatment, or the second heat treatment may double as the first heat treatment.

As described above, both of the first heat treatment and the second heat treatment are employed, whereby the oxide semiconductor layer 144 can be highly purified so as to contain the substances including hydrogen atoms as little as possible.

Figure 21D:
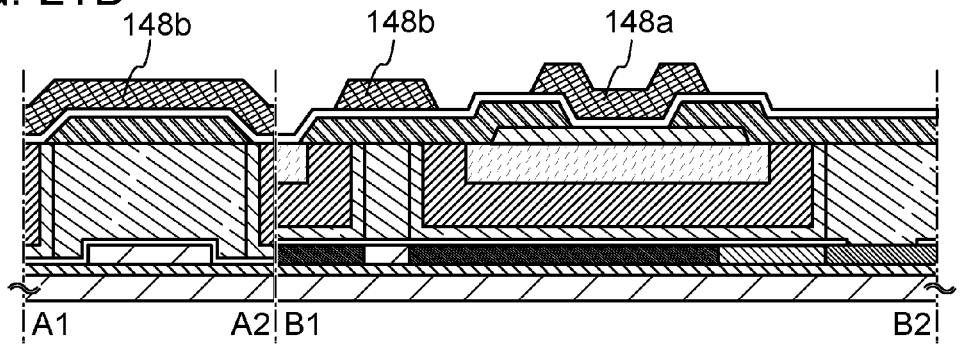

Next, a conductive layer for forming a gate electrode (including a wiring formed using the same layer as the gate electrode) is formed and is processed, so that the gate electrode 148a and the conductive layer 148b are formed (see FIG. 21D).

The gate electrode 148a and the conductive layer 148b can be formed using a metal material such as molybdenum, titanium, tantalum, tungsten, aluminum, copper, neodymium, or scandium, or an alloy material containing any of these materials as a main component. Note that the gate electrode 148a and the conductive layer 148b may have a single-layer structure or a stacked structure.

Figure 22A:
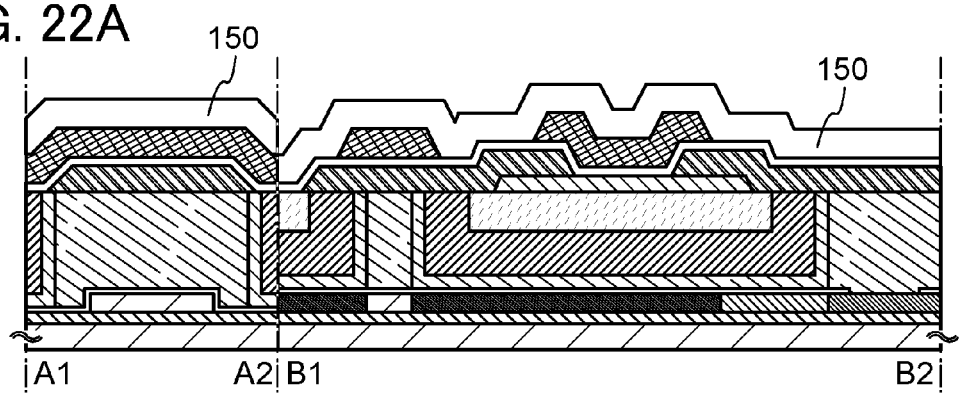
FIGS. 22A to 22C are cross-sectional views of a semiconductor device.
Figure 22B:
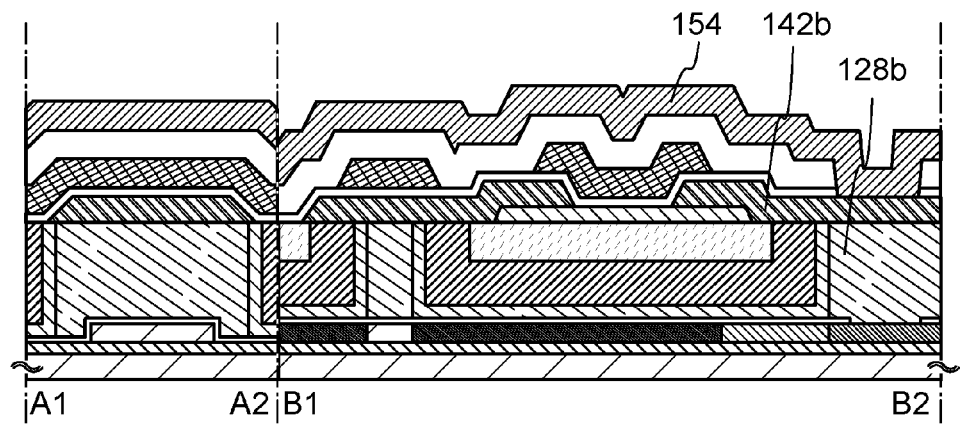

Next, an insulating layer 150 is formed over the gate insulating layer 146, the gate electrode 148a, and the conductive layer 148b (see FIG. 22A). The insulating layer 150 can be formed by a PVD method, a CVD method, or the like. The insulating layer 150 can be formed using a material containing an inorganic insulating material such as silicon oxide, silicon oxynitride, silicon nitride, hafnium oxide, gallium oxide, or aluminum oxide. Note that for the insulating layer 150, a material with a low dielectric constant may be preferably used or a structure with a low dielectric constant (e.g., a porous structure) is preferably employed for the following reason: the low dielectric constant of the insulating layer 150 allows capacitance generated between wirings, electrodes, or the like to be reduced and operation speed to be increased. Note that although the insulating layer 150 has a single-layer structure in this embodiment, an embodiment of the disclosed invention is not limited to this. The insulating layer 150 may have a stacked structure including two or more layers.

Next, an opening reaching the drain electrode 142b is formed in the gate insulating layer 146 and the insulating layer 150. After that, a wiring 154 connected to the drain electrode 142b is formed over the insulating layer 150 (see FIG. 22B). The opening is formed by selective etching using a mask or the like.

A conductive layer is formed by a PVD method or a CVD method and then is patterned, so that the wiring 154 is formed. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

Specifically, it is possible to employ a method, for example, in which a thin (about 5 nm) titanium film is formed in a region including the opening of the insulating layer 150 by a PVD method and a titanium nitride film is formed by a PVD method, and then, an aluminum film is formed so as to be embedded in the openings. Here, the titanium film formed by a PVD method has a function of reducing an oxide film (such as a natural oxide film) over which the titanium film is to be formed, and thereby lowering contact resistance with the lower electrode or the like (here, the drain electrode 142b). In addition, hillock of aluminum film can be prevented. A copper film may be formed by a plating method after the formation of the barrier film of titanium, titanium nitride, or the like.

The opening formed in the insulating layer 150 is preferably formed in a region overlapping with the conductive layer 128b. By forming the opening in such a region, an increase in the element area due to a contact region of electrodes can be suppressed.

Here, the case where the position where the impurity region 126 and the source electrode 142a are connected and the position where the drain electrode 142b and the wiring 154 are connected overlap with each other without using the conductive layer 128b will be described. In this case, an opening (also referred to as a contact in a lower portion) is formed in the insulating layer 136, the insulating layer 138, and the insulating layer 140 which are formed over the impurity region 126, and the drain electrode 142a is formed in the contact in the lower portion; after that, an opening (also referred to as a contact in an upper portion) is formed in a region overlapping with the contact in the lower portion in the gate insulating layer 146 and the insulating layer 150, and then the wiring 154 is formed. When the contact in the upper portion is formed in the region overlapping with the contact in the lower portion, the drain electrode 142b formed in the contact in the lower portion might be disconnected due to etching. When the contacts in the lower portion and in the upper portion are formed so as not to overlap with each other in order to avoid the disconnection, an increase in the element area is caused.

As described in this embodiment, with the use of the conductive layer 128b, the contact in the upper portion can be formed without disconnection of the drain electrode 142b. Thus, the contacts in the lower portion and in the upper portion can be formed so as to overlap with each other, so that the increase in the element area due to the contact regions can be suppressed. In other words, the degree of integration of the semiconductor device can be increased.

Figure 22C:
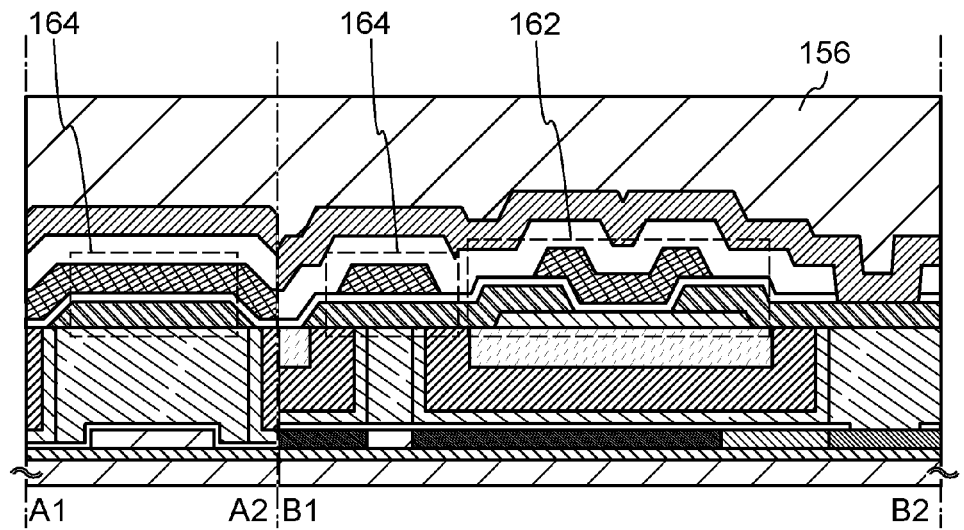

Next, an insulating layer 156 is formed so as to cover the wiring 154 (see FIG. 22C).

Through the above steps, the transistor 162 and the capacitor 164 including the purified oxide semiconductor layer 144 are completed (see FIG. 22C).

Since the oxide semiconductor layer 144 is purified in the transistor 162 described in this embodiment, the hydrogen concentration is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. In addition, the value of the carrier concentration of the oxide semiconductor layer 144 is sufficiently low (e.g., lower than $1 \times 10^{12}$/cm$^3$, preferably lower than $1.45 \times 10^{10}$/cm$^3$) in comparison with that of a general silicon wafer (approximately $1 \times 10^{14}$/cm$^3$). Accordingly, the off-state current of the transistor 162 is also sufficiently small. For example, the off-state current of the transistor 162 (here, current per unit channel width (1 μm)) at room temperature (25° C.) is 100 zA (1 zA (zeptoampere) is $1 \times 10^{-21}$ A) or less, preferably 10 zA or less.

In this manner, by using the purified intrinsic oxide semiconductor layer 144, the off-state current of the transistor can be sufficiently reduced easily. In addition, by using such a transistor, a semiconductor device in which stored data can be held for an extremely long time can be obtained.

The methods and structures described in this embodiment can be combined as appropriate with any of the methods and structures described in the other embodiments.

Embodiment 3

In this embodiment, as the oxide semiconductor having crystallinity, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal oxide, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 35A to 35E, FIGS. 36A to 36C, and FIGS. 37A to 37C. In FIGS. 35A to 35E, FIGS. 36A to 36C, and FIGS. 37A to 37C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 35A:
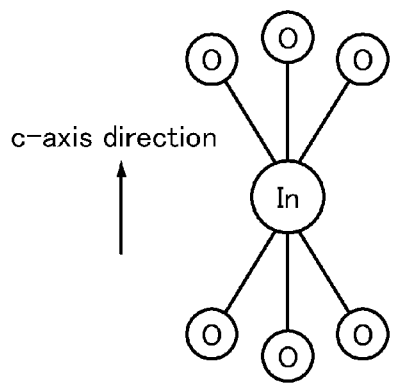
FIGS. 35A to 35E illustrate structures of oxide material according to one embodiment of the present invention.

FIG. 35A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 35A is actually an octahedral structure, but is illustrated as a planar structure for simplicity. Note that three tetracoordinate O atoms exist in each of an upper half and a lower half in FIG. 35A. In the small group illustrated in FIG. 35A, electric charge is 0.

Figure 35D:
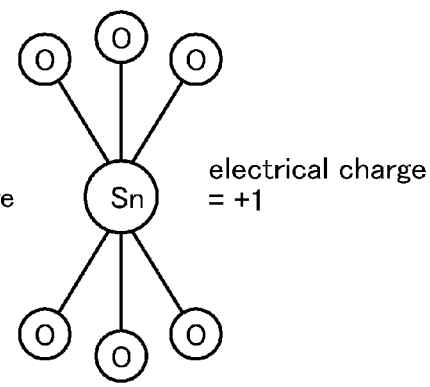
Figure 35B:
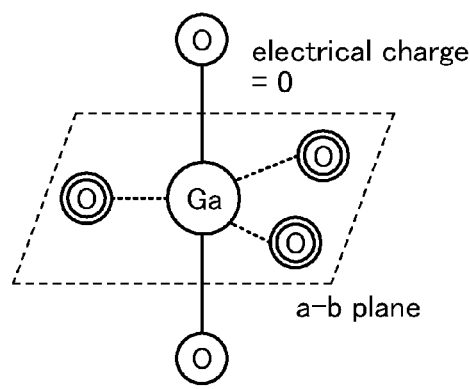

FIG. 35B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 35B. An In atom can also have the structure illustrated in FIG. 35B because an In atom can have five ligands. In the small group illustrated in FIG. 35B, electric charge is 0.

Figure 35E:
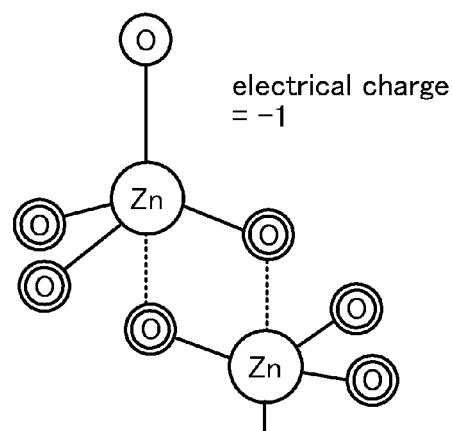
Figure 35C:
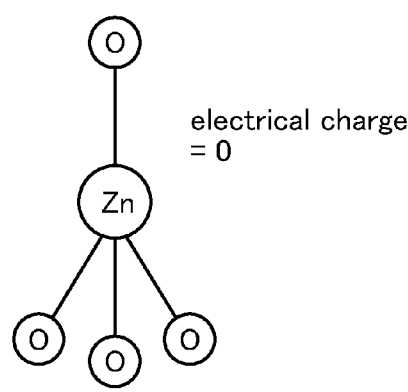

FIG. 35C illustrates a structure including one tetracoordinate Zn atom and four tetracoordinate O atoms proximate to the Zn atom. In FIG. 35C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 35C. In the small group illustrated in FIG. 35C, electric charge is 0.

FIG. 35D illustrates a structure including one hexacoordinate Sn atom and six tetracoordinate O atoms proximate to the Sn atom. In FIG. 35D, three tetracoordinate O atoms exist in each of an upper half and a lower half. In the small group illustrated in FIG. 35D, electric charge is +1.

FIG. 35E illustrates a small group including two Zn atoms. In FIG. 35E, one tetracoordinate O atom exists in each of an upper half and a lower half. In the small group illustrated in FIG. 35E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 35A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 36A illustrates a model of a medium group included in a layered structure of an In—Sn—Zn—O-based material. FIG. 36B illustrates a large group including three medium groups. Note that FIG. 36C illustrates an atomic arrangement in the case where the layered structure in FIG. 36B is observed from the c-axis direction.

In FIG. 36A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 36A, one tetracoordinate O atom existing in each of an upper half and a lower half with respect to an In atom is denoted by circled 1. FIG. 36A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 36A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 35E can be given. For example, with one small group including two Zn atoms, electric charge of one small group including a Sn atom can be cancelled, so that the total electric charge of the layered structure can be 0.

When the large group illustrated in FIG. 36B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figures 37A, 37B, 37C:
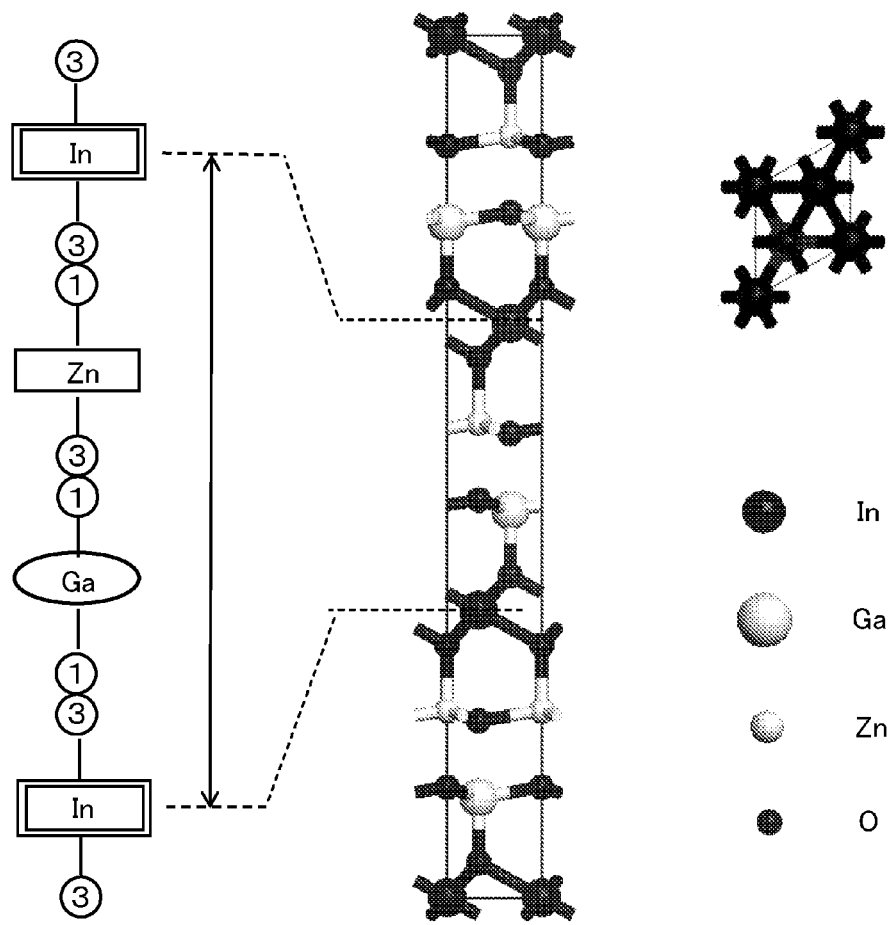
FIGS. 37A to 37C illustrate a structure of an oxide material according to one embodiment of the present invention.

As an example, FIG. 37A illustrates a model of a medium group included in a layered structure of an In—Ga—Zn—O-based material.

In the medium group included in the layered structure of the In—Ga—Zn—O-based material in FIG. 37A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 37B illustrates a large group including three medium groups. Note that FIG. 37C illustrates an atomic arrangement in the case where the layered structure in FIG. 37B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 37A but also a medium group in which the arrangement of the In atom, the Ga atom, and the Zn atom is different from that in FIG. 37A.

Embodiment 4

In this embodiment, a semiconductor device having a structure which is different from those in FIGS. 2A and 2B, FIGS. 7A and 7B, FIG. 8, and FIG. 10 will be described with reference to FIG. 23, FIGS. 24A and 24B, and FIG. 25.

Figure 23:
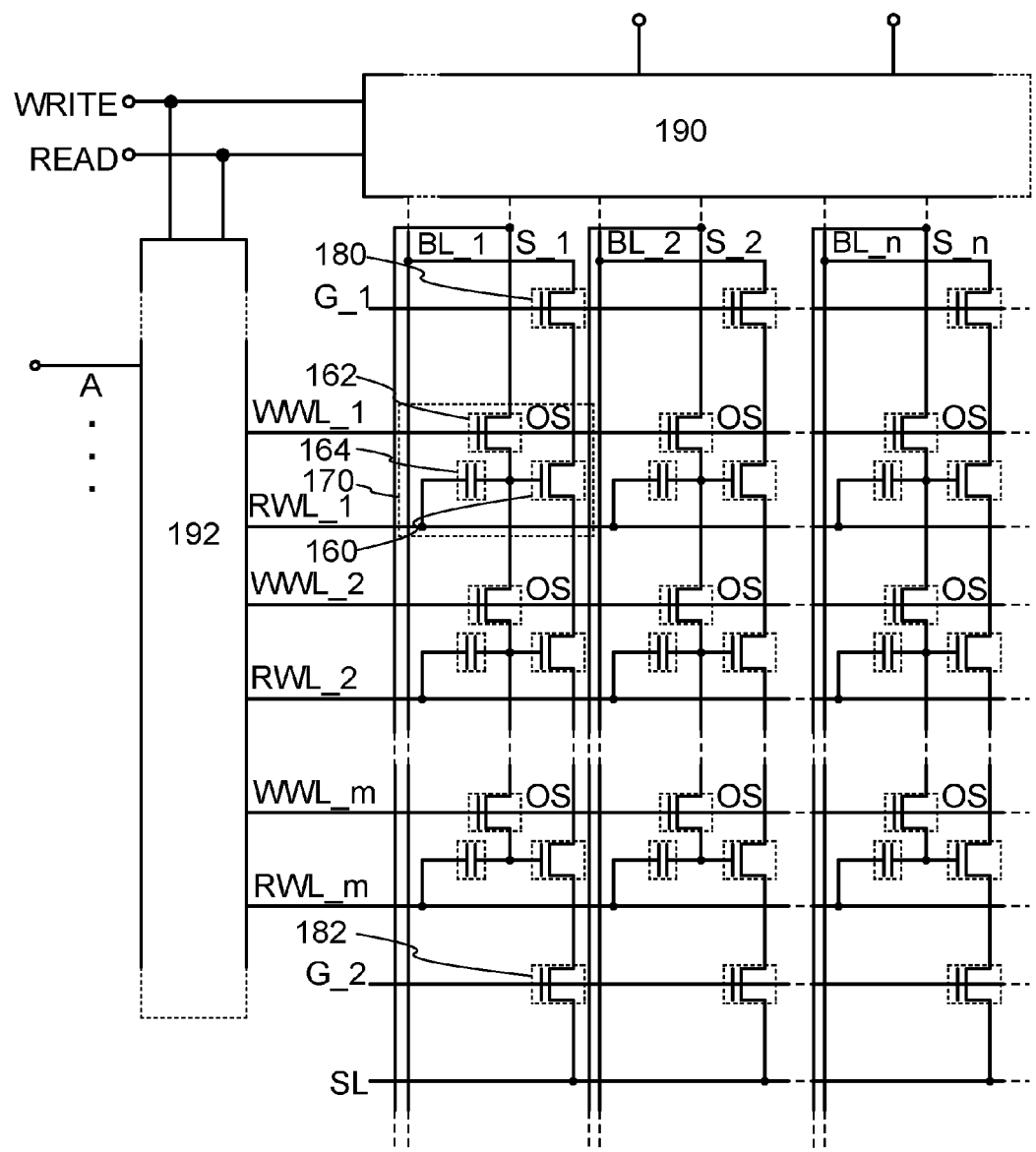
FIG. 23 is a circuit diagram of a semiconductor device.

FIG. 23 is an example of a circuit diagram of a semiconductor device including (m×n) memory cells 170. The structure of the memory cells 170 in FIG. 23 is similar to that in FIG. 2B; therefore, the detailed description thereof is omitted.

The semiconductor device illustrated in FIG. 23 has a structure basically similar to that of the semiconductor device illustrated in FIG. 2A. A difference between the semiconductor device illustrated in FIG. 2A and the semiconductor device illustrated in FIG. 23 is, for example, whether or not wirings electrically connected to the bit lines BL and the signal lines S are provided. In other words, the semiconductor device illustrated in FIG. 23 has the structure in which the bit lines BL and the signal lines S are electrically connected to each other. With such a structure in which the bit lines BL and the signal lines S are electrically connected to each other, the semiconductor device has a function to keep the potential of the bit lines supplied to the memory cells at an appropriate value. In a structure in which a number of memory cells are connected in series particularly as in the invention disclosed in FIGS. 7A and 7B and FIG. 8, it becomes difficult in some cases to read data due to voltage drop in the memory cells; thus, provision of the wiring is useful.

For example, a wiring is connected to each bit lines BL (or signal lines S) in respective units in each of which 64 memory cells are connected in series, so that an appropriate potential can be supplied to each unit. Accordingly, data can be favorably read even in a structure including a large number of memory cells. Note that the number of memory cells included in each unit is not limited to 64. The number can be 32, 128, or the like and can be set as appropriate within a range which does not affect reading operation.

Figure 24A:
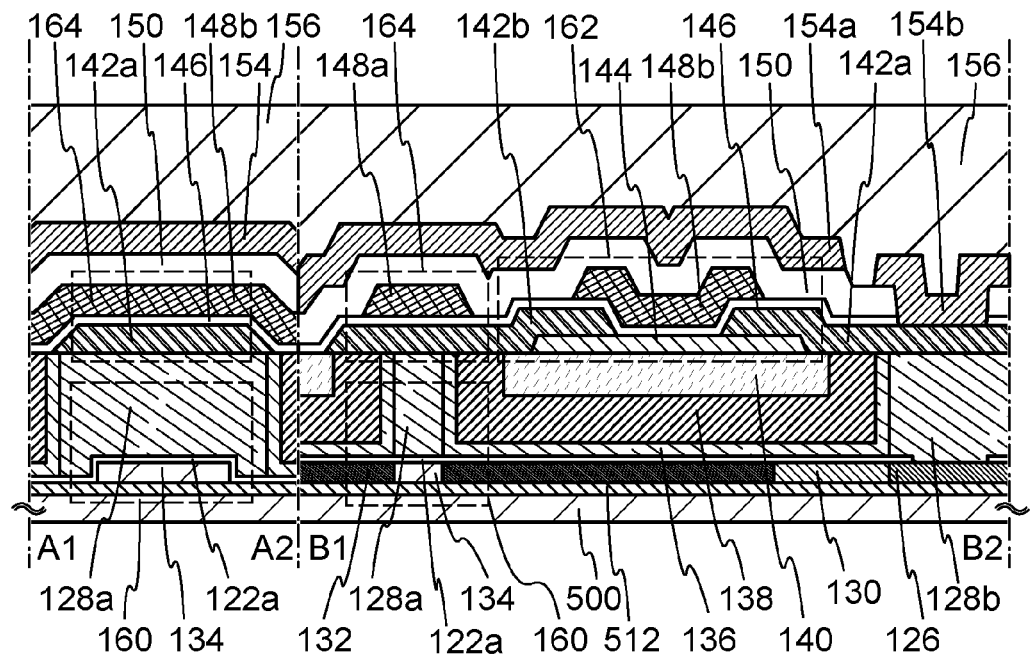
FIG. 24A is a cross-sectional view and FIG. 24B is a plan view of a semiconductor device.
Figure 24B:
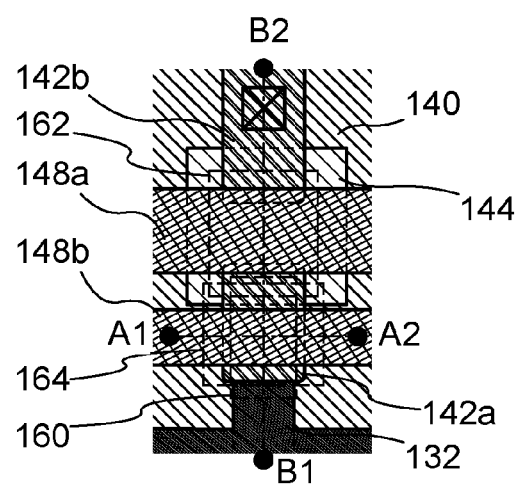

FIGS. 24A and 24B illustrate an example of a structure of the semiconductor device illustrated in FIG. 23. FIG. 24A is a cross-sectional view of the semiconductor device, and FIG. 24B is a plan view of the semiconductor device. Here, FIG. 24A corresponds to a cross section along line A1-A2 and line B1-B2 in FIG. 24B. A characteristic feature of the structure illustrated in FIGS. 24A and 24B is to include a wiring 154a in addition to a wiring 154b electrically connected to the source electrode 142a or the drain electrode 142b. The wiring 154a corresponds to the bit line BL (or signal line S) in FIG. 23. Note that although not explicitly shown in FIG. 24B, the wiring 154a and the wiring 154b are parallel to each other and extend in the vertical direction of FIG. 24B.

The above semiconductor device operates in a manner similar to that in FIG. 2A. For the details, the corresponding explanation in the above embodiment can be referred to.

Figure 25:
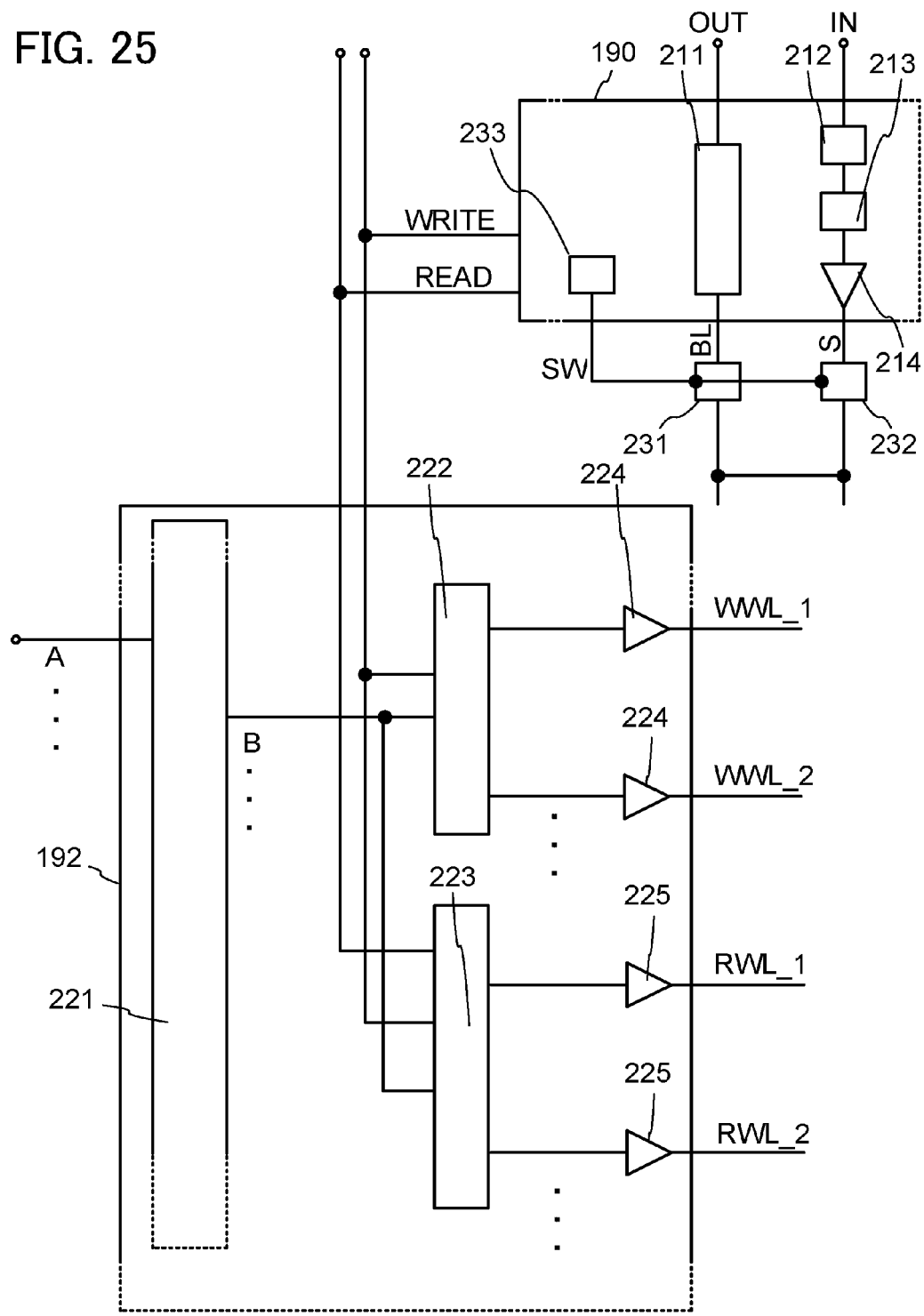
FIG. 25 is a circuit diagram of a semiconductor device.

Note that even in the case of employing the structure in FIG. 2A, FIGS. 7A and 7B, FIG. 8, or FIG. 10, a similar effect can be obtained by substituting the signal line S for the wiring. In that case, it is possible to employ, for example, a structure in which the bit line BL and the signal line S are electrically connected to each other and which includes a switch 231 for controlling the connection of the bit line BL and the signal line S to the output terminal OUT, a switch 232 for controlling the connection of the bit line BL and the signal line S to the input terminal IN, and a wiring SW, as illustrated in FIG. 25. In this case, with the use of a signal supplied to the wiring SW, the switch 231 is enabled at the time of reading and the switch 232 is enabled at the time of writing. Note that the signal supplied to the wiring SW is generated by a signal generation circuit 233 using signals from the wiring WRITE and the wiring READ. In the case of employing such a structure, there is no need to provide a wiring additionally as illustrated in FIG. 23; therefore, the degree of integration of the semiconductor device can be further increased while favorable reading operation is secured.

Figure 5:
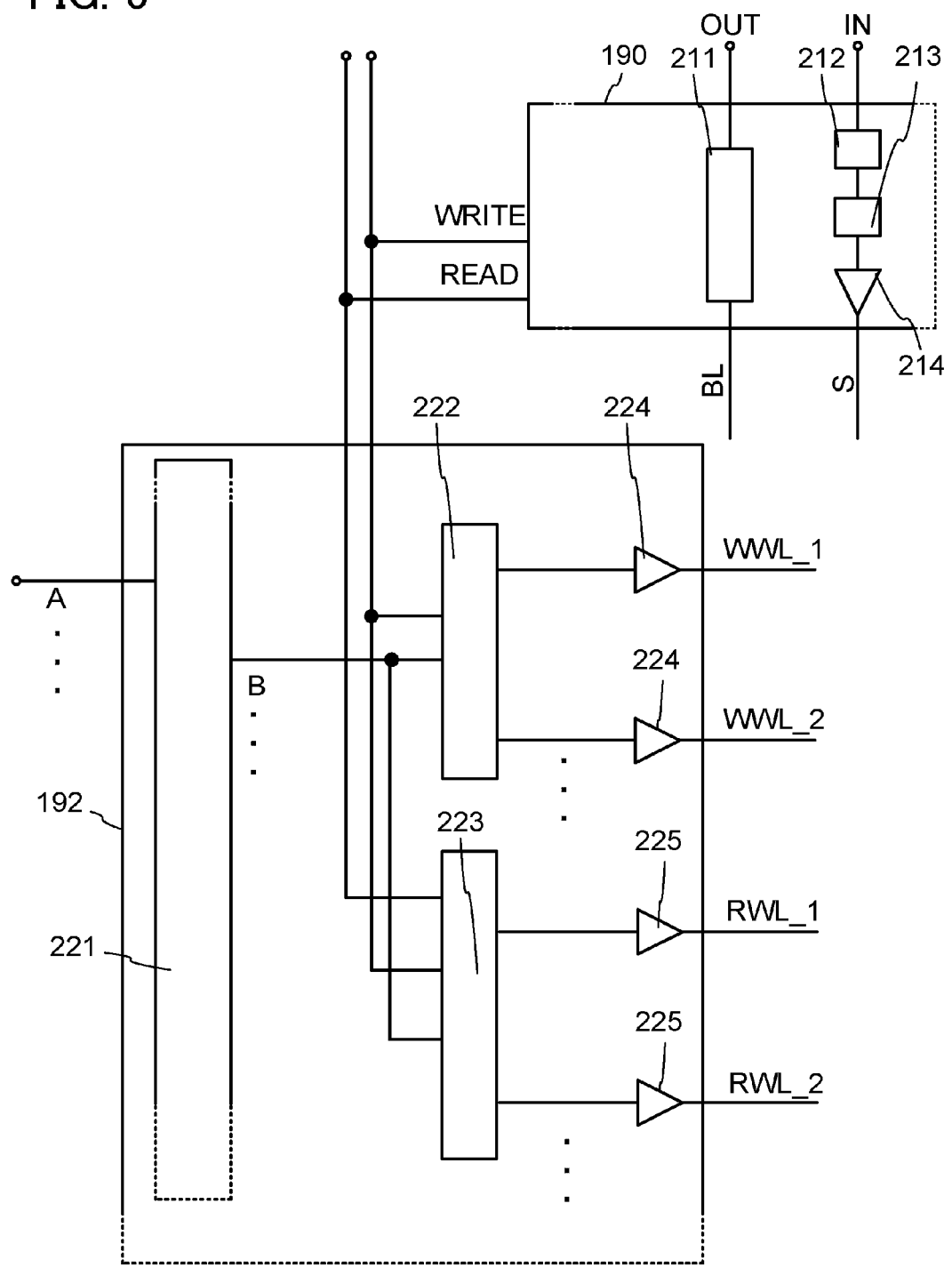
FIG. 5 is a circuit diagram of a semiconductor device.
Figure 6C:
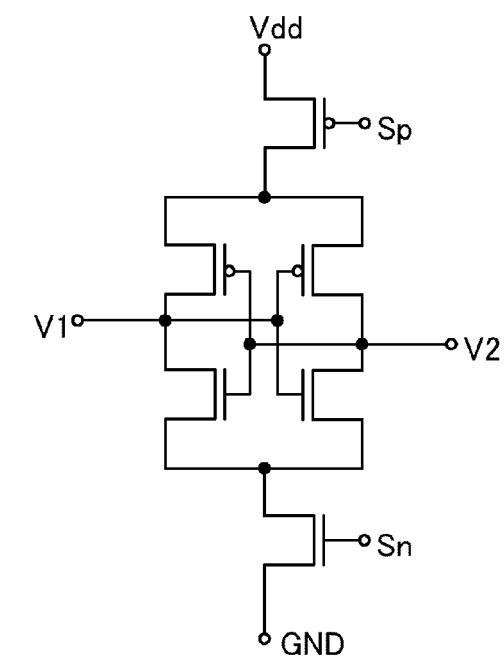

Note that the other components in FIG. 25 are similar to those in FIG. 5. For the details, the explanation of FIG. 5 can be referred to.

Note that although the structure described in this embodiment is a modified example of the semiconductor device illustrated in FIG. 2A, a modified example of the semiconductor device illustrated in FIGS. 7A and 7B, FIG. 8, and FIG. 10 is also possible.

The structures, methods, and the like described in this embodiment can be combined as appropriate with any of the structures, methods, and the like described in the other embodiments.

Embodiment 5

Figure 34A:
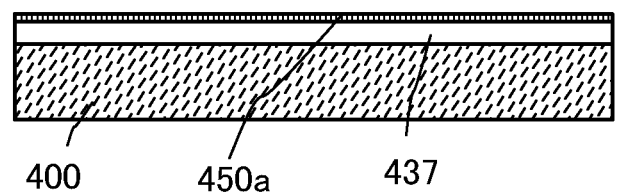
FIGS. 34A to 34C are cross-sectional views of a transistor including an oxide semiconductor.
Figure 34B:
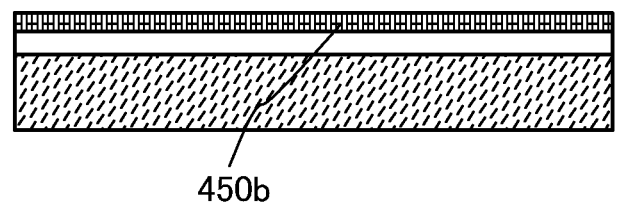

One embodiment of an oxide semiconductor layer that can be used for the semiconductor layers of the transistors in Embodiments 1 to 3 will be described with reference to FIGS. 34A to 34C.

The oxide semiconductor layer in this embodiment has a stacked-layer structure including a second crystalline oxide semiconductor layer which is thicker than a first crystalline oxide semiconductor layer over the first crystalline oxide semiconductor layer.

An insulating layer 437 is formed over an insulating layer 400. In this embodiment, an oxide insulating layer with a thickness greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor film with a thickness greater than or equal to 1 nm and less than or equal to 10 nm is formed over the insulating layer 437. The first oxide semiconductor film is formed by a sputtering method, and the substrate temperature in the film formation by a sputtering method is set to be higher than or equal to 200° C. and lower than or equal to 400° C.

In this embodiment, a first oxide semiconductor film is formed to a thickness of 5 nm in an oxygen atmosphere, an argon atmosphere, or an atmosphere including argon and oxygen under conditions where a target for deposition of an oxide semiconductor (a target for deposition of an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 34A).

Depending on the temperature of the first heat treatment, the first heat treatment causes crystallization from a film surface and crystal grows from the film surface toward the inside of the film; thus, c-axis aligned crystal is obtained. By the first heat treatment, a large amount of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating layer or at the interface between the first crystalline oxide semiconductor layer 450a and the insulating layer 437 at an amount that exceeds at least the stoichiometric composition ratio.

Next, a second oxide semiconductor film with a thickness more than 10 nm is formed over the first crystalline oxide semiconductor layer 450a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor layer formed over and in contact with the surface of the first crystalline oxide semiconductor layer and so-called orderliness can be obtained.

In this embodiment, the second oxide semiconductor film is formed to a thickness of 25 nm in an oxygen atmosphere, an argon atmosphere, or an atmosphere including argon and oxygen under conditions where a target for deposition of an oxide semiconductor (a target for deposition of an In—Ga—Zn—O-based oxide semiconductor including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Next, second heat treatment is performed under a condition where the atmosphere of a chamber in which the substrate is set is an atmosphere of nitrogen or dry air. The temperature of the second heat treatment is higher than or equal to 400° C. and lower than or equal to 750° C. Through the second heat treatment, a second crystalline oxide semiconductor layer 450b is formed (see FIG. 34B). The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 34C:
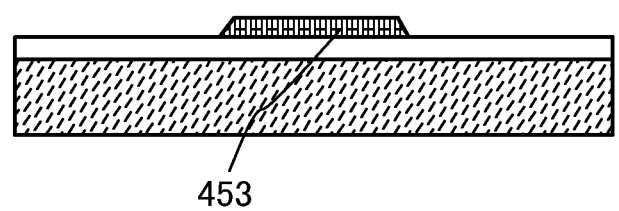

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 34C). In the drawing, the interface between the first crystalline oxide semiconductor layer 450a and the second crystalline oxide semiconductor layer 450b are indicated by a dotted line, and the first crystalline oxide semiconductor layer 450a and the second crystalline oxide semiconductor layer 450b are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink jet method.

Note that for the etching of the stack of the oxide semiconductor layers, either dry etching or wet etching may be employed. Needless to say, both of them may be employed in combination.

A feature of the first crystalline oxide semiconductor layer and the second crystalline oxide semiconductor layer obtained by the above formation method is that they have c-axis alignment. Note that the first crystalline oxide semiconductor layer and the second crystalline oxide semiconductor layer comprise an oxide including a crystal with c-axis alignment (also referred to as C-Axis Aligned Crystal (CAAC)), which has neither a single crystal structure nor an amorphous structure. The first crystalline oxide semiconductor layer and the second crystalline oxide semiconductor layer partly include a crystal grain boundary.

An oxide semiconductor to be used preferably contains at least indium (In) or zinc (Zn). In particular, In and Zn are preferably contained. As a stabilizer for reducing change in electrical characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

An In—Ga—Zn-based oxide semiconductor material has sufficiently high resistance when there is no electric field and thus off-state current can be sufficiently reduced. In addition, the In—Ga—Zn-based oxide semiconductor material has a high field-effect mobility. In a transistor including an In—Sn—Zn-based oxide semiconductor material, the field-effect mobility can be three times or more as high as that of a transistor including the In—Ga—Zn-based oxide semiconductor material, and the threshold voltage can be easily set to be positive. These semiconductor materials are one of the materials that can be favorably used in a transistor of a semiconductor device according to an embodiment of the present invention.

Note that here, for example, an "In—Ga—Zn—O-based oxide" means an oxide containing In, Ga, and Zn as its main component and there is no particular limitation on the ratio of In:Ga:Zn. Further, a metal element in addition to In, Ga, and Zn may be contained.

As the oxide semiconductor, a material expressed as the chemical formula $InMO_3(ZnO)_m$ (m>0, m is not an integer) may be used. Note that M denotes one metal element or a plurality of metal elements selected from Ga, Fe, Mn, and Co. Alternatively, as the oxide semiconductor, a material expressed by a chemical formula, $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

Without limitation to the two-layer structure in which the second crystalline oxide semiconductor layer is formed over the first crystalline oxide semiconductor layer, a stacked structure including three or more layers may be formed by repeatedly performing a process of film formation and heat treatment for forming a third crystalline oxide semiconductor layer after the second crystalline oxide semiconductor layer is formed.

The oxide semiconductor layer 453 including the stack of the oxide semiconductor layers formed by the above formation method can be used as appropriate for a transistor (e.g., the transistor 162 in Embodiment 1 and Embodiment 2) which can be applied to a semiconductor device disclosed in this specification.

In the transistor in this Embodiment in which the oxide semiconductor layer 453 is used as an oxide semiconductor layer, an electric field is not applied from one surface to the other surface of the oxide semiconductor layer and current does not flow in the thickness direction of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of transistor characteristics is suppressed or reduced.

By forming a transistor with the use of a stack of a first crystalline oxide semiconductor layer and a second crystalline oxide semiconductor layer, like the oxide semiconductor layer 453, the transistor can have stable electric characteristics and high reliability.

This embodiment can be implemented in an appropriate combination with any of the structures described in the other embodiments.

Embodiment 6

In this embodiment, the cases where the semiconductor device described in any of the above embodiments is applied to electronic devices will be described with reference to FIGS. 26A to 26F. The cases where the above-described semiconductor device is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, a television set (also referred to as a television or a television receiver), and the like are described in this embodiment.

Figure 26A:
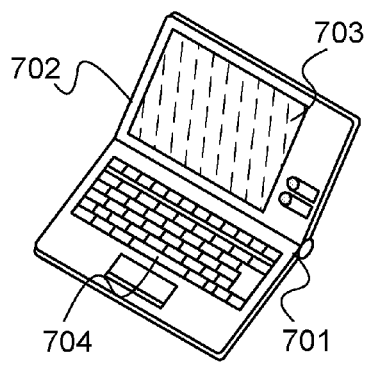
FIGS. 26A to 26F are diagrams for explaining electronic appliances using a semiconductor device.

FIG. 26A illustrates a notebook personal computer, which includes a housing 701, a housing 702, a display portion 703, a keyboard 704, and the like. The semiconductor device described in any of the above embodiments is provided in at least one of the housings 701 and 702. Thus, a notebook personal computer with sufficiently low power consumption, in which writing and reading of data can be performed at high speed and data can be stored for a long time, can be realized.

Figure 26D:
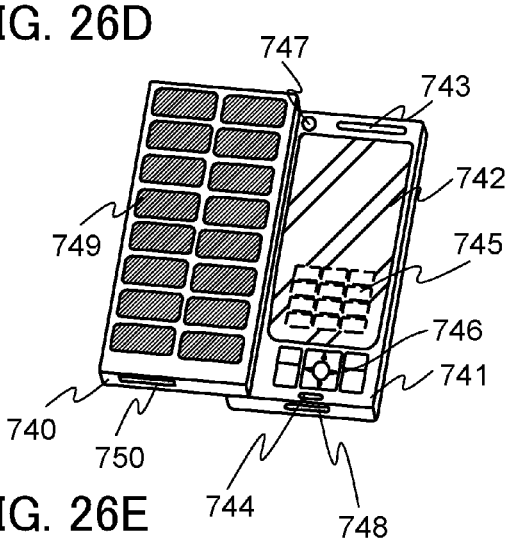
Figure 26B:
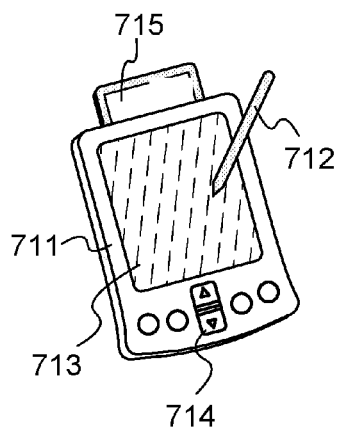

FIG. 26B illustrates a portable information terminal (PDA). A main body 711 is provided with a display portion 713, an external interface 715, operation buttons 714, and the like. Further, a stylus 712 for operation of the portable information terminal, or the like is provided. The semiconductor device described in any of the above embodiments is provided in the main body 711. Thus, a portable information terminal with sufficiently low power consumption, in which writing and reading of data can be performed at high speed and data can be stored for a long time, can be realized.

Figure 26E:
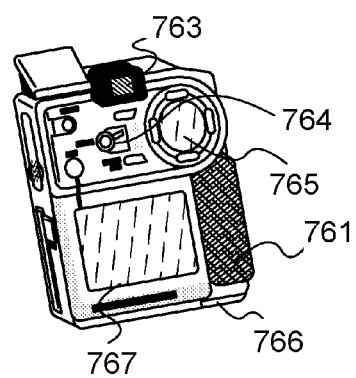
Figure 26C:
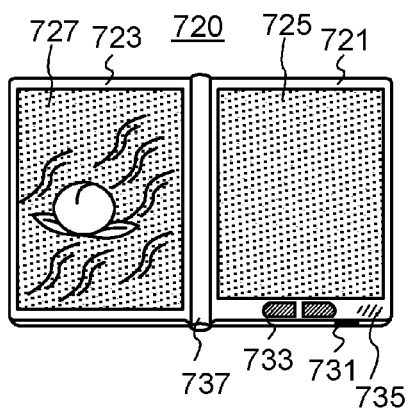

FIG. 26C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book 720 can be opened and closed using the hinge 737 as an axis. In addition, the housing 721 is provided with a power switch 731, operation keys 733, a speaker 735, and the like. At least one of the housings 721 and 723 is provided with the semiconductor device described in any of the above embodiments. Thus, an electronic book with sufficiently low power consumption, in which writing and reading of data can be performed at high speed and data can be stored for a long time, can be realized.

FIG. 26D illustrates a mobile phone set, which includes two housings, a housing 740 and a housing 741. Moreover, the housings 740 and 741 in a state where they are developed as illustrated in FIG. 26D can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. The semiconductor device described in any of the above embodiments is provided in at least one of the housings 740 and 741. Thus, a mobile phone set with sufficiently low power consumption, in which writing and reading of data can be performed at high speed and data can be stored for a long time, can be realized.

FIG. 26E illustrates a digital camera, which includes a main body 761, a display portion 767, an eyepiece 763, an operation switch 764, a display portion 765, a battery 766, and the like. The semiconductor device described in any of the above embodiments is provided in the main body 761. Thus, a digital camera with sufficiently low power consumption, in which writing and reading of data can be performed at high speed and data can be stored for a long time, can be realized.

Figure 26F:
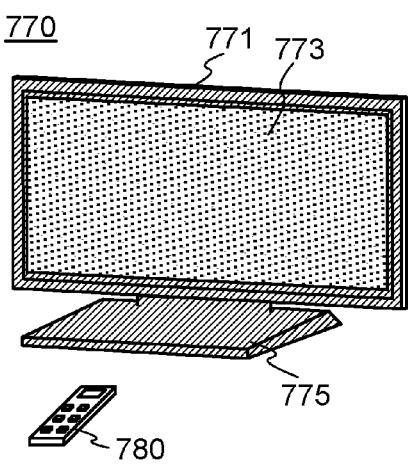

FIG. 26F is a television set 770, which includes a housing 771, a display portion 773, a stand 775, and the like. The television set 770 can be operated with a switch included in the housing 771 or with a remote controller 780. The semiconductor device described in any of the above embodiments is mounted in the housing 771 and the remote controller 780. Thus, a television set with sufficiently low power consumption, in which writing and reading of data can be performed at high speed and data can be stored for a long time, can be realized.

As described above, the electronic devices described in this embodiment each include the semiconductor device according to any of the above embodiments. Therefore, electronic devices with low power consumption can be realized.

Example 1

In this example, results of measuring the off-state current of a transistor including a highly purified oxide semiconductor will be described.

Figure 27:
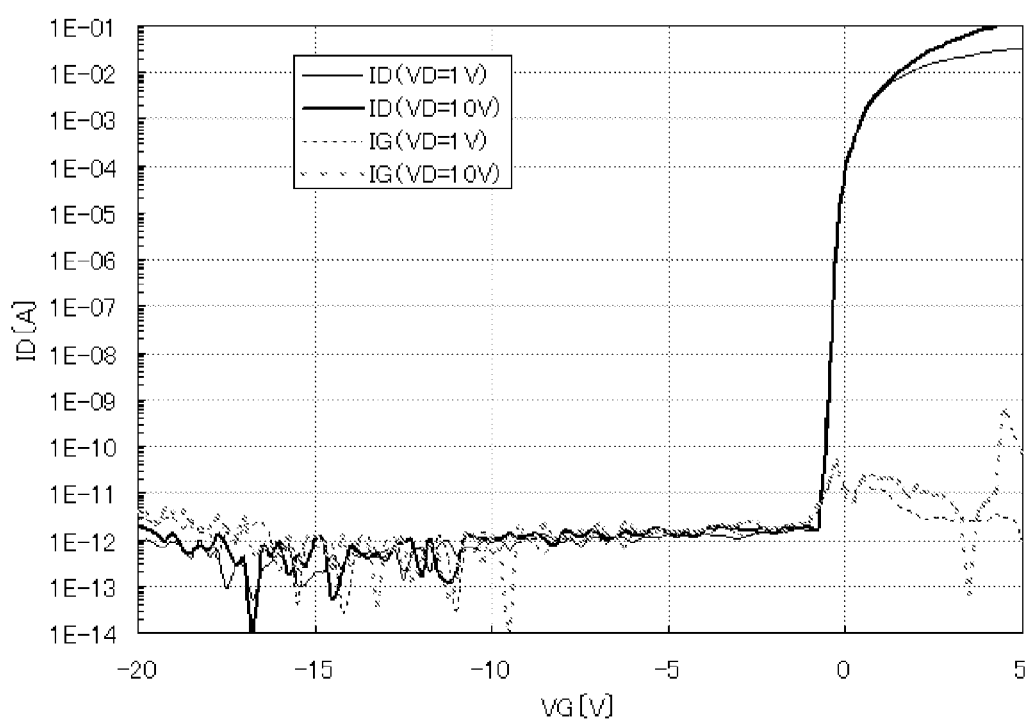
FIG. 27 is a graph showing characteristics of a transistor including an oxide semiconductor.

First, a transistor with a channel width W of 1 m, which is sufficiently wide, was prepared in consideration of a very small off-state current of a transistor including a highly purified oxide semiconductor, and the off-state current was measured. FIG. 27 shows the results of measuring the off-state current of the transistor with a channel width W of 1 m. In FIG. 27, the horizontal axis shows a gate voltage VG and the vertical axis shows a drain current ID. In the case where the drain voltage VD is +1 V or +10 V and the gate voltage VG is within the range of −5 V to −20 V, the off-state current of the transistor is found to be smaller than or equal to $1 \times 10^{-12}$ A which is the detection limit. In addition, the off-state current (per unit channel width (1 µm), here) of the transistor is found to be smaller than or equal to 1 aA/µm ($1 \times 10^{-18}$ A/µm).

Next, the results of more accurately measuring the off-state current of the transistor including a highly purified oxide semiconductor will be described. As described above, the off-state current of the transistor including a highly purified oxide semiconductor is found to be smaller than or equal to $1 \times 10^{-12}$ A which is the detection limit of measurement equipment. Here, the results of measuring more accurate off-state current (a value smaller than or equal to the detection limit of measurement equipment in the above measurement), with the use of an element for characteristic evaluation, will be described.

First, the element for characteristic evaluation which is used in a method for measuring current will be described with reference to FIG. 28.

Figure 28:
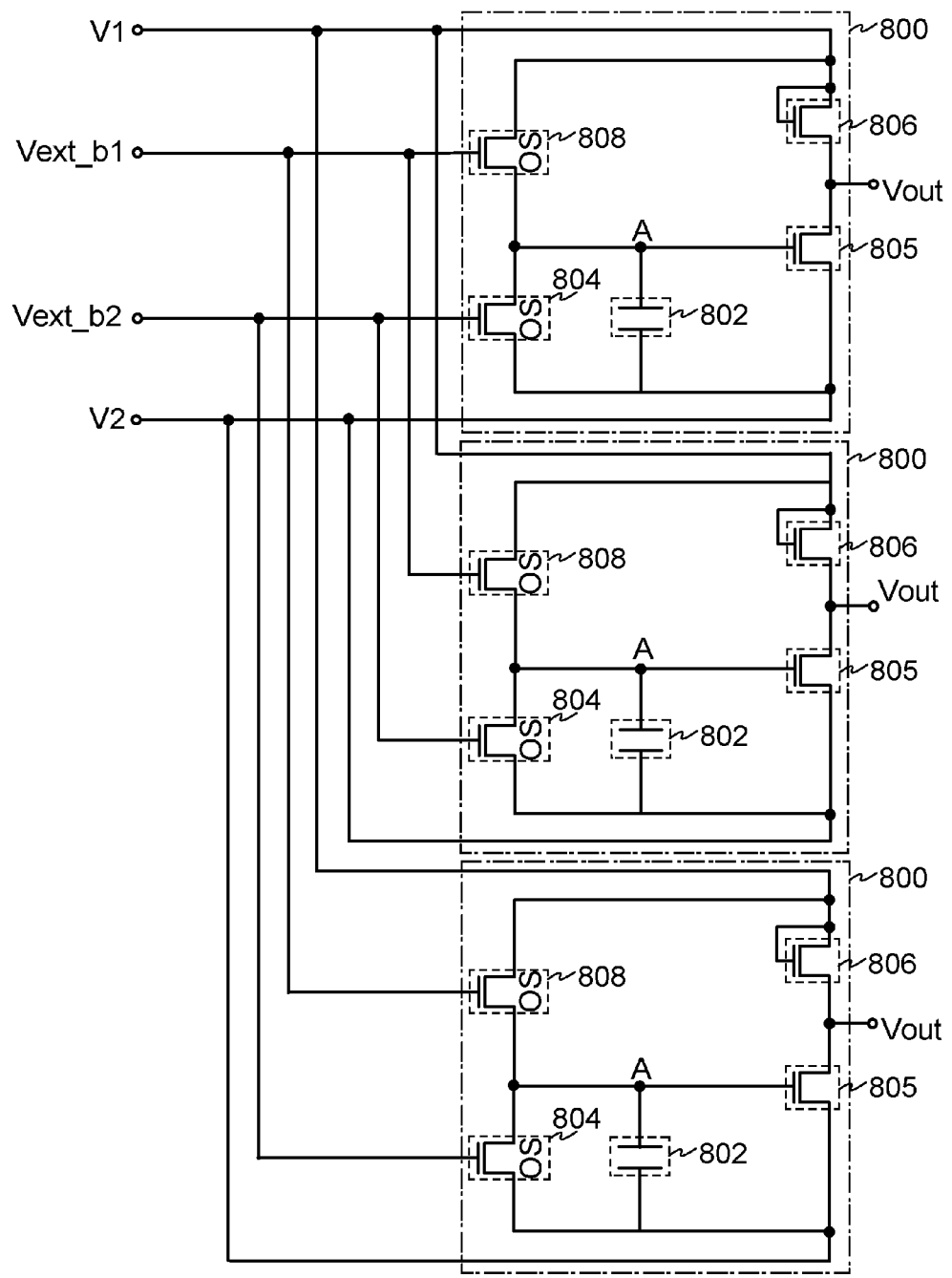
FIG. 28 is a circuit diagram for evaluating characteristics of a transistor including an oxide semiconductor.

In the element for characteristic evaluation in FIG. 28, three measurement systems 800 are connected in parallel. The measurement systems 800 each include a capacitor 802, a transistor 804, a transistor 805, a transistor 806, and a transistor 808. As the transistor 804 and the transistor 808, transistors including a highly purified oxide semiconductor were employed.

In the measurement system 800, one of a source terminal and a drain terminal of the transistor 804, one of terminals of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other of the terminals of the capacitor 802, and a gate terminal of the transistor 805 are connected to one another. The other of the source terminal and the drain terminal of the transistor 808, one of a source terminal and a drain terminal of the transistor 806, and a gate terminal of the transistor 806 are connected to a power source (for supplying V1). The other of the source terminal and the drain terminal of the transistor 805 and the other of the source terminal and the drain terminal of the transistor 806 are connected to each other and connected to an output terminal.

Note that a potential Vext_b2 for controlling whether to turn on or off the transistor 804 is supplied to the gate terminal of the transistor 804, and a potential Vext_b1 for controlling whether to turn on or off the transistor 808 is supplied to the gate terminal of the transistor 808. A potential Vout is output from the output terminal.

Next, a method for measuring current with the use of the element for characteristic evaluation will be described.

First, an initialization period in which a potential difference is generated to measure the off-state current will be briefly described. In the initialization period, the potential Vext_b1 for turning on the transistor 808 is input to the gate terminal of the transistor 808, whereby a potential V1 is supplied to a node A that is connected to the other of the source terminal and the drain terminal of the transistor 804 (that is, the node connected to one of the source terminal and the drain terminal of the transistor 808, the other of the terminals of the capacitor 802, and the gate terminal of the transistor 805). Here, the potential V1 is, for example, a high potential. In addition, the transistor 804 is turned off.

After that, the potential Vext_b1 for turning off the transistor 808 is input to the gate terminal of the transistor 808, so that the transistor 808 is turned off. After the transistor 808 is turned off, the potential V1 is set to a low potential. Still, the transistor 804 is turned off. The potential V2 is equal to the potential V1. Thus, the initialization period is completed. When the initialization period is completed, a potential difference is generated between the node A and one of the source electrode and the drain electrode of the transistor 804. In addition, a potential difference is generated between the node A and the other of the source electrode and the drain electrode of the transistor 808. Accordingly, a small amount of electric charge flows through the transistor 804 and the transistor 808. That is, the off-state current is generated.

Next, a measurement period of the off-state current will be briefly described. In the measurement period, the potential (that is, V2) of one of the source terminal and the drain terminal of the transistor 804 and the potential (that is, V1) of the other of the source terminal and the drain terminal of the transistor 808 are fixed to a low potential. On the other hand, the potential of the node A is not fixed (the node A is in a floating state) in the measurement period. Accordingly, charge flows through the transistor 804, and the amount of charge held at the node A changes over time. The potential of the node A changes depending on the change in the amount of charge held at the node A. That is, the output potential Vout of the output terminal also changes.

Figure 29:
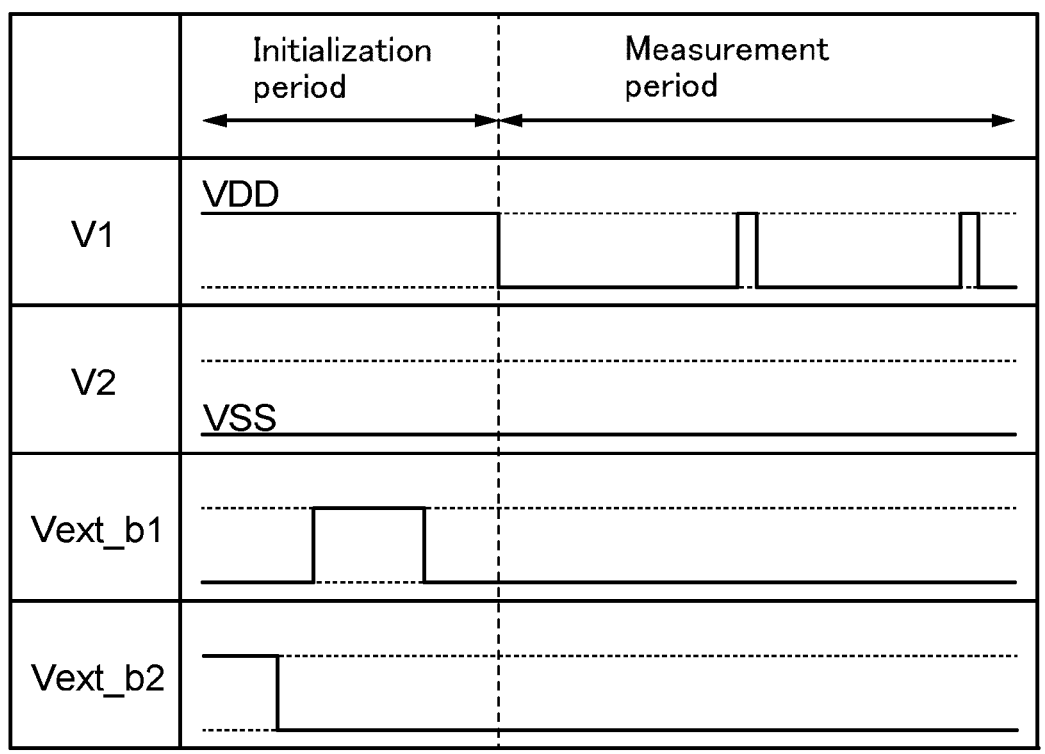
FIG. 29 is a timing chart for evaluating the characteristics of a transistor including an oxide semiconductor.

FIG. 29 shows details (a timing chart) of the relationship among potentials in the initialization period in which the potential difference is generated and those in the following measurement period.

In the initialization period, first, the potential Vext_b2 is set to a potential (a high potential) at which the transistor 804 is turned on. Thus, the potential of the node A becomes V2, that is, a low potential (VSS). Note that it is not essential to supply a low potential (VSS) to the node A. After that, the potential Vext_b2 is set to a potential (a low potential) at which the transistor 804 is turned off, so that the transistor 804 is turned off. Next, the potential Vext_b1 is set to a potential (a high potential) at which the transistor 808 is turned on. Accordingly, the potential of the node A becomes V1, that is, a high potential (VDD). Then, Vext_b1 is set to a potential at which the transistor 808 is turned off, which places the node A in a floating state and finishes the initialization period.

In the measurement period after the initialization period, the potential V1 and the potential V2 are set such that charge flows to the node A or charge flows out of the node A. Here, the potential V1 and the potential V2 are set to a low potential (VSS). Note that at the time when the output potential Vout is measured, it is necessary to operate an output circuit and thus temporarily set V1 to a high potential (VDD) in some cases. Note that the period in which V1 is set to a high potential (VDD) is made short to such a degree that the measurement is not influenced.

When the potential difference is generated and the measurement period is started as described above, the amount of charge held at the node A changes over time, which causes the potential of the node A to change. This means that the potential of the gate terminal of the transistor 805 changes; thus, the output potential Vout of the output terminal also changes over time.

A method for calculating the off-state current on the basis of the obtained output potential Vout is described below.

The relationship between a potential $V_A$ of the node A and the output potential Vout is obtained before calculation of the off-state current. With this relationship, the potential $V_A$ of the node A can be obtained using the output potential Vout. In accordance with the above relationship, the potential $V_A$ of the node A can be expressed as a function of the output potential Vout by the following equation.

$$V_A = F(Vout) \quad \text{[FORMULA 1]}$$

Charge $Q_A$ of the node A can be expressed by the following equation with the use of the potential $V_A$ of the node A, capacitance $C_A$ connected to the node A, and a constant (const). Here, the capacitance $C_A$ connected to the node A is the sum of the capacitance of the capacitor 802 and other capacitance.

$$Q_A = C_A V_A + \text{const} \quad \text{[FORMULA 2]}$$

Current $I_A$ of the node A is a time derivative of charge which flows to the node A (or charge which flows out of the node A), and is thus expressed by the following equation.

$$I_A \equiv \frac{\Delta Q_A}{\Delta t} = \frac{C_A \cdot \Delta F(Vout)}{\Delta t} \quad \text{[FORMULA 3]}$$

In this manner, the current $I_A$ of the node A can be obtained from the capacitance $C_A$ connected to the node A and the output potential Vout of the output terminal.

In accordance with the above method, it is possible to measure leakage current (off-state current) which flows between a source and a drain of a transistor in an off state.

In this example, the transistor 804, the transistor 805, the transistor 806, and the transistor 808 were manufactured using a purified oxide semiconductor with a channel length L of 10 μm and a channel width W of 50 μm. In addition, in the measurement systems 800 which are arranged in parallel, the capacitances of the capacitors 802 were 100 fF, 1 pF, and 3 pF.

Note that VDD was 5 V and VSS was 0 V in the measurement of this example. In the measurement period, Vout was measured while the potential V1 was basically set to VSS and changed to VDD for 100 msec at intervals of 10 sec to 300 sec. In addition, Δt used in calculation of current I which flows through the element was approximately 30000 sec.

Figure 30:
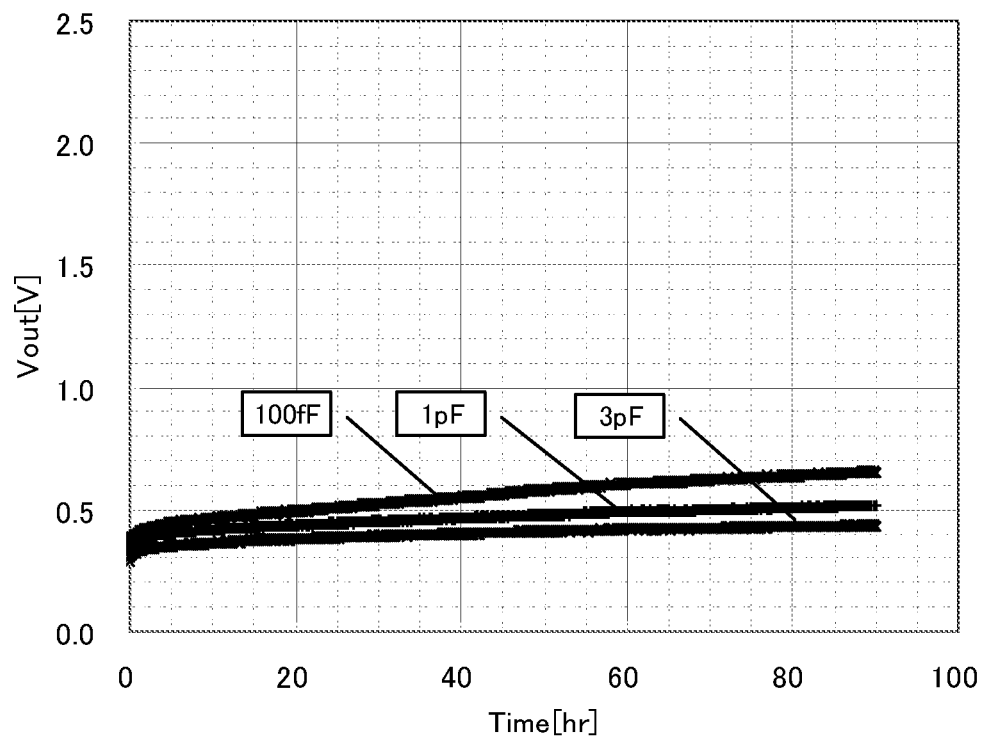
FIG. 30 is a graph showing characteristics of a transistor including an oxide semiconductor.

FIG. 30 shows the relationship between the elapsed time Time in the above current measurement and the output potential Vout. It can be confirmed from FIG. 30 that the potential changes as time elapses.

Figure 31:
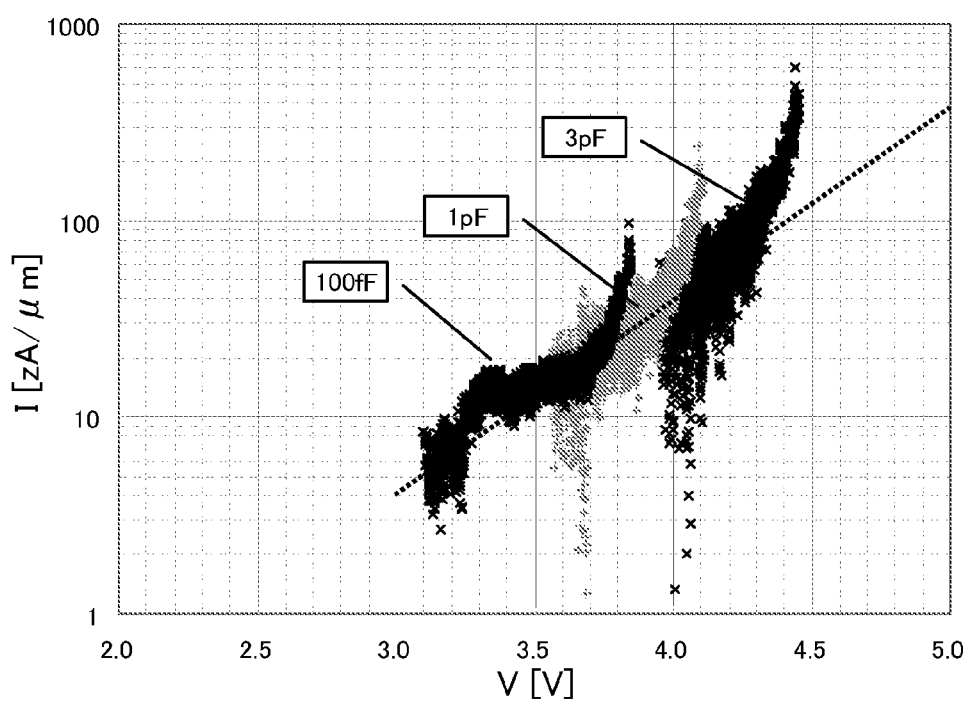
FIG. 31 is a graph showing characteristics of a transistor including an oxide semiconductor.

FIG. 31 shows the off-state current at room temperature (25° C.) which is calculated in the above current measurement. Note that FIG. 31 shows the relationship between the source-drain voltage V and the off-state current I. It is found from FIG. 31 that the off-state current is about 40 zA/μm under the condition where the source-drain voltage is 4 V. It is also found that the off-state current is smaller than or equal to 10 zA/μm under the condition where the source-drain voltage is 3.1 V. Note that 1 zA represents $10^{-21}$ A.

Figure 32:
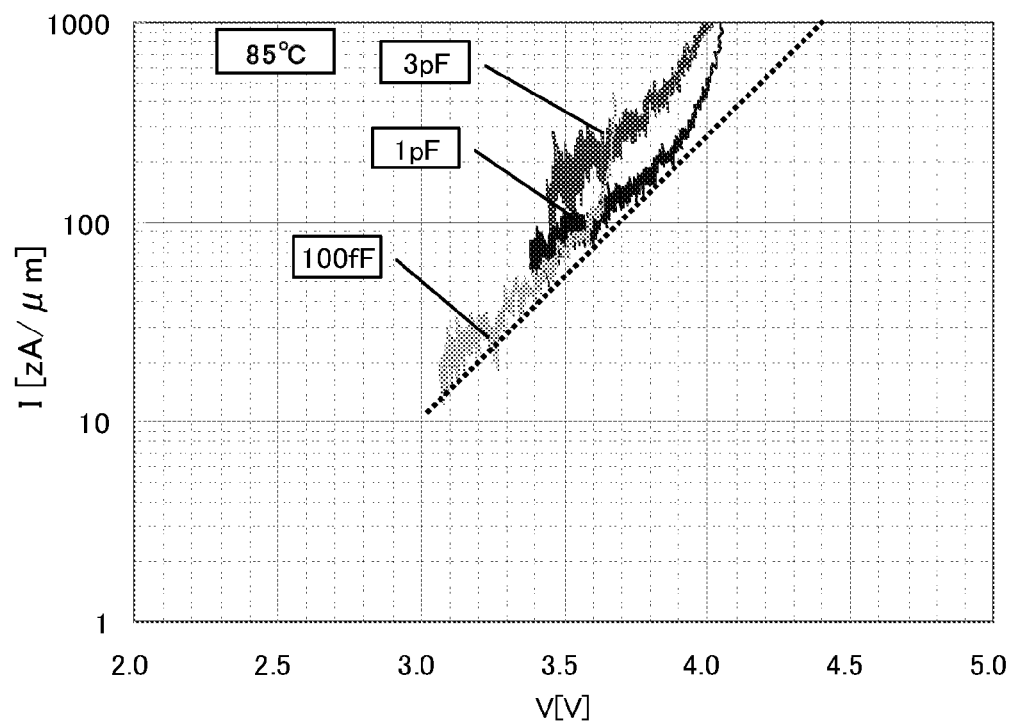
FIG. 32 is a graph showing characteristics of a transistor including an oxide semiconductor.

Furthermore, FIG. 32 shows the off-state current in an environment at a temperature of 85° C., which is calculated in the above current measurement. FIG. 32 shows the relationship between the source-drain voltage V and the off-state current I in an environment at a temperature of 85° C. It is found from FIG. 32 that the off-state current is smaller than or equal to 100 zA/μm under the condition where the source-drain voltage is 3.1 V.

As described above, it is confirmed from this example that the off-state current of a transistor including a highly purified oxide semiconductor is sufficiently small.

Example 2

The number of times the memory cell according to an embodiment of the disclosed invention can rewrite data was examined. In this example, the examination results will be described with reference to FIGS. 33A to 33C.

A semiconductor device used for the examination is the semiconductor device having the circuit configuration in FIG. 1A-1. Here, an oxide semiconductor was used for a transistor corresponding to the transistor 162. A capacitor with a capacitance of 0.33 pF was used as a capacitor corresponding to the capacitor 164.

Data was held by and written to the memory cell by applying 0 V or 5 V to a wiring corresponding to the third wiring in FIG. 1A-1 and applying 0 V or 5 V to a wiring corresponding to the fourth wiring. When the potential of the wiring corresponding to the fourth wiring is 0 V, the transistor (a transistor for writing) corresponding to the transistor 162 is turned off; thus, a potential supplied to the node FG is held. When the potential of the wiring corresponding to the fourth wiring is 5 V, the transistor corresponding to the transistor 162 is turned on; thus, a potential of the wiring corresponding to the third wiring is supplied to the node FG.

Figure 33A:
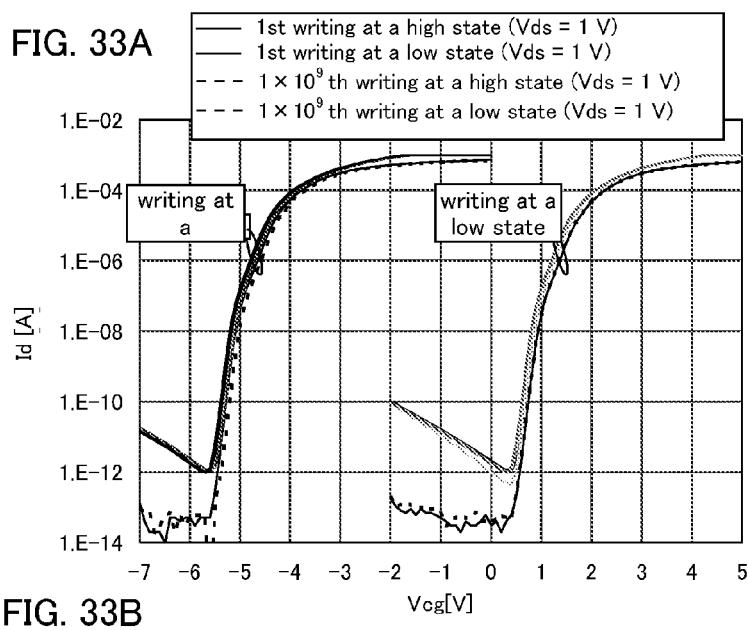
FIGS. 33A to 33C are graphs showing evaluation results of a memory window width.

FIG. 33A shows curves (Vcg-Id curves) of the relation between a potential Vcg of a wiring corresponding to the fifth wiring and a drain current Id of a transistor (a read transistor) corresponding to the transistor 160 before and after $1 \times 10^9$ times of writing. In FIG. 33A, "writing in a low state" indicates that 0 V is applied to the node FG whereas "writing in a high state" indicates that 5 V is applied to the node FG. Note that in FIG. 33A, the horizontal axis shows Vcg (V) and the vertical axis shows Id (A).

As shown in FIG. 33A, there is almost no difference between the Vcg-Id curves before and after $1 \times 10^9$ times of writing either in L writing or H writing. In addition, there is almost no difference between the shift amount (ΔVcg) between the Vcg-Id curves in L writing and in H writing before $1 \times 10^9$ times of writing and the shift amount after $1 \times 10^9$ times of writing.

Figure 33B:
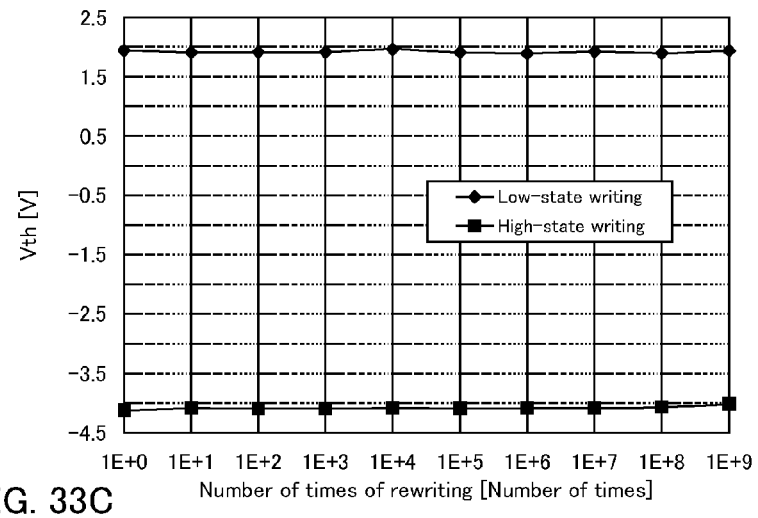

FIG. 33B illustrates the relationship between the potential of the wiring corresponding to the fifth wiring which is needed to turn on the transistor 160 in H wiring and L writing, and the number of times of rewriting. In FIG. 33B, the horizontal axis shows the number of times of rewriting and the vertical axis shows the potential of the wiring corresponding to the fifth wiring, that is, the apparent threshold voltage $V_{th}$ (V) of the transistor 160.

Note that a threshold voltage can be generally obtained by the tangent method. Specifically, in the graph where the horizontal axis shows the gate voltage Vg and the vertical axis shows the square root of the drain current Id, the tangent to the point of maximum slope of the curve is obtained. The horizontal axis (the value of the gate voltage Vg) intercept of the tangent is the threshold voltage $V_{th}$. Also in FIG. 33B, the apparent threshold voltage $V_{th}$ was obtained by the tangent method.

The memory window widths obtained from FIG. 33B are given in Table 1. Note that the memory window width, which was obtained by calculation, is the difference between the apparent threshold voltage $V_{th\_H}$ of the transistor 160 in H writing and the apparent threshold voltage $V_{th\_L}$ of the transistor 160 mL writing.

TABLE 1

| number of write cycles | 1.E+00 | 1.E+01 | 1.E+02 | 1.E+03 | 1.E+04 |
|---|---|---|---|---|---|
| memory window width | 6.06 | 6.00 | 6.01 | 6.01 | 6.04 |
| number of write cycles | 1.E+05 | 1.E+06 | 1.E+07 | 1.E+08 | 1.E+09 |
| memory window width | 6.00 | 5.98 | 6.01 | 5.96 | 5.96 |

As is seen in Table 1, in the memory cell of this example, the difference between the memory window widths before and after $1 \times 10^9$ times of writing is 2% or less, specifically 1.68%. Therefore, it is found that the semiconductor device is not deteriorated at least by $1 \times 10^9$ times of writing.

Figure 33C:
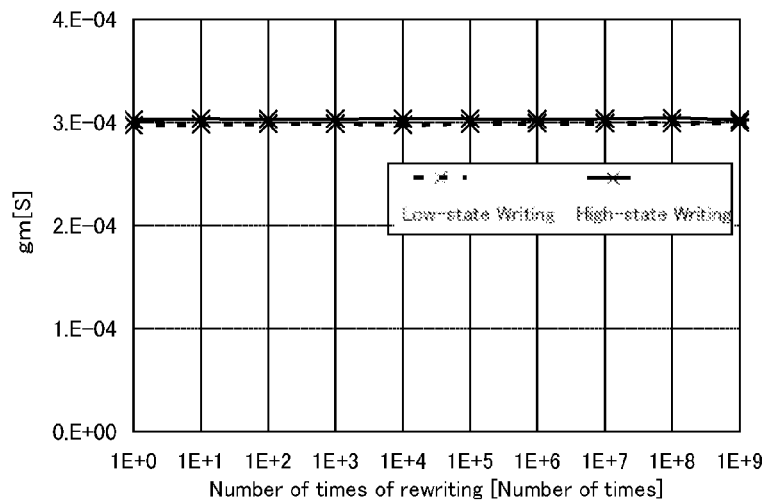

FIG. 33C shows the relationship between the number of times of rewriting and the mutual conductance (gm) of the memory cell. In FIG. 33C, the horizontal axis shows the number of times of rewriting, and the vertical axis shows the mutual conductance (gm).

A decrease in the mutual conductance (gm) of the memory cell has an influence such as difficulty in discrimination between a written state and an erased state. As shown in FIG. 33C, it is found that hardly any change in gm of the memory cell of this example can be observed even after $10^9$ times of rewriting. Thus, the semiconductor device according to this example is a highly reliable semiconductor device which is not deteriorated even by $10^9$ times of rewriting.

As described above, characteristics of the memory cell according to one embodiment of the disclosed invention are not changed even when storing and writing of data are repeated as many as $10^9$ times, and the memory cell has extremely high writing durability. That is, it can be said that a memory cell having excellent reliability and a semiconductor device which incorporates the memory cell and has excellent reliability are realized according to an embodiment of the disclosed invention.

Example 3

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as $$\mu = \mu_0 \exp\left(-\frac{E}{kT}\right).$$ [FORMULA 5]

Here, E represents the height of the potential barrier, k represents the Boltzmann constant, and T represents the absolute temperature. When the potential barrier is assumed to be attributed to a defect, the height of the potential barrier can be expressed as $$E = \frac{e^2 N^2}{8\varepsilon n} = \frac{e^3 N^2 t}{8\varepsilon C_{ox} V_g}$$ [FORMULA 6]

according to the Levinson model.

Here, e represents the elementary charge, N represents the average defect density per unit area in a channel, ∈ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as $$I_d = \frac{W\mu V_g V_d C_{ox}}{L}\exp\left(-\frac{E}{kT}\right).$$ [FORMULA 7]

Here, L represents the channel length and W represents the channel width, and L and W are each 10 μm. In addition, $V_d$ represents the drain voltage. When dividing both sides of the above equation by $V_g$ and then taking logarithms of both sides, the formula is $$\ln\left(\frac{I_d}{V_g}\right) = \ln\left(\frac{W\mu V_d C_{ox}}{L}\right) - \frac{E}{kT}$$ [FORMULA 8]
$$= \ln\left(\frac{W\mu V_d C_{ox}}{L}\right) - \frac{e^3 N^2 t}{8kT\varepsilon C_{ox} V_g}.$$

The right side of Formula 8 is a function of $V_g$. From the formula, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm$^2$/Vs from Formula 5 and Formula 6. The measured mobility of an In—Sn—Zn oxide including a defect is approximately 40 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed as $$\frac{1}{\mu_1} = \frac{1}{\mu_0} + \frac{D}{B}\exp\left(-\frac{x}{l}\right).$$ [FORMULA 9]

Here, D represents the electric field in the gate direction, and B and l are constants. B and l can be obtained from actual measurement results; according to the above measurement results, B is 4.75×10$^7$ cm/s and l is 10 nm (the depth to which the influence of interface scattering reaches). When D is increased (i.e., when the gate voltage is increased), the second term of Formula 9 is increased and accordingly the mobility $\mu_1$ is decreased.

Figure 38:
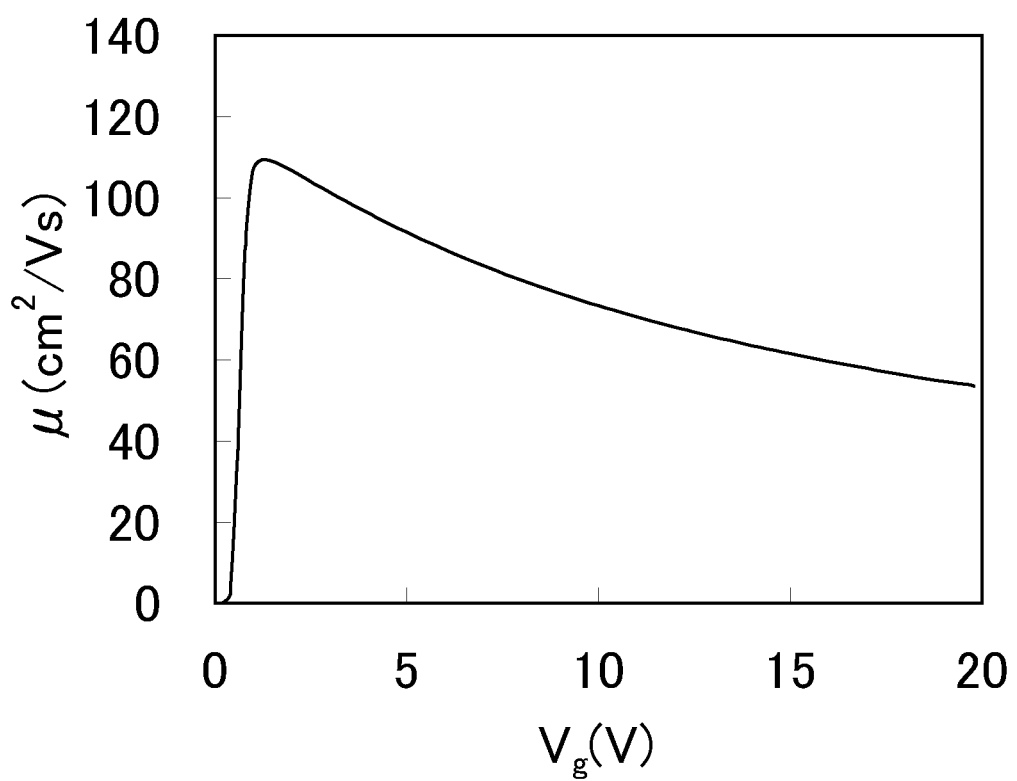
FIG. 38 shows gate voltage dependence of mobility obtained by calculation.

Calculation results of the mobility $\mu_2$ of a transistor whose channel includes an ideal oxide semiconductor without a defect inside the semiconductor are shown in FIG. 38. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 38, the mobility has a peak of more than 100 cm$^2$/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 39A to 39C, FIGS. 40A to 40C, and FIGS. 41A to 41C. FIGS. 42A and 42B illustrate cross-sectional structures of the transistors used for the calculation. The transistors illustrated in FIGS. 42A and 42B each include a semiconductor region 103a and a semiconductor region 103c which have n$^+$-type conductivity in an oxide semiconductor layer. The resistivity of the semiconductor region 103a and the semiconductor region 103c are 2×10$^{-3}$ Ωcm.

The transistor illustrated in FIG. 42A is formed over a base insulating layer 101 and an embedded insulator 102 which is embedded in the base insulating layer 101 and formed of aluminum oxide. The transistor includes the semiconductor region 103a, the semiconductor region 103c, an intrinsic semiconductor region 103b serving as a channel formation region therebetween, and a gate 105. The width of the gate 105 is 33 nm.

A gate insulating film 104 is formed between the gate 105 and the semiconductor region 103b. In addition, a sidewall insulator 106a and a sidewall insulator 106b are formed on both side surfaces of the gate 105, and an insulator 107 is formed over the gate 105 so as to prevent a short circuit between the gate 105 and another wiring. The sidewall insulator has a width of 5 nm. A source 108a and a drain 108b are provided in contact with the semiconductor region 103a and the semiconductor region 103c, respectively. Note that the channel width of this transistor is 40 nm.

The transistor of FIG. 42B is the same as the transistor of FIG. 42A in that it is formed over the base insulating layer 101 and the embedded insulator 102 formed of aluminum oxide and that it includes the semiconductor region 103a, the semiconductor region 103c, the intrinsic semiconductor region 103b provided therebetween, the gate 105 having a width of 33 nm, the gate insulating film 104, the sidewall insulator 106a, the sidewall insulator 106b, the insulator 107, the source 108a, and the drain 108b.

The transistor illustrated in FIG. 42A is different from the transistor illustrated in FIG. 42B in the conductivity type of semiconductor regions under the sidewall insulator 106a and the sidewall insulator 106b. In the transistor illustrated in FIG. 42A, the semiconductor regions under the sidewall insulator 106a and the sidewall insulator 106b are part of the semiconductor region 103a and the semiconductor region 103c having n$^+$-type conductivity, whereas in the transistor illustrated in FIG. 42B, the semiconductor regions under the sidewall insulator 106a and the sidewall insulator 106b are part of the intrinsic semiconductor region 103b. In other words, a region having a width of $L_{off}$ which overlaps with neither the semiconductor region 103a (the semiconductor region 103c) nor the gate 105 is provided. This region is called an offset region, and the width $L_{off}$ is called an offset length. As is seen from the drawing, the offset length is equal to the width of the sidewall insulator 106a (the sidewall insulator 106b).

Figure 39A:
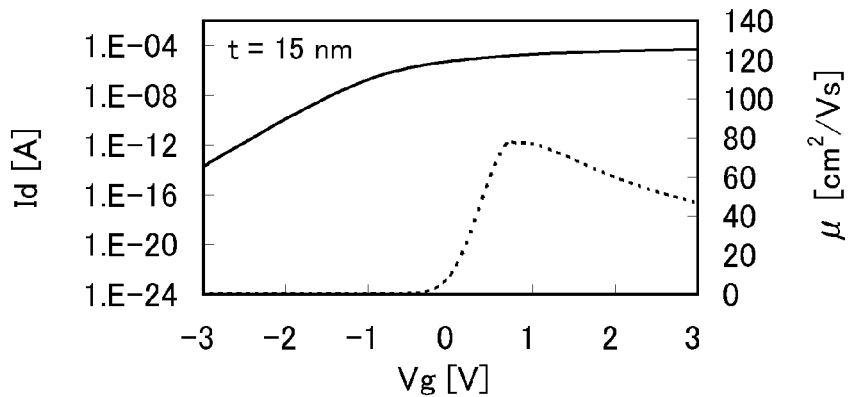
FIGS. 39A to 39C show gate voltage dependence of drain current and mobility obtained by calculation.
Figure 39B:
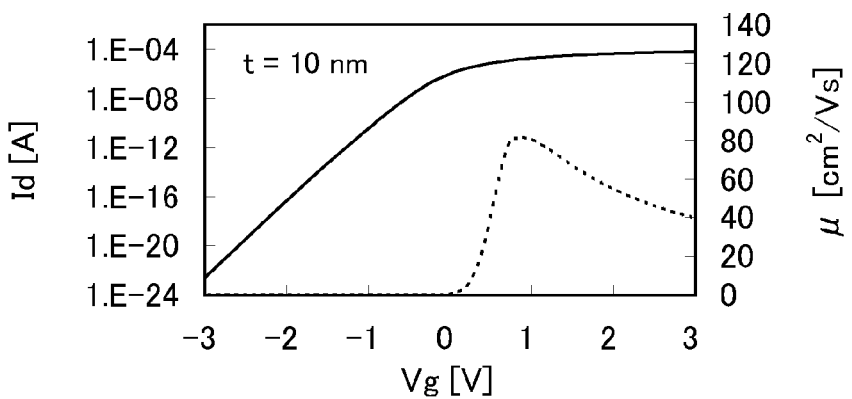
Figure 39C:
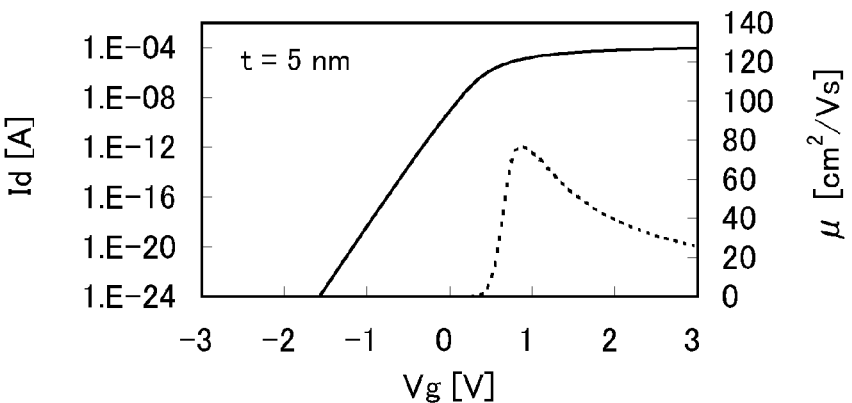

The other parameters used in calculation are as described above. For the calculation, device simulation software Sentaurus Device manufactured by Synopsys, Inc. was used. FIGS. 39A to 39C show the gate voltage ($V_g$: a potential difference between the gate and the source) dependence of the drain current ($I_d$, a solid line) and the mobility (μ, a dotted line) of the transistor having the structure illustrated in FIG. 42A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 39A shows the gate voltage dependence of the transistor in the case where the thickness of the gate insulating film is 15 nm, FIG. 39B shows that of the transistor in the case where the thickness of the gate insulating film is 10 nm, and FIG. 39C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the mobility μ and the drain current $I_d$ (on-state current) in an on state. The graphs show that the drain current exceeds 10 μA, at a gate voltage of around 1 V.

Figure 40A:
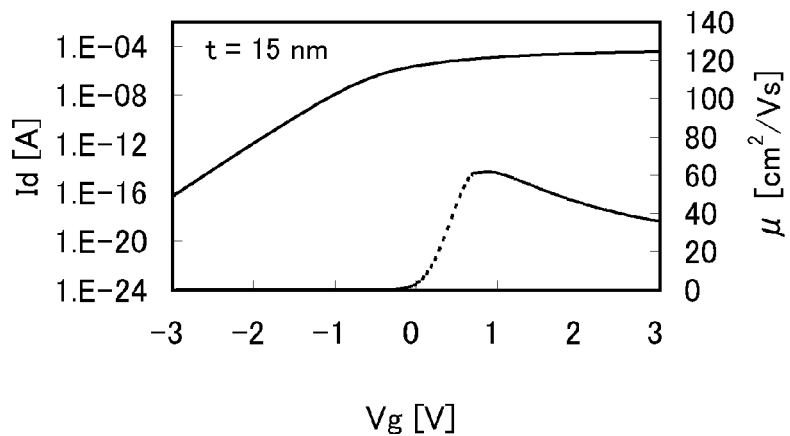
FIGS. 40A to 40C show gate voltage dependence of drain current and mobility obtained by calculation.
Figure 40B:
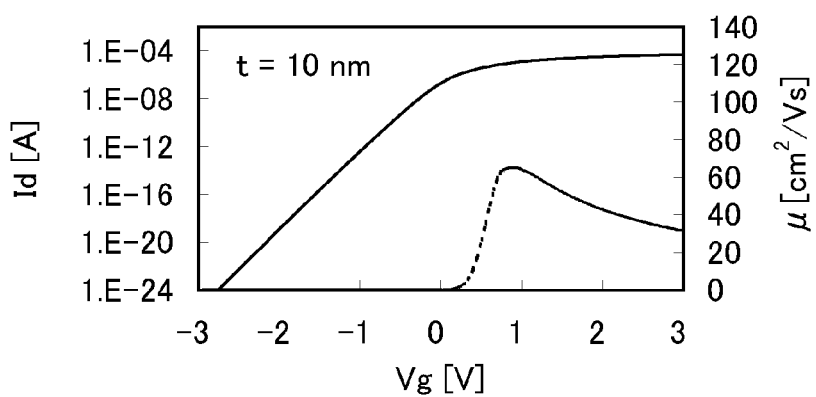
Figure 40C:
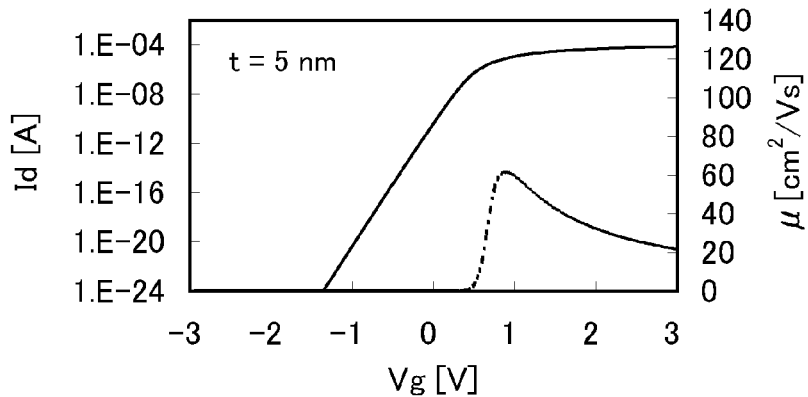

FIGS. 40A to 40C show the gate voltage $V_g$ dependence of the drain current $I_d$ (a solid line) and the mobility μ (a dotted line) of the transistor having the structure illustrated in FIG. 42B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 40A shows the gate voltage dependence of the transistor in the case where the thickness of the gate insulating film is 15 nm, FIG. 40B shows that of the transistor in the case where the thickness of the gate insulating film is 10 nm, and FIG. 40C shows that of the transistor in the case where the thickness of the gate insulating film is 5 nm.

Figure 41A:
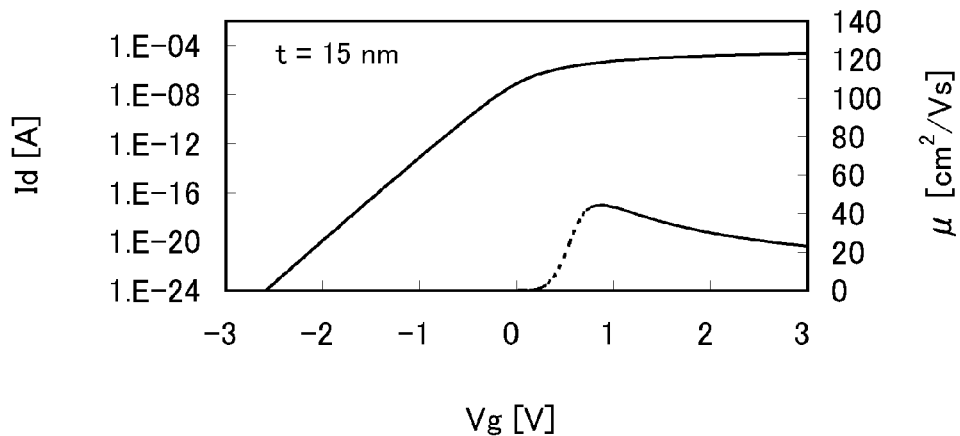
FIGS. 41A to 41C show gate voltage dependence of drain current and mobility obtained by calculation.
Figure 41B:
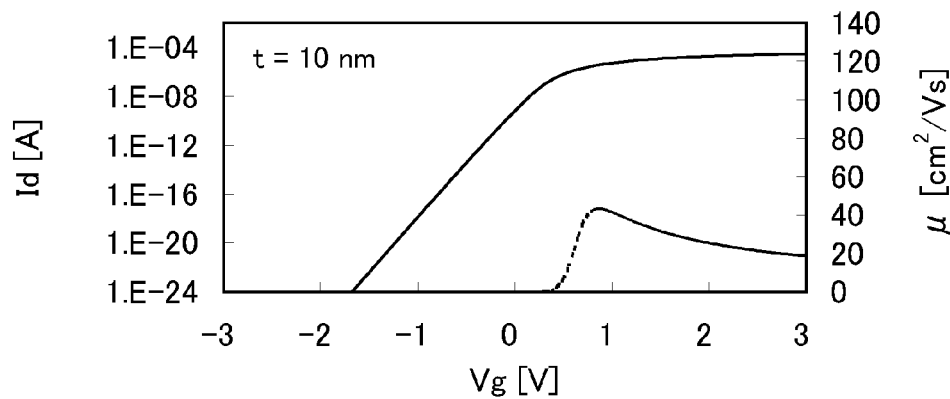
Figure 41C:
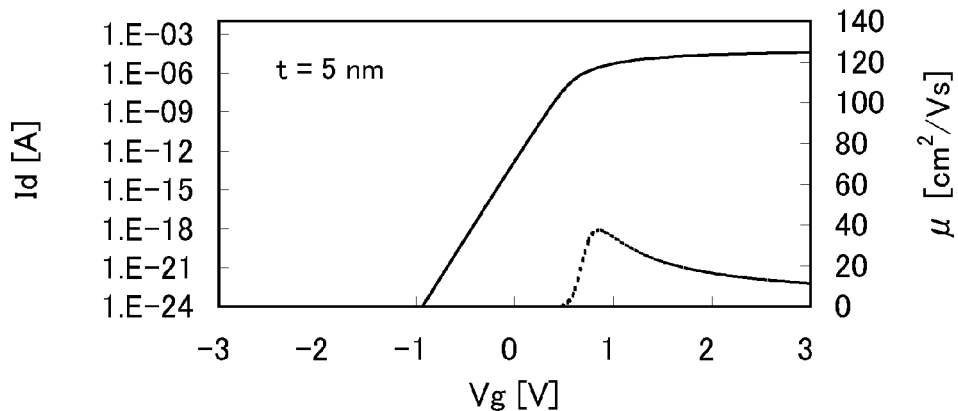
Figure 42A:
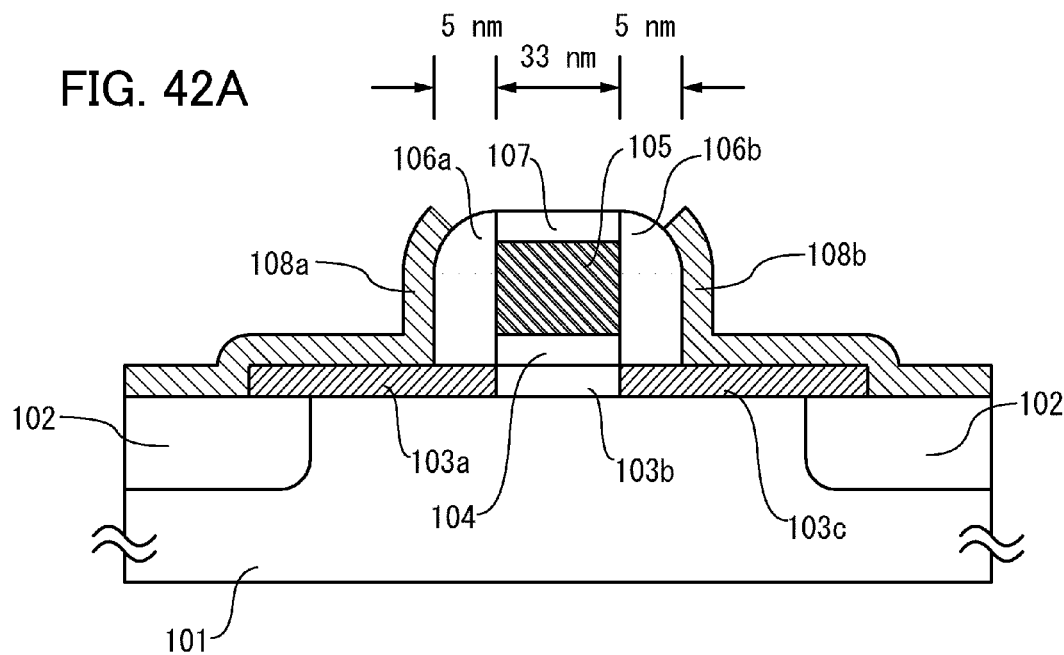
FIGS. 42A and 42B illustrate cross-sectional structures of transistors used for calculation.
Figure 42B:
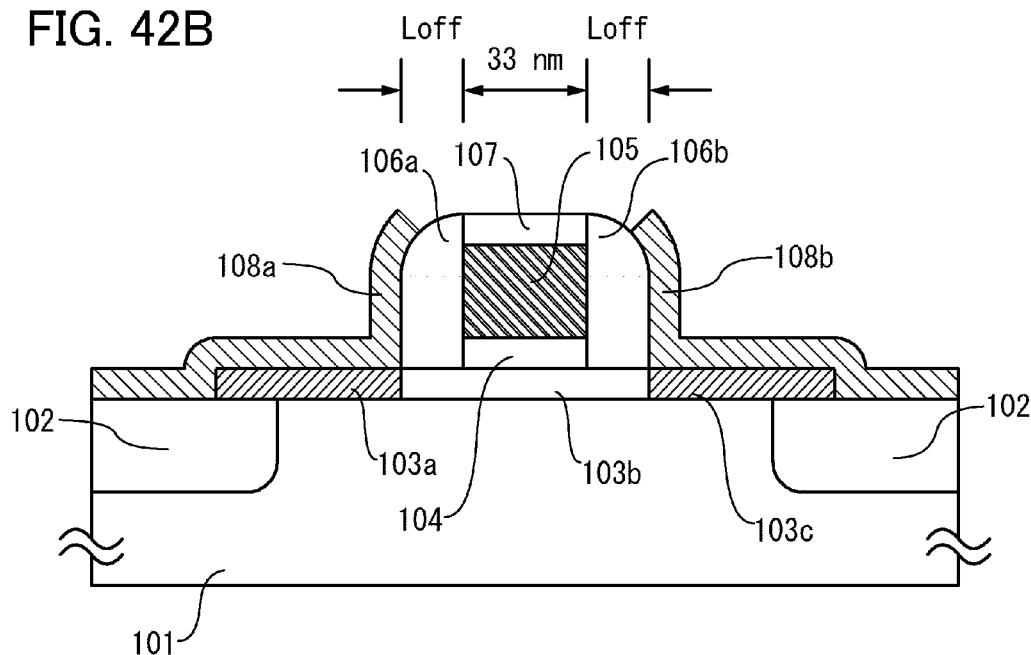

Further, FIGS. 41A to 41C show the gate voltage dependence of the drain current $I_d$ (a solid line) and the mobility μ (a dotted line) of the transistor having the structure illustrated in FIG. 42B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 41A shows the gate voltage dependence of the transistor in the case where the thickness of the gate insulating film is 15 nm, FIG. 41B shows that of the transistor in the case where the thickness of the gate insulating film is 10 nm, and FIG. 41C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/Vs in FIGS. 39A to 39C, approximately 60 cm$^2$/Vs in FIGS. 40A to 40C, and approximately 40 cm$^2$/Vs in FIGS. 41A to 41C; thus, the peak of the mobility μ is decreased as the offset length $L_{off}$ is increased. Further, such a tendency applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Example 4

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 43:
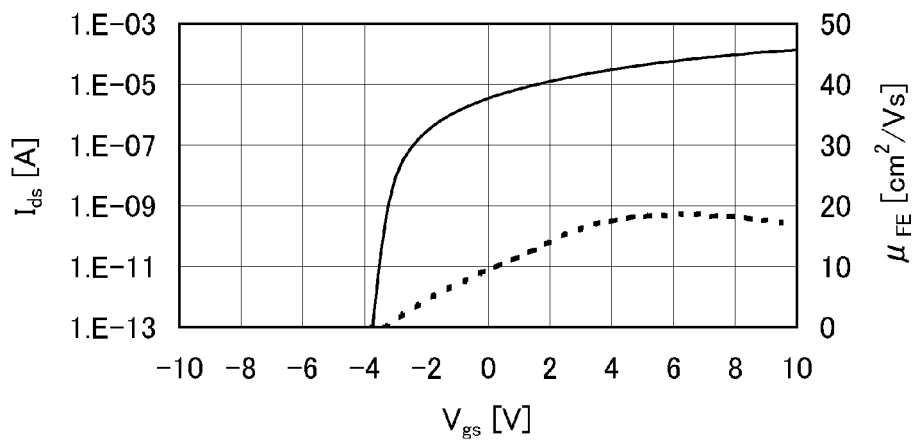
FIG. 43 is a graph showing characteristics of a transistor including an oxide semiconductor.
Figure 44:
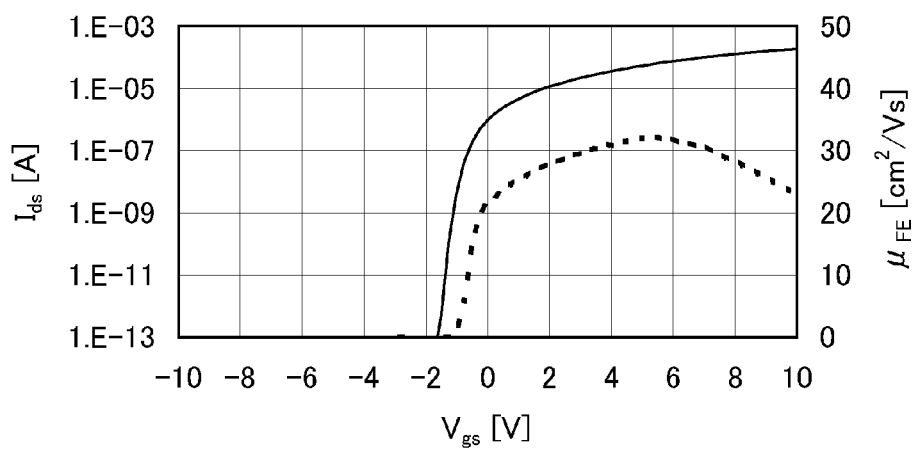
FIG. 44 is a graph showing characteristics of a transistor including an oxide semiconductor.
Figure 45:
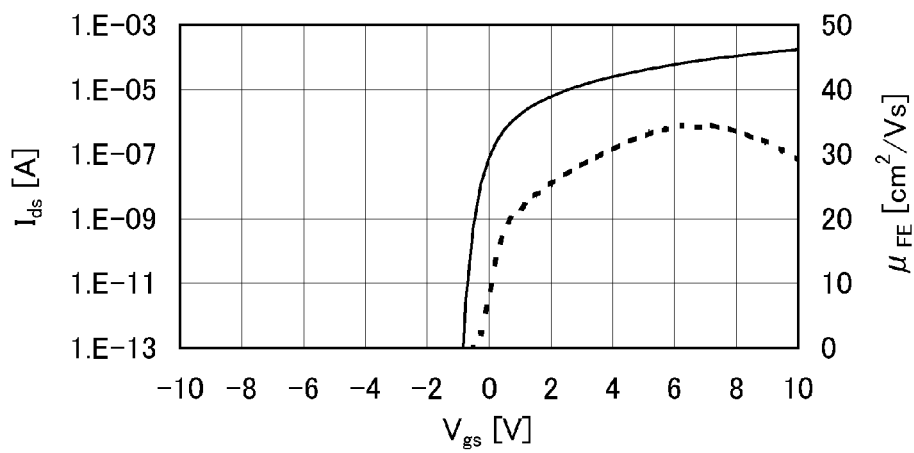
FIG. 45 is a graph showing characteristics of a transistor including an oxide semiconductor.

As an example, FIGS. 43 to 45 each show characteristics of a transistor in which an oxide semiconductor film including In, Sn, and Zn as main components and having a channel length L of 3 μm and a channel width W of 10 μM, and a gate insulating film with a thickness of 100 nm are used. Note that $V_d$ was set to 10 V.

FIG. 43 shows characteristics of a transistor whose oxide semiconductor film including In, Sn, and Zn as main components was formed by a sputtering method without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 44 shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components.

FIG. 45 shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIG. 43 and FIG. 44.

Note that the threshold voltage can also be controlled by changing the ratio of In, Sn, and Zn; when the composition ratio of In, Sn, and Zn is 2:1:3, a normally off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_{ds}$ of 10 V. Note that $V_{ds}$ refers to a drain voltage (a potential difference between a drain and a source). Then, the substrate temperature was set to 150° C. and $V_{ds}$ was set to 0.1 V. After that, 20 V of $V_g$ was applied so that the intensity of an electric field applied to a gate insulating film 608 was 2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a positive BT test.

In a similar manner, first, $V_g$-$I_d$ characteristics of the transistors were measured at a substrate temperature of 25° C. and $V_{ds}$ of 10 V. Then, the substrate temperature was set at 150° C. and $V_{ds}$ was set to 0.1 V. After that, −20 V of $V_g$ was applied so that the intensity of an electric field applied to the gate insulating film 608 was −2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a negative BT test.

Figure 46A:
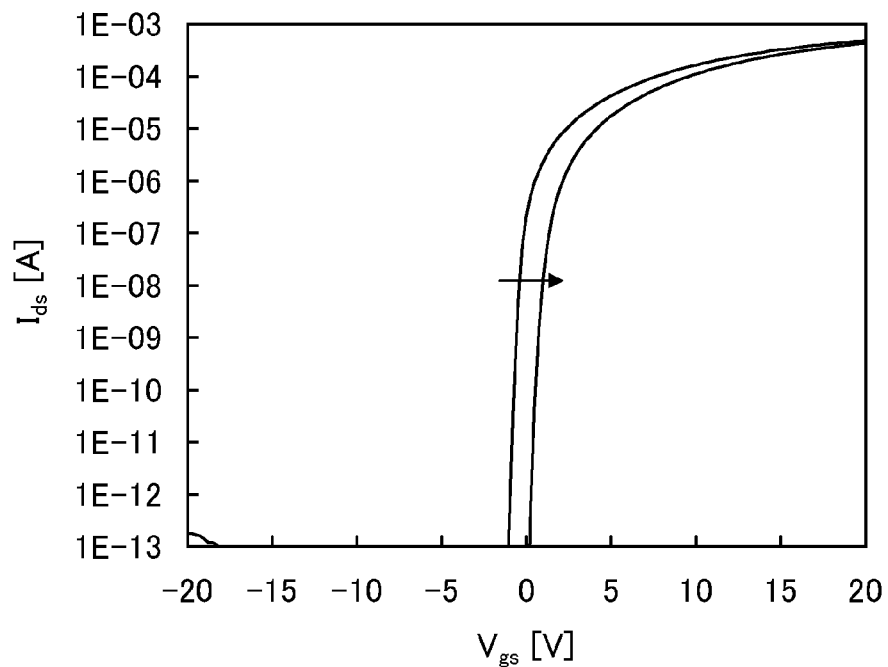
FIGS. 46A and 46B are graphs showing characteristics of a transistor including an oxide semiconductor.
Figure 46B:
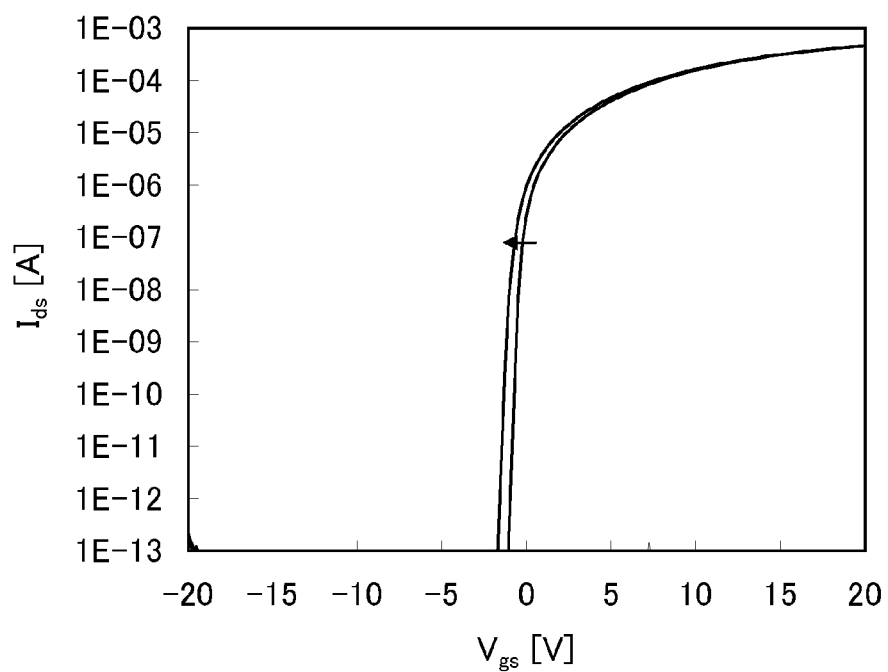
Figure 47A:
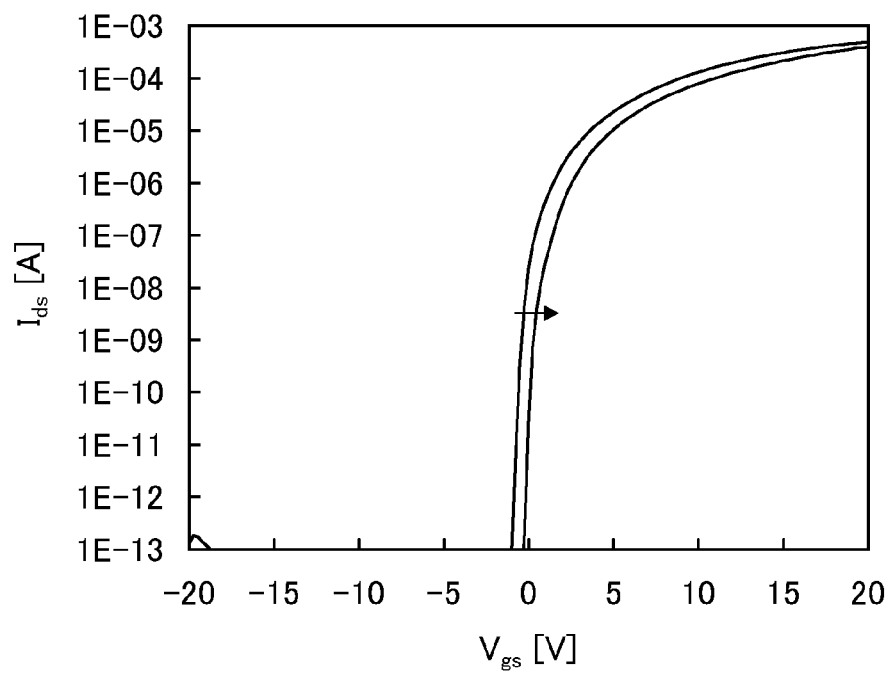
FIGS. 47A and 47B are graphs showing characteristics of a transistor including an oxide semiconductor.
Figure 47B:
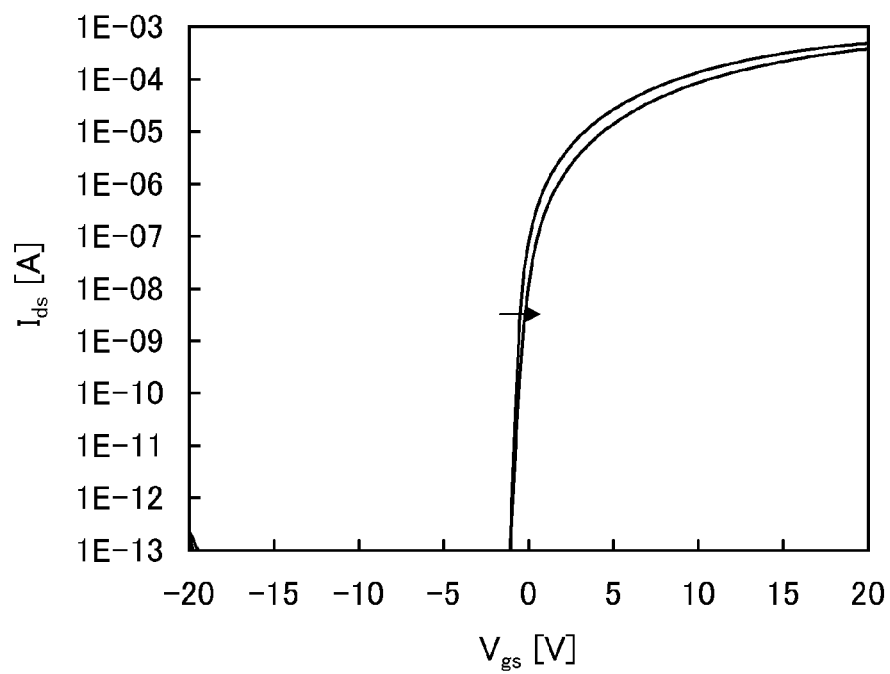

FIGS. 46A and 46B show a result of the positive BT test of Sample 1 and a result of the negative BT test of Sample 1, respectively. FIGS. 47A and 47B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing between lattices. When the concentration of excess oxygen is set to higher than or equal to $1\times10^{16}$/cm$^3$ and lower than or equal to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis were performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target of In:Sn:Zn=1:1:1 [atomic ratio] was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 48:
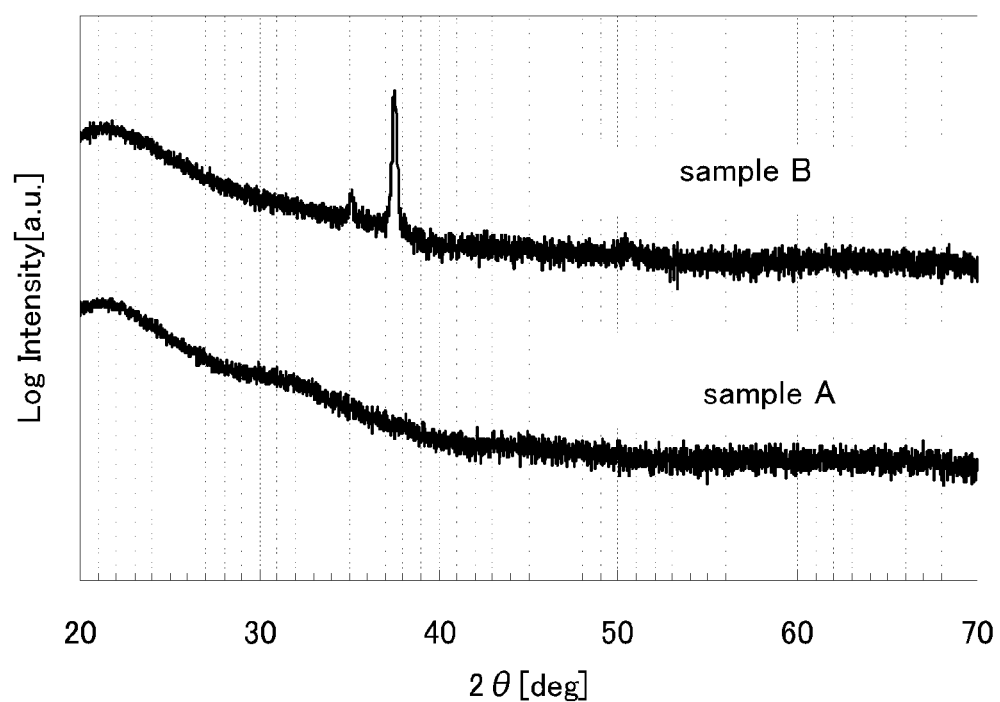
FIG. 48 is an XRD spectrum of an oxide semiconductor.

FIG. 48 shows XRD spectra of Sample A and Sample B. No peak derived from crystal was observed in Sample A, whereas peaks derived from crystal were observed when 2θ was around 35 deg and 37 deg to 38 deg in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 49:
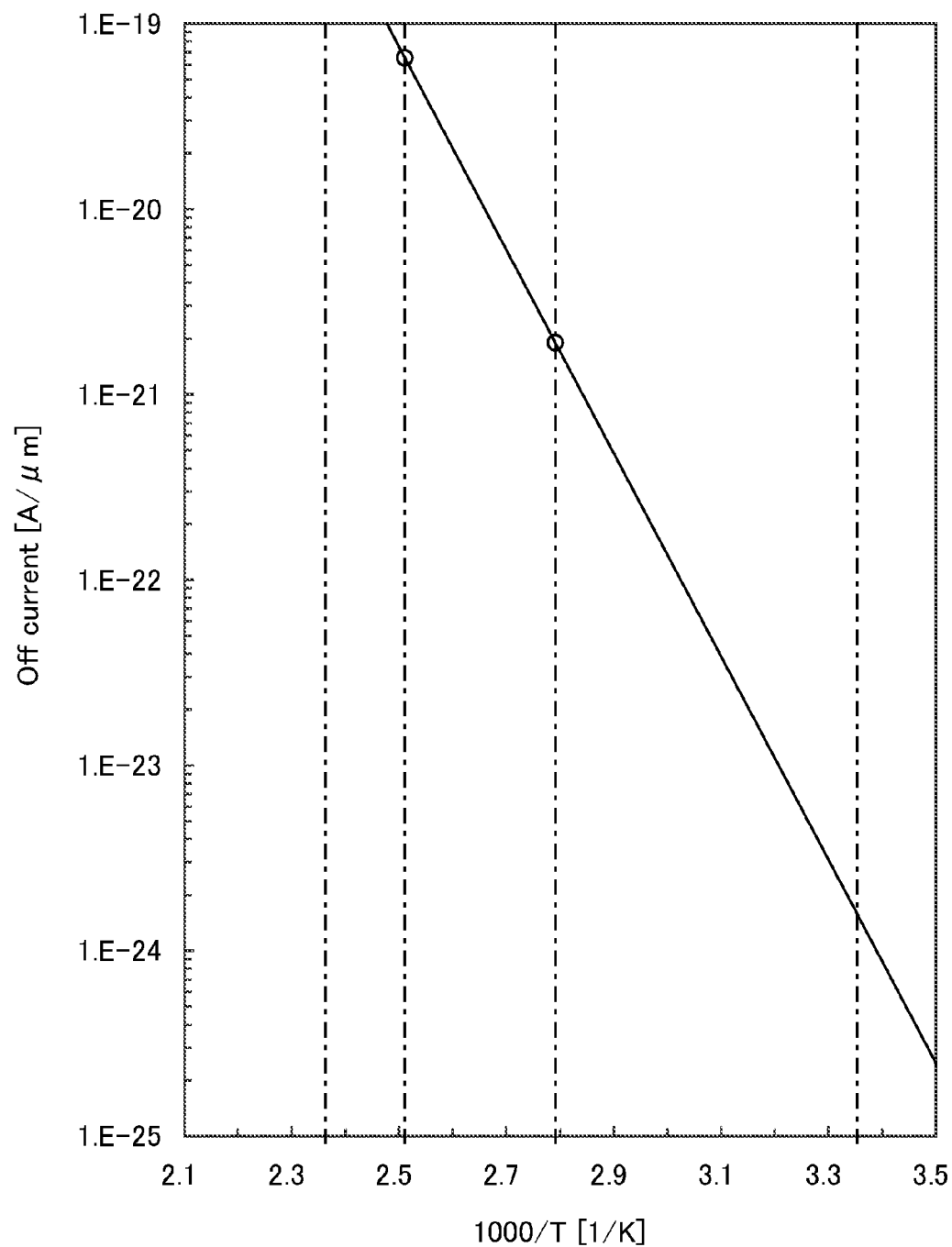
FIG. 49 is a graph showing characteristics of a transistor including an oxide semiconductor.

Specifically, as shown in FIG. 49, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 50:
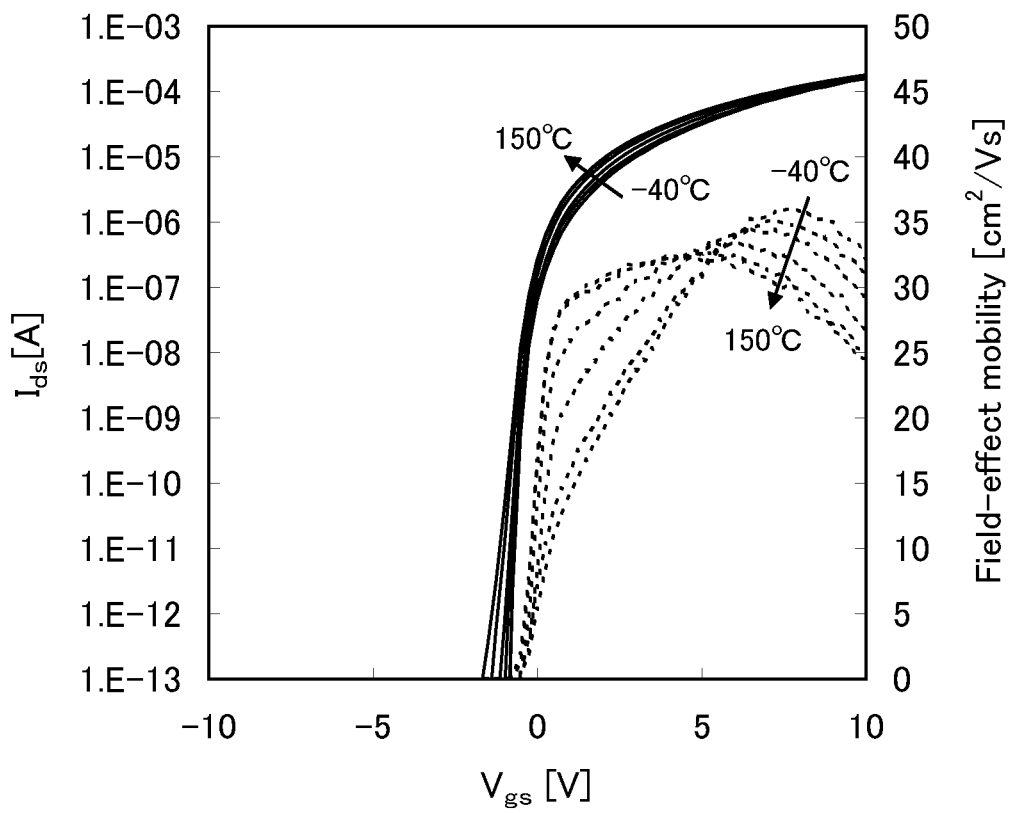
FIG. 50 is a graph showing characteristics of a transistor including an oxide semiconductor.
Figure 51A:
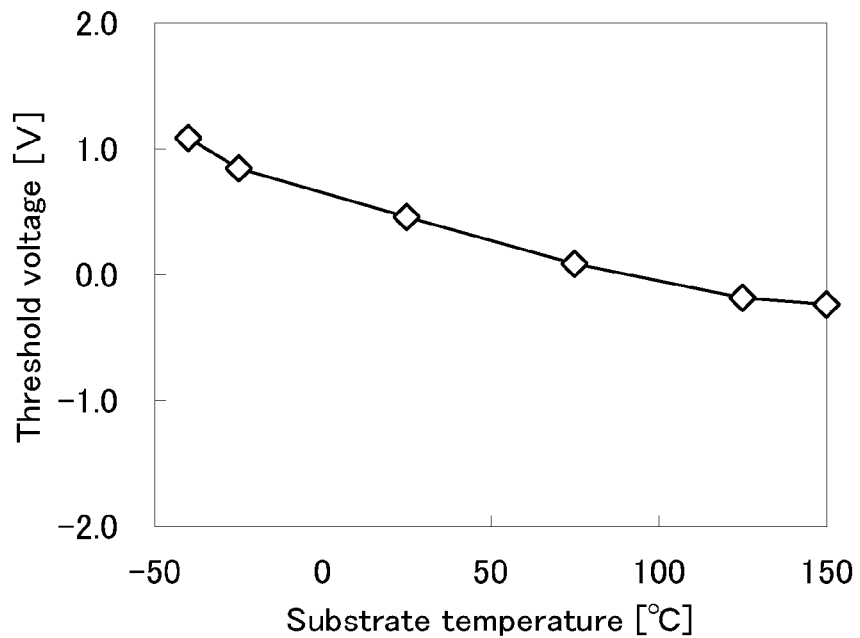
FIGS. 51A and 51B are graphs showing characteristics of a transistor including an oxide semiconductor.

FIG. 50 shows the $V_g$ dependence of $I_d$ (a solid line) and field-effect mobility (a dotted line). FIG. 51A shows a relation between the substrate temperature and the threshold voltage, and FIG. 51B shows a relation between the substrate temperature and the field-effect mobility.

From FIG. 51A, it is found that the threshold voltage gets lower as the substrate temperature increases. Note that the threshold voltage is decreased from 1.09 V to −0.23 V in the range from −40° C. to 150° C.

Figure 51B:
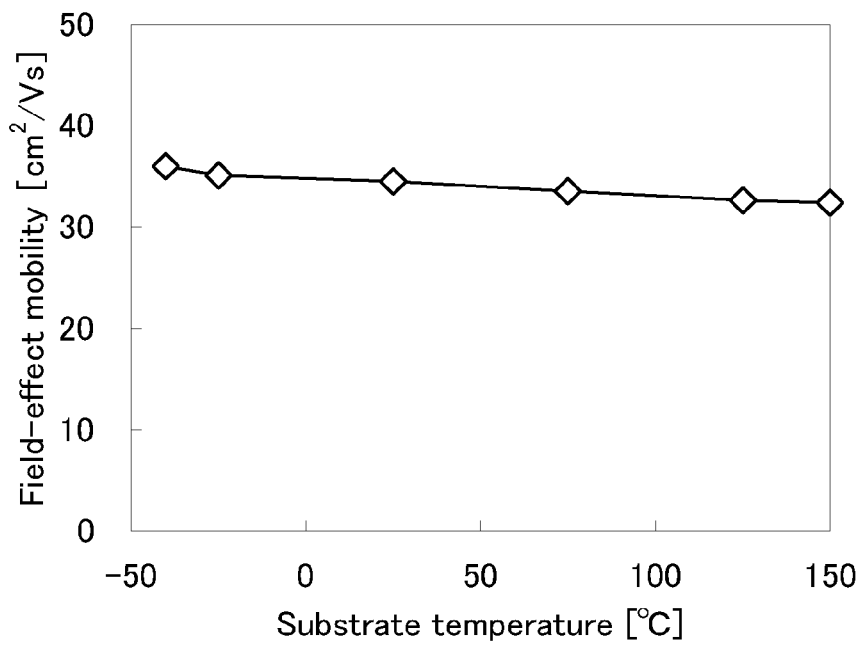

From FIG. 51B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Example 5

In this example, an example of a transistor in which an In—Sn—Zn—O film is used as an oxide semiconductor film will be described with reference to FIGS. 52A and 52B and the like.

Figure 52A:
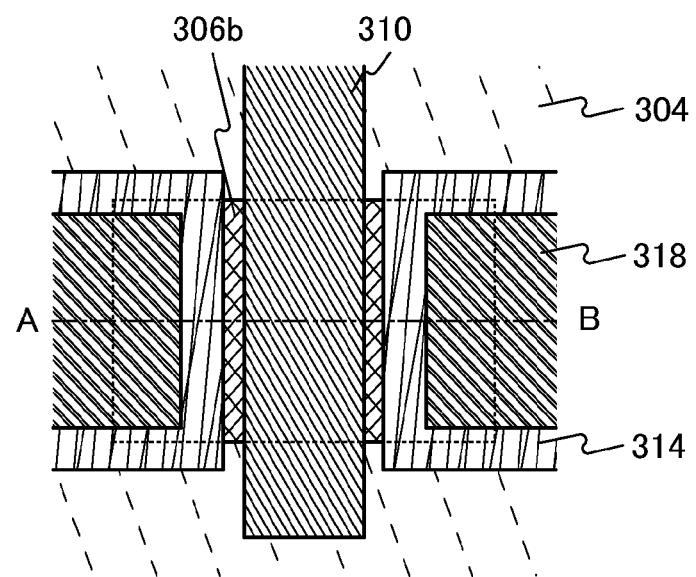
FIGS. 52A and 52B are a cross-sectional view and a plan view of a transistor including an oxide semiconductor.
Figure 52B:
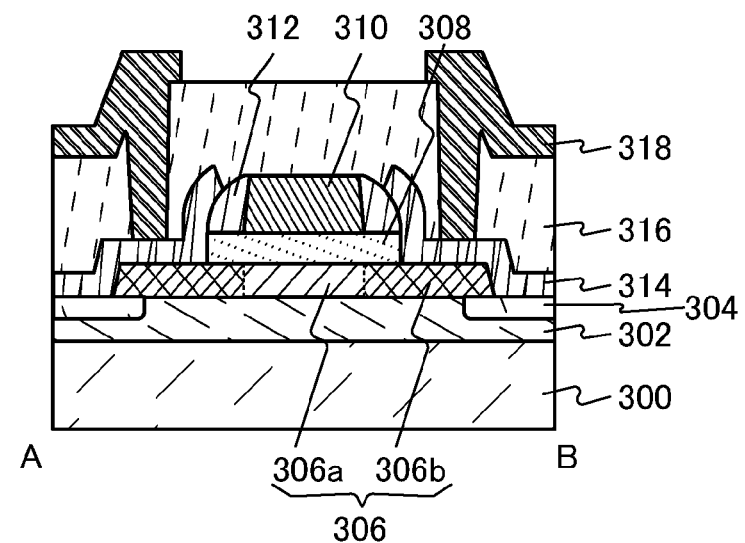

FIGS. 52A and 52B are a top view and a cross-sectional view of a coplanar transistor having a top-gate top-contact structure. FIG. 52A is the top view of the transistor. FIG. 52B illustrates cross section A-B along dashed-dotted line A-B in FIG. 45.

The transistor illustrated in FIG. 52B includes a substrate 300; a base insulating film 302 provided over the substrate 300; a protective insulating film 304 provided in the periphery of the base insulating film 302; an oxide semiconductor film 306 provided over the base insulating film 302 and the protective insulating film 304 and including a high-resistance region 306a and low-resistance regions 306b; a gate insulating film 308 provided over the oxide semiconductor film 306; a gate electrode 310 provided to overlap with the oxide semiconductor film 306 with the gate insulating film 308 positioned therebetween; a sidewall insulating film 312 provided in contact with a side surface of the gate electrode 310; a pair of electrodes 314 provided in contact with at least the low-resistance regions 306b; an interlayer insulating film 316 provided to cover at least the oxide semiconductor film 306, the gate electrode 310, and the pair of electrodes 314; and a wiring 318 provided to be connected to at least one of the pair of electrodes 314 through an opening formed in the interlayer insulating film 316.

Although not illustrated, a protective film may be provided to cover the interlayer insulating film 316 and the wiring 318. With the protective film, a minute amount of leakage current generated by surface conduction of the interlayer insulating film 316 can be reduced and thus the off-state current of the transistor can be reduced.

Another example of a transistor in which an In—Sn—Zn—O film is used as an oxide semiconductor film will be described below.

Figure 53A:
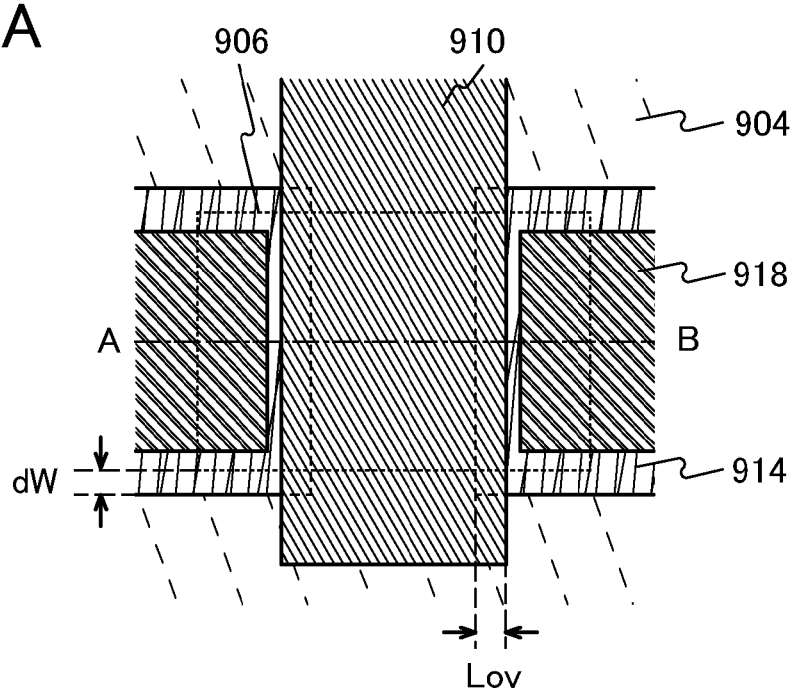
FIGS. 53A and 53B are a cross-sectional view and a plan view of a transistor including an oxide semiconductor.
Figure 53B:
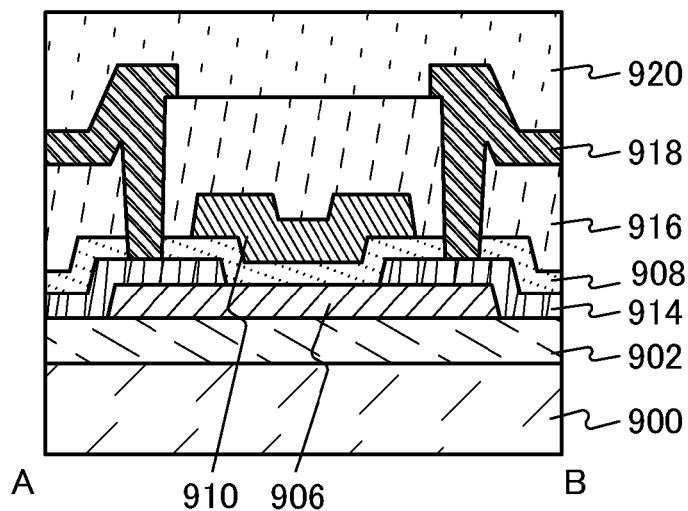

FIGS. 53A and 53B are a top view and a cross-sectional view which illustrate a structure of a transistor. FIG. 53A is the top view of the transistor. FIG. 53B is a cross-sectional view along dashed-dotted line A-B in FIG. 53A.

The transistor illustrated in FIG. 53B includes a substrate 900; a base insulating film 902 provided over the substrate 900; an oxide semiconductor film 906 provided over the base insulating film 902; a pair of electrodes 914 in contact with the oxide semiconductor film 906; a gate insulating film 908 provided over the oxide semiconductor film 906 and the pair of electrodes 914; a gate electrode 910 provided to overlap with the oxide semiconductor film 906 with the gate insulating film 908 positioned therebetween; an interlayer insulating film 916 provided to cover the gate insulating film 908 and the gate electrode 910; wirings 918 connected to the pair of electrodes 914 through openings formed in the interlayer insulating film 916; and a protective film 920 provided to cover the interlayer insulating film 916 and the wirings 918.

As the substrate 900, a glass substrate was used. As the base insulating film 902, a silicon oxide film was used. As the oxide semiconductor film 906, an In—Sn—Zn—O film was used. As the pair of electrodes 914, a tungsten film was used. As the gate insulating film 908, a silicon oxide film was used. The gate electrode 910 was a stacked structure of a tantalum nitride film and a tungsten film. The interlayer insulating film 916 was a stacked structure of a silicon oxynitride film and a polyimide film. The wirings 918 each had a stacked structure in which a titanium film, an aluminum film, and a titanium film were formed in this order. As the protective film 920, a polyimide film was used.

Note that in the transistor having the structure illustrated in FIG. 53A, the width of a portion where the gate electrode 910 overlaps with one of the pair of electrodes 914 is referred to as Lov. Similarly, the width of a portion of the pair of electrodes 914, which does not overlap with the oxide semiconductor film 906, is referred to as dW.

This application is based on Japanese Patent Application serial no. 2010-178140 filed with Japan Patent Office on Aug. 6, 2010 and Japanese Patent Application serial no. 2011-107622 filed with Japan Patent Office on May 12, 2011, the entire contents of which are hereby incorporated by reference.

What is claimed is:

1. A semiconductor device comprising:
   a write word line;
   a read word line;
   a bit line;
   a signal line;
   a memory cell array comprising a first memory cell and a second memory cell;
   a first driver circuit; and
   a second driver circuit,
   wherein the first memory cell and the second memory cell each comprises:
      a first transistor including a first channel formation region, the first channel formation region including a first semiconductor material;
      a second transistor including a second channel formation region, the second channel formation region including a second semiconductor material, wherein the first semiconductor material is different from the second semiconductor material; and
      a capacitor, wherein a gate of the first transistor, a second terminal of the second transistor, and one electrode of the capacitor are electrically connected to one another,
   wherein a first terminal of the first transistor of the first memory cell and a second terminal of the first transistor of the second memory cell are electrically connected to each other,
   wherein the first driver circuit is electrically connected to a second terminal of the first transistor of the first memory cell through the bit line and electrically connected to a first terminal of the second transistor of the first memory cell through the signal line, and
   wherein the second driver circuit is electrically connected to the other electrode of the capacitor of the first memory cell through the read word line and electrically connected to a gate of the second transistor of the first memory cell through the write word line.

2. The semiconductor device according to claim 1, wherein the first driver circuit comprises a delay circuit.

3. The semiconductor device according to claim 2, wherein the first driver circuit is configured to delay a signal that is input to the signal line relative to a signal that is input to the write word line.

4. The semiconductor device according to claim 1, wherein the first driver circuit comprises an even number of inverters connected in series.

5. The semiconductor device according to claim 1, wherein the semiconductor device includes a potential conversion circuit configured to output a potential higher than a power supply potential to the second driver circuit.

6. The semiconductor device according to claim 1, wherein the second driver circuit includes a level shift circuit electrically connected to one of the write word line and the read word line.

7. The semiconductor device according to claim 1,
   wherein the first driver circuit comprises a first buffer circuit electrically connected to the signal line,
   wherein the second driver circuit comprises a second buffer circuit electrically connected to the write word line, and
   wherein a channel length of a transistor of the first buffer circuit is larger than a channel length of a transistor of the second buffer circuit.

8. The semiconductor device according to claim 1, further comprising a source line electrically connected to a first terminal of the first transistor of the second memory cell.

9. The semiconductor device according to claim 1, wherein the second channel formation region comprises an oxide semiconductor.

10. The semiconductor device according to claim 1, wherein the first channel formation region comprises silicon.

11. A semiconductor device comprising:
a write word line;
a read word line;
a bit line;
a signal line;
a memory cell array comprising a first memory cell and a second memory cell;
a first driver circuit; and
a second driver circuit,
wherein the first memory cell and the second memory cell each comprises:
   a first transistor including a first channel formation region, the first channel formation region including a first semiconductor material;
   a second transistor including a second channel formation region, the second channel formation region including a second semiconductor material, wherein the first semiconductor material is different from the second semiconductor material; and
   a capacitor, wherein a gate of the first transistor, a second terminal of the second transistor, and one electrode of the capacitor are electrically connected to one another,
wherein a first terminal of the first transistor of the first memory cell and a second terminal of the first transistor of the second memory cell are electrically connected to each other,
wherein the first driver circuit is electrically connected to a second terminal of the first transistor of the first memory cell through the bit line and electrically connected to a first terminal of the second transistor of the first memory cell through the signal line,
wherein the second driver circuit is electrically connected to the other electrode of the capacitor of the first memory cell through the read word line and electrically connected to a gate of the second transistor of the first memory cell through the write word line, and
wherein the second terminal of the second transistor of the first memory cell and a first terminal of the second transistor of the second memory cell is electrically connected to each other.

12. The semiconductor device according to claim 11, wherein the first driver circuit comprises a delay circuit.

13. The semiconductor device according to claim 12, wherein the first driver circuit is configured to delay a signal that is input to the signal line relative to a signal that is input to the write word line.

14. The semiconductor device according to claim 11, wherein the first driver circuit comprises an even number of inverters connected in series.

15. The semiconductor device according to claim 11, wherein the semiconductor device includes a potential conversion circuit configured to output a potential higher than a power supply potential to the second driver circuit.

16. The semiconductor device according to claim 11, wherein the second driver circuit includes a level shift circuit electrically connected to one of the write word line and the read word line.

17. The semiconductor device according to claim 11, wherein the first driver circuit comprises a first buffer circuit electrically connected to the signal line, wherein the second driver circuit comprises a second buffer circuit electrically connected to the write word line, and
wherein a channel length of a transistor of the first buffer circuit is larger than a channel length of a transistor of the second buffer circuit.

18. The semiconductor device according to claim 11, further comprising a source line electrically connected to a first terminal of the first transistor of the second memory cell.

19. The semiconductor device according to claim 11, wherein the second channel formation region comprises an oxide semiconductor.

20. The semiconductor device according to claim 11, wherein the first channel formation region comprises silicon.

21. A semiconductor device comprising:
m write word lines (m is a natural number greater than or equal to 2);
m read word lines;
n bit lines (n is a natural number greater than or equal to 2);
n source lines;
n signal lines;
a memory cell array comprising memory cells arranged in matrix of m rows and n columns;
a first driver circuit; and
a second driver circuit,
wherein the memory cells each comprises:
   a first transistor including a first gate electrode, a first source electrode,
a first drain electrode, and a first channel formation region including a first semiconductor material;
   a second transistor including a second gate electrode, a second source electrode, a second drain electrode, and a second channel formation region including a second semiconductor material, wherein the first semiconductor material is different from the second semiconductor material; and
   a capacitor,
wherein the first gate electrode of the memory cell in the k-th row, the second drain electrode of the memory cell in the k-th row, and one electrode of the capacitor of the memory cell in the k-th row are electrically connected to one another to form a node that is capable of holding electric charge,
wherein the first source electrode of the memory cell in the k-th row (k is a natural number greater than or equal to 2 and smaller than or equal to (m−1)) and the first drain electrode of the memory cell in the (k+1)-th row are electrically connected to each other,
wherein the first driver circuit is electrically connected to the first drain electrode through the bit line and electrically connected to the second source electrode through the signal line,
wherein the second driver circuit is electrically connected to the other electrode of the capacitor through the read word line and electrically connected to the second gate electrode through the write word line, and
wherein the first driver circuit comprises a delay circuit.

22. The semiconductor device according to claim 21, wherein the first driver circuit is configured to delay a signal that is input to the signal line relative to a signal that is input to the write word line.

23. The semiconductor device according to claim 21, wherein the first driver circuit comprises an even number of inverters connected in series.

24. The semiconductor device according to claim 21,
wherein in a writing operation of the memory cell in the k-th row, a first high potential is supplied to the write word lines of the memory cells in the first row to the (k−1)-th row which are not selected and to the memory cells in the k-th row which are selected, a first low potential is supplied to the write word lines of the memory cells in the (k+1)-th row to the m-th row which are not selected, a second low potential is supplied to the read word lines of the memory cells in the first row to the (k−1)-th row which are not selected and to the memory cells in the k-th row which are selected, a second high potential is supplied to the read word lines of the memory cells in the (k+1)-th row to the m-th row which are not selected, so that the first transistors of the memory cells in the (k+1)-th row to the m-th row which are not selected are turned on, and a potential of the source lines of the first transistors of the memory cells in the k-th row which are selected is fixed.

25. The semiconductor device according to claim 21, wherein the semiconductor device includes a potential conversion circuit configured to output a potential higher than a power supply potential to the second driver circuit.

26. The semiconductor device according to claim 21, wherein the second driver circuit includes a level shift circuit electrically connected to one of the write word line and the read word line.

27. The semiconductor device according to claim 21,
wherein the first driver circuit comprises a first buffer circuit electrically connected to one of the n signal lines,
wherein the second driver circuit comprises a second buffer circuit electrically connected to one of the m write word lines, and
wherein a channel length of a transistor of the first buffer circuit is larger than a channel length of a transistor of the second buffer circuit.

28. The semiconductor device according to claim 21, wherein the n source lines are electrically connected to one another.

29. The semiconductor device according to claim 21, wherein the second channel formation region comprises an oxide semiconductor.

30. The semiconductor device according to claim 21, wherein the first channel formation region comprises silicon.

* * * * *